United States Patent

Asakawa et al.

[11] Patent Number: 5,993,538
[45] Date of Patent: *Nov. 30, 1999

[54] METHOD OF FORMING SINGLE-CRYSTALLINE THIN FILM USING BEAM IRRADIATING METHOD

[75] Inventors: Toshifumi Asakawa, Yamato; Masahiro Shindo, Suita; Toshikazu Yoshimizu, Suita; Sumiyoshi Ueyama, Suita, all of Japan

[73] Assignee: Mega Chips Corporation, Osaka, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/601,154

[22] Filed: Feb. 13, 1996

Related U.S. Application Data

[63] Continuation of application No. 08/239,969, May 9, 1994, abandoned.

[30] Foreign Application Priority Data

| Oct. 14, 1993 | [JP] | Japan | 5-281748 |
| Oct. 20, 1993 | [JP] | Japan | 5-285674 |
| Dec. 10, 1993 | [JP] | Japan | 5-341281 |
| Mar. 29, 1994 | [JP] | Japan | 6-058887 |

[51] Int. Cl.$^6$ .................................................. H01L 21/203
[52] U.S. Cl. ......................... 117/8; 117/7; 117/9; 117/10; 438/511
[58] Field of Search ..................... 117/7, 8, 9, 10; 438/511

[56] References Cited

U.S. PATENT DOCUMENTS 4,095,004  6/1978  Fraas et al. ................................. 117/8

FOREIGN PATENT DOCUMENTS

| 61-222993 | 10/1986 | Japan | 117/7 |
| A-2-184594 | 7/1990 | Japan |
| A-2-196086 | 8/1990 | Japan |
| A-2-229792 | 9/1990 | Japan |

OTHER PUBLICATIONS

Hewett et al. "Amorphous phase formation and recrystallization in ion–implanted silicides" INSPECT A86050549, 1985.

Patent Abstracts of Japan, vol. 10, No. 107 (C–341), Apr. 22, 1986, JP 60 235788, Nov. 22, 1985.

Patent Abstracts of Japan, vol. 14, No. 543 (C–0783), Nov. 30, 1990, JP 02 229792, Sep. 12, 1990.

(List continued on next page.)

*Primary Examiner*—Celia Chang
*Attorney, Agent, or Firm*—Oblon, Spivak, McClelland, Maier & Neustadt, P.C.

[57] ABSTRACT

In order to form a single-crystalline thin film on a polycrystalline substrate using plasma CVD, a downwardly directed mainly neutral Ne atom current is formed by an ECR ion generator (2). A reaction gas such as silane gas which is supplied from a reaction gas inlet pipe (13) is sprayed onto an SiO$_2$ substrate (11) by an action of the Ne atom current, so that an amorphous Si thin film is grown on the substrate (11) by a plasma CVD reaction. At the same time, a part of the Ne atom current having high directivity is directly incident upon the substrate (11), while another part thereof is incident upon the substrate (11) after its course is bent by a reflector (12). The reflector (12) is so set that all directions of the parts of the Ne atom current which are incident upon the substrate (11) are perpendicular to densest planes of single-crystalline Si. Therefore, the as-grown amorphous Si is sequentially converted to a single-crystalline Si thin film having crystal axes which are so regulated that the densest planes are oriented perpendicularly to the respective directions of incidence, by an action of the law of Bravais. Thus, a single-crystalline thin film is formed on a polycrystalline substrate.

27 Claims, 55 Drawing Sheets

OTHER PUBLICATIONS

Patent Abdstracts of Japan, vol. 95, No. 3, Apr. 28, 1985, JP 06 340500, Dec. 13, 1994.

Ion Beam Deposition, Film Modification and Synthesis, S.M. Rossnagel and J.J. Cuomo, MRS Bulletin, Deposition Process Part II, Dec. 1986, vol. XIII, No. 12.

Subsurface Processing of Electronic Materials Assisted by Atomic Displacements, J.S. Williams, MRS Bulletin, vol. 17, No. 6 (Jun.) 1992, pp. 47–51.

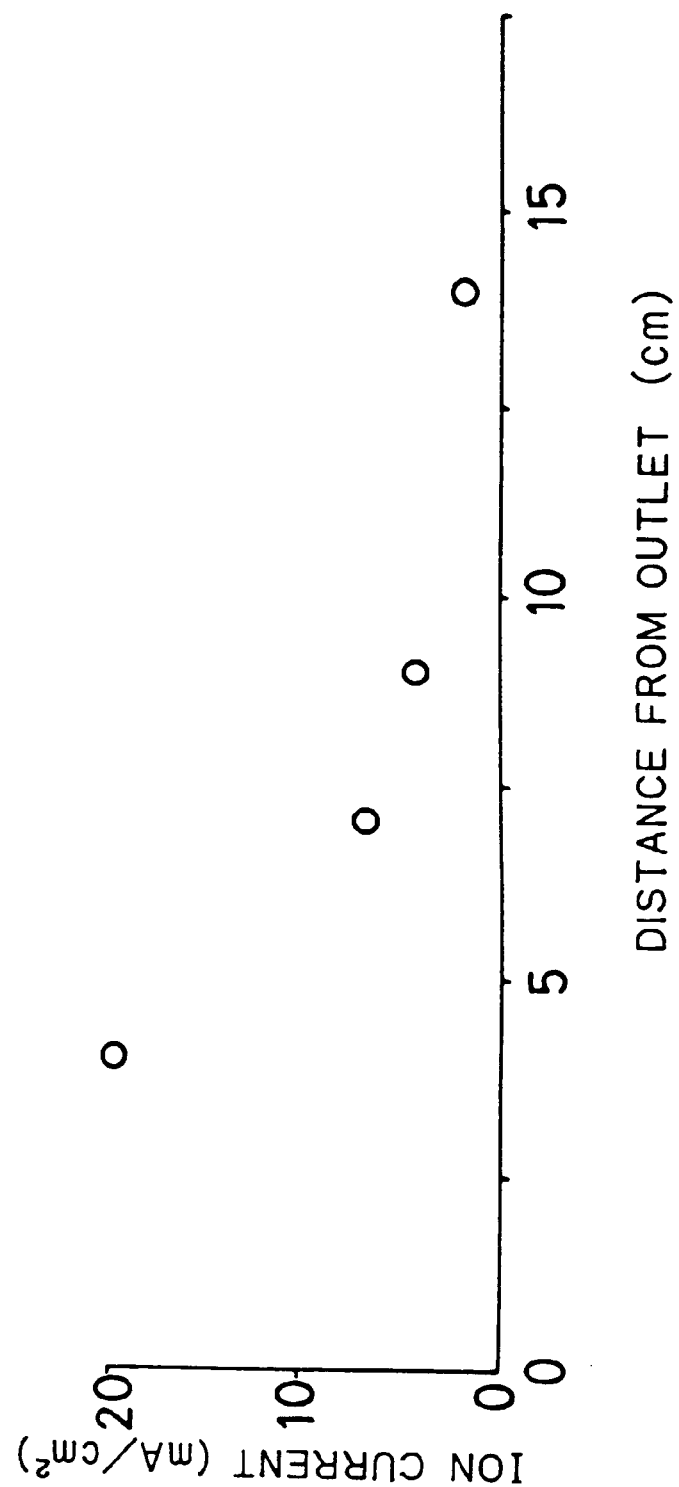

FIG. 8
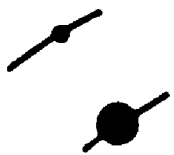
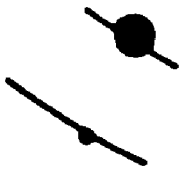

12c

12d

FIG. 69
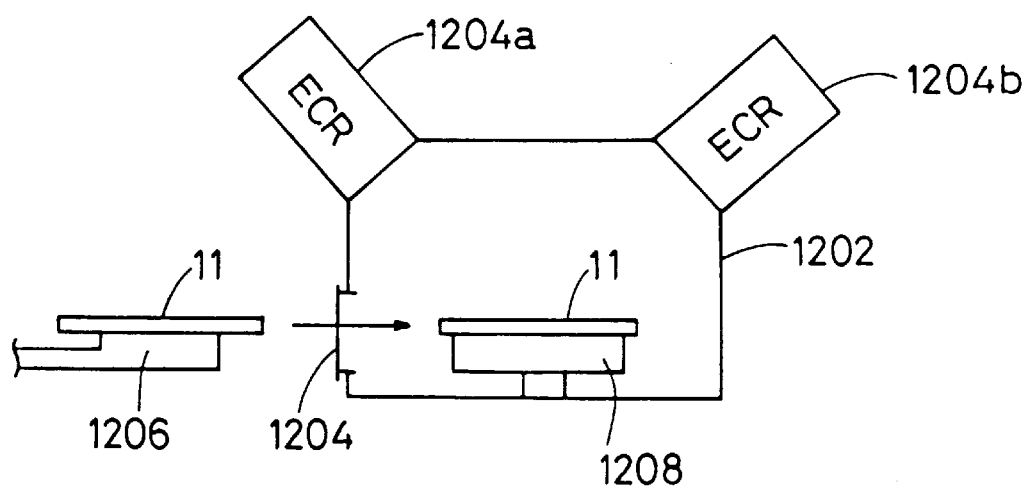
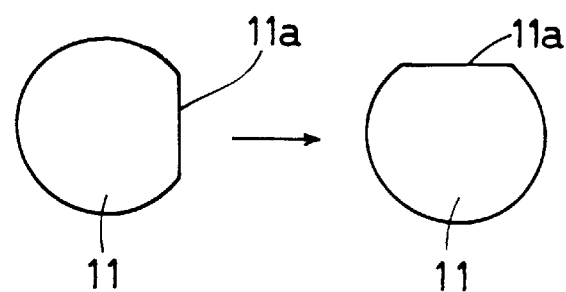

METHOD OF FORMING SINGLE-CRYSTALLINE THIN FILM USING BEAM IRRADIATING METHOD

This application is a Continuation of application Ser. No. 08/239,969, filed on May 9, 1994, now abandoned.

BACKGROUND OF THE INVENTION

1. Field of the Invention

The present invention relates to a method of and an apparatus for forming a single-crystalline thin film on a substrate, and it relates to a method of and an apparatus for forming a single-crystalline thin film, which implement selective and efficient formation of a single-crystalline thin film, and it also relates to a beam irradiator, a beam irradiating method, and a beam reflecting device for enabling efficient formation of a single-crystalline thin film or an axially oriented polycrystalline thin film on a substrate.

2. Background of the Invention

Plasma chemical vapor deposition (plasma CVD) is a type of chemical vapor deposition process (CVD), which is adapted to bring a reaction gas into a plasma state for forming active radicals and ions and to cause a chemical reaction under active environment, thereby forming a thin film of a prescribed material on a substrate at a relatively low temperature. The plasma CVD, which can form various types of films at low temperatures, has such advantages that it is possible to form an amorphous film while preventing crystallization, to employ a non-heat-resistant substrate such as a plastic substrate, and to prevent the as-formed film from reacting with the substrate. Therefore, plasma CVD has many applications in the semiconductor industry.

It is possible to epitaxially form a single-crystalline thin film of a prescribed material on a single-crystalline substrate by carrying out the plasma CVD under a temperature facilitating crystallization.

Generally, in order to form a single-crystalline thin film of a prescribed material on a single-crystalline substrate of the same material having the same crystal orientation, it is possible to employ an epitaxial growth process. In the epitaxial growth process, however, it is impossible to form a single-crystalline thin film on a polycrystalline substrate or an amorphous substrate. Therefore, in order to form a single-crystalline thin film on a substrate having a different crystal structure such as an amorphous substrate or a polycrystalline substrate, or a substrate of a different material, an amorphous thin film or a polycrystalline thin film is temporarily formed on the substrate so that the same is thereafter converted to a single-crystalline thin film.

In general, a polycrystalline or amorphous semiconductor thin film is single-crystallized by fusion recrystallization or lateral solid phase epitaxy.

However, such a process has the following problems: In the fusion recrystallization, the substrate is extremely thermally distorted when the thin film is prepared from a material having a high melting point, to damage physical and electrical properties of the thin film as employed. Further, an electron beam or a laser beam is employed for fusing the thin film. Therefore, it is necessary to scan spots of the electron beam or the laser beam along the overall surface of the substrate, and hence a long time and a high cost are required for recrystallization.

On the other hand, the lateral solid phase epitaxy is easily influenced by a method of crystallizing the material forming the substrate, while the growth rate is disadvantageously slow in this process. In order to grow a single-crystalline thin film over a distance of about 10 $\mu$m, for example, this process requires at least 10 hours. Further, it is difficult to obtain a large crystal grain since a lattice defect is caused to stop growth of the single crystal upon progress of the growth to some extent.

In each process, further, it is necessary to bring a seed crystal into contact with the polycrystalline or amorphous thin film. In addition, the single crystal is grown in a direction along the major surface of the thin film, i.e., in a lateral direction, whereby the distance of growth to the crystal is so increased that various hindrances take place during the growth of the single crystal. When the substrate is made of an amorphous material such as glass, for example, the substrate has no regularity in lattice position and this irregularity influences on growth of the single crystal to disadvantageously result in growth of a polycrystalline film having large crystal grain sizes. In addition, it is difficult to selectively form a single-crystalline thin film having a prescribed crystal orientation on an arbitrary region of the substrate, due to the lateral growth.

In order to solve the aforementioned problems of the prior art, there has been made an attempt for reducing the growth distance by utilizing vertical growth of the thin film, thereby reducing the growth time. In other words, there has been tried a method of bringing a seed crystal into contact with the overall surface of a polycrystalline or amorphous thin film for making solid phase epitaxial growth in a direction perpendicular to the major surface of the thin film, i.e., in the vertical direction. As a result, however, the seed crystal was merely partially in contact with the amorphous thin film or the like and it was impossible to form a single-crystalline thin film by the as-expected vertical solid phase epitaxial growth, since only lateral epitaxial growth was caused from the contact portion. According to this method, further, the seed crystal adhered to the as-grown single-crystalline film and it was extremely difficult to separate the former from the latter, such that the as-grown thin film was disadvantageously separated from the substrate following the seed crystal. Further, it is impossible in practice to selectively form a single-crystalline thin film having a prescribed crystal orientation on an arbitrary region of the substrate, since it is necessary to accurately arrange a seed crystal of a prescribed shape on a prescribed position.

When the substrate itself has a single-crystalline structure, it is impossible to form a single-crystalline thin film having a crystal orientation which is different from that of the substrate on the substrate by any conventional means.

This also applies to a polycrystalline thin film having single crystal axes which are regulated along the same direction between crystal grains, i.e., an axially oriented polycrystalline thin film. In other words, it is difficult to form an axially oriented polycrystalline thin film which is oriented in a desired direction on an arbitrary substrate by the prior art.

SUMMARY OF THE INVENTION

The inventor has found that, when a physical seed crystal is employed in vertical growth of solid phase epitaxy, it is difficult to separate a single-crystalline thin film as grown from the seed crystal due to adhesion therebetween. This problem can be solved when a virtual seed crystal of a large area is employed in place of the physical seed crystal to obtain a virtual seed crystal for attaining the same effect as a seed crystal adhering to the overall surface of a single crystal. The virtual seed crystal is in an excellent state with no physical adhesion on the surface of the single crystal in termination of the crystal growth. The present invention is based on this basic idea.

According to the present invention, a method of forming a single-crystalline thin film is adapted to form a single-crystalline thin film of a prescribed material on a substrate. An amorphous thin film or a polycrystalline thin film of the prescribed material is formed on the substrate. The amorphous thin film or the polycrystalline thin film is irradiating with beams of neutral atoms or neutral molecules of low energy levels without sputtering of the prescribed material and under a high temperature of not more than a crystallization temperature of the prescribed material. The beams are irradiated from directions which are perpendicular to a plurality of densest crystal planes, having different directions, in the single-crystalline thin film to be formed.

The thin film is heated at a high temperature below a crystallization temperature, whereby the single crystal which is formed in the vicinity of the surface serves as a seed crystal, so that a single crystal is grown toward a deep portion by vertical solid phase epitaxial growth to single-crystallize the overall region of the thin film along its thickness. When the thin film is at a temperature exceeding the crystallization temperature, the as-formed single crystal is converted to a polycrystalline structure which is in a thermal equilibrium state. On the other hand, no crystallization toward a deep portion progresses at a temperature which is extremely lower than the crystallization temperature. Therefore, the temperature of the thin film is adjusted to be at a high level below the crystallization temperature, such as a level immediately under the crystallization temperature.

The seed crystal, which is formed by conversion from the amorphous thin film or the polycrystalline thin film, is integral with an amorphous thin film or the polycrystalline layer remaining in the deep portion. Namely, this layer is completely in contact with the seed crystal. Therefore, vertical solid phase epitaxial growth progresses in an excellent state. Further, the seed crystal and the single crystal formed by solid epitaxial growth are made of the same material having the same crystal orientation, whereby it is not necessary to remove the seed crystal after formation of the single-crystalline thin film. Further, the single-crystalline thin film, which is formed by vertical solid phase epitaxial growth, can be efficiently obtained in a desired state in a short time.

In the method according to the present invention, it is possible to form a single-crystalline thin film on a substrate including a polycrystalline substrate or an amorphous substrate, while it is not necessary to increase the temperature of the substrate to an extremely high level. Therefore, it is possible to easily obtain a single-crystalline thin film such as a wide-use semiconductor thin film which is applied to a thin film transistor of liquid crystal display or a single-crystalline thin film which is applied to a three-dimensional LSI. While a well-known metal evaporation film is inferior in quality due to a number of vacancies such that a migration phenomenon takes place to easily cause disconnection when the same is applied to interconnection of an electronic circuit, it is possible to prevent such a problem according to the present invention.

Preferably, the atomic weights of atoms forming the beams are lower than the maximum one of the atomic weights of elements forming the prescribed material.

The atomic weights of atoms forming the beams which are applied to the thin film or atoms forming molecules are lower than the maximum one of the atomic weights of elements forming the thin film, whereby most parts of the atoms forming the as-applied beams are rearwardly scattered on the surface of the thin film or in the vicinity thereof, to hardly remain in the thin film. Thus, electronic/physical properties of the thin film are hardly changed by residual of such atoms in the single-crystalline thin film.

Preferably, the beams are obtained by a single electron cyclotron resonance type ion generation source and a reflector which is arranged in a path between the ion generation source and the amorphous thin film or the polycrystalline thin film.

The beams which are applied to the thin film are obtained by a single beam source and a reflector which is arranged in a path, whereby it is possible to irradiate the substrate with the beams from a plurality of prescribed directions which are different from each other with no requirement for a plurality of beam sources. Namely, only a single beam source having a complicated structure is sufficient in the method according to the present invention, whereby a single-crystalline thin film can be formed with a simple apparatus structure. Since only one beam source is sufficient, it is possible to form the thin film under a high vacuum. Further, the beam source is formed by an electron cyclotron resonance type ion generation source, whereby the ion beams have high directivity and it is possible to obtain strong neutral beams having excellent directivity at positions beyond prescribed distances from the ion source with no means for neutralizing ions.

In the method according to the present invention, an amorphous thin film or a polycrystalline thin film which is previously formed on a substrate surface is irradiated with beams of atoms or molecules from a plurality of directions. The beams are at energy levels causing no sputtering on the material as irradiated, whereby the law of Bravais acts such that a layer close to the surface of the amorphous thin film or the polycrystalline thin film is converted to a crystal having such a crystal orientation that planes perpendicular to the directions irradiated with the beams define densest crystal planes. The plurality of beams are applied from directions perpendicular to a plurality of densest crystal planes having different directions, whereby the orientation of the as-formed crystal is set in a single one. In other words, a single-crystalline thin film having a regulated crystal orientation is formed in the vicinity of a surface of the amorphous thin film or the polycrystalline thin film.

The inventor has also found that a single-crystalline thin film can be obtained by growing a thin film and converting the same to a single-crystalline simultaneously instead of previously forming a thin film. This invention is also based on this idea.

According to the present invention, a method of forming a single-crystalline thin film forms a single-crystalline thin film of a prescribed material on a polycrystalline substrate or an amorphous substrate using plasma chemical vapor deposition by supplying a reaction gas onto the substrate under a low temperature allowing no crystallization of the prescribed material with the plasma chemical vapor deposition alone while simultaneously irradiating the substrate with beams of a low energy gas causing no sputtering of the prescribed material from directions which are perpendicular to a plurality of densest crystal planes having different directions in the single-crystalline thin film to be formed.

In the method according to the present invention, a thin film of a prescribed material is formed on a substrate by plasma chemical vapor deposition, while the substrate is irradiated with beams of a gas from a plurality of directions.

The gas beams are at energy levels causing no sputtering on the material as irradiated, whereby the law of Bravais acts such that the thin film of the prescribed material as being formed is sequentially converted to a crystal in such a crystal orientation that planes perpendicular to directions of the beams define densest crystal planes. The substrate is irradiated with a plurality of gas beams from directions perpendicular to a plurality of densest crystal planes having different directions, whereby the as-formed crystal has only one orientation. In other words, a single-crystalline thin film having a regulated crystal orientation is formed.

Under a temperature facilitating crystallization of a prescribed material by plasma chemical vapor deposition alone with no beam irradiation, crystal orientations are arbitrarily directed regardless of directions of beam irradiation and cannot be regulated, while a polycrystalline film is formed. Therefore, temperature control is performed to a low level for facilitating no crystallization with plasma chemical vapor deposition alone.

In the method according to the present invention, further, conversion to a single crystal simultaneously sequentially progresses in the process of growth of the thin film by plasma chemical vapor deposition. Thus, it is possible to form a single-crystalline thin film having a large thickness under a low temperature.

The substrate is irradiated with a gas, preferably an inert gas, whereby atoms or ions which may remain in the as-formed thin film after irradiation exert no bad influence on electronic/physical properties of the single-crystalline thin film as impurities.

Preferably, the atomic weight of an element forming the inert gas is lower than the maximum one of the atomic weights of elements forming the prescribed material.

The atomic weight of an element forming the inert gas is lower than the maximum atomic weight of elements forming the prescribed material which is grown as a thin film, whereby most parts of atoms or ions of the as-applied inert gas rearwardly recoil on the surface of the thin film or in the vicinity thereof, to hardly remain in the thin film.

Preferably, the prescribed material contains an element forming a gas material which is in a gas state under ordinary temperatures, and the beams molecular are formed from the gas material.

The gas as applied contains elements forming the material which is grown as the thin film. Even if atoms or ions of the elements remain after irradiation, therefore, the same exert no bad influence on the as-formed single-crystalline thin film as impurities. Further, it is also possible to supply the element to the thin film only by application of the molecular beams without introducing the same into the reaction gas.

Preferably, the reaction gas contains a reaction gas material which is formed by an impurity element to be added to the prescribed material.

The reaction gas contains an impurity element to be added to the material which is grown as the thin film, whereby it is possible to form a p-type or n-type semiconductor single-crystalline thin film in formation of a semiconductor single-crystalline thin film, for example. In other words, it is possible to form a single-crystalline thin film containing a desired impurity.

Preferably, a plurality of types of impurity elements are so employed that a plurality of types of reaction gas materials which are formed by respective ones of the plurality of types of impurity elements are alternately supplied onto the substrate.

A plurality of types of reaction gas materials formed by respective ones of a plurality of types of impurity elements are alternately supplied onto the substrate, whereby it is possible to form a single-crystalline thin film having a plurality of types of single-crystalline layers containing the respective ones of the plurality of types of impurities such that an n-type semiconductor single-crystalline layer is formed on a p-type semiconductor single-crystalline layer in formation of a semiconductor single-crystalline thin film, for example.

Preferably, the beams are obtained by a single beam source and a reflector which is arranged in a path between the beam source and the substrate.

The beams which are applied to the substrate are obtained by a single beam source and a reflector which is arranged on a path, whereby it is possible to irradiate the substrate with the beams from directions which are perpendicular to a plurality of densest crystal planes having different directions with no requirement for a plurality of beam sources. In other words, only a single beam source having a complicated structure may be so prepared that it is possible to form the single-crystalline thin film with a simple structure in the method according to the present invention. Since a single beam source may be sufficient, further, it is possible to form the thin film under a high vacuum.

Preferably, the beam source is an ion generation source generating an ion beam, and the reflector is a metal reflector which is substantially made of a metal.

The beam source has an ion generation source which generates an ion beam, and the reflector is prepared from a metal reflector which is substantially made of a metal. Therefore, the ion beam generated from the ion source is converted to a neutral beam when the same is reflected by the metal reflector. Therefore, the substrate is irradiated with parallel beams which are regulated in direction. Further, it is possible to prepare the substrate from an electrical insulating substrate.

Preferably, the beam source is an electron cyclotron resonance type ion generation source.

The beam source is formed by an electron cyclotron resonance type ion generation source. Therefore, the ion beam has high directivity, while it is possible to obtain a strong neutral beam in a portion which is separated beyond a prescribed distance from the ion source with no employment of means for neutralizing ions. It is possible to irradiate the substrate with parallel beams from a plurality of prescribed directions by reflecting the neutral beam by the reflector and applying the same to the substrate. Further, it is also possible to prepare the substrate from an electrical insulating substrate.

According to the present invention, a method of forming a single-crystalline thin film of a prescribed material comprises (a) a step of forming an amorphous or polycrystalline thin film of the prescribed material on a substrate, (b) a step of forming a masking material on the thin film, (c) a step of selectively removing the masking material, and (d) a step of irradiating the substrate with beams of low energy levels causing no sputtering of the prescribed material from directions which are perpendicular to a plurality of densest crystal planes having different directions in the single-crystalline thin film to be formed while utilizing the selectively removed masking material as a screen under a high temperature below the crystallization temperature of the prescribed material.

Preferably, the steps (b) to (d) are carried out a plural of times while varying directions for applying the beams in the step (d), thereby selectively converting the thin film to a single crystal having a plurality of types of crystal orientations.

In the method according to the present invention, the amorphous or polycrystalline thin film which is previously formed on the substrate is irradiated with gas beams from a plurality of directions. These beams are at energy levels causing no sputtering on the material as irradiated, whereby the law of Bravais acts so that a layer which is in the vicinity of the surface of the as-irradiated thin film is converted to a crystal, having such a crystal orientation that planes perpendicular to the directions of the beams define densest crystal planes. The plurality of gas beams are applied from directions which are perpendicular to a plurality of densest crystal planes having different directions, whereby the as-formed crystal is set in a single orientation. Namely, a single-crystalline layer having a regulated crystal orientation is formed in the vicinity of the surface of the polycrystalline thin film. Further, a masking material is formed on the thin film to be irradiated in advance of irradiation, and this masking material is selectively removed. Thus, irradiation progresses with limitation on a specific region of the substrate corresponding to the selectively removed portion of the masking material, whereby the single-crystalline layer is formed only in the vicinity of the surface portion of the thin film corresponding to the specific region.

Further, the thin film is at a high temperature below the crystallization temperature and hence the single crystal which is formed in the vicinity of its surface serves as a seed crystal to be grown toward a deep portion by vertical solid phase epitaxial growth, whereby the overall region of the as-irradiated thin film is single-crystallized along the thickness. If the thin film is at a temperature exceeding the crystallization temperature, the as-formed single crystal is converted to a polycrystalline structure which is in a thermal equilibrium state. On the other hand, no crystallization toward a deep portion progresses at a temperature which is extremely lower than the crystallization temperature. Therefore, the temperature of the thin film is adjusted to be at a high level below the crystallization temperature, such as a level immediately under the crystallization temperature, for example.

According to the inventive method, as hereinabove described, it is possible to selectively form a single-crystalline thin film having a regulated crystal orientation on an arbitrary specific region of a substrate.

In the method according to the present invention, the steps from formation of the masking material to irradiation with the beams are repeated while varying directions of irradiation. Therefore, it is possible to selectively form single-crystalline thin films having different crystal orientations on a plurality of arbitrary specific regions of the substrate.

According to the present invention, a method of forming a single-crystalline thin film of a prescribed material comprises (a) a step of forming an amorphous or polycrystalline thin film of the prescribed material on a substrate, (b) a step of forming a masking material on the thin film, (c) a step of selectively removing the masking material, (d) a step of etching the thin film while utilizing the selectively removed masking material as a screen, thereby selectively removing the thin film while leaving a specific region on the substrate, and (e) a step of irradiating the substrate with molecular beams of low energy levels causing no sputtering of the prescribed material from directions which are perpendicular to a plurality of densest crystal planes having different directions in the single-crystalline thin film to be formed under a high temperature below the crystallization temperature of the prescribed material.

In the method according to the present invention, the amorphous or polycrystalline thin film is selectively removed while leaving a specific region on the substrate and thereafter the thin film is irradiated with beams under a prescribed temperature to facilitate action of the law of Bravais and vertical solid phase epitaxial growth, thereby converting the thin film to a single-crystalline thin film. Thus, it is possible to selectively form a single-crystalline thin film having a regulated crystal orientation on an arbitrary specific region of the substrate.

According to the present invention, a method of forming a single-crystalline thin film of a prescribed material comprises (a) a step of forming an amorphous or polycrystalline thin film of the prescribed material on a substrate, (b) a step of irradiating the substrate with beams of low energy levels causing no sputtering of the prescribed material from directions which are perpendicular to a plurality of densest crystal planes having different directions in the single-crystalline thin film to be formed under a high temperature below the crystallization temperature of the prescribed material, (c) a step of forming a masking material on the thin film after the step (b), (d) a step of selectively removing the masking material, and (e) a step of etching the thin film while utilizing the selectively removed masking material as a screen, thereby selectively removing the thin film.

In the method according to the present invention, the amorphous or polycrystalline thin film formed on the substrate is irradiated with molecular beams under a prescribed temperature to facilitate action of the law of Bravais and vertical solid phase epitaxial growth, thereby converting the thin film to a single-crystalline thin film. Thereafter the single-crystalline thin film is selectively removed while leaving a specific region on the substrate. Therefore, it is possible to selectively form a single-crystalline thin film having a regulated crystal orientation on an arbitrary specific region on the substrate.

According to the present invention, a method of forming a single-crystalline thin film of a prescribed material comprises (a) a step of forming an amorphous or polycrystalline thin film of the prescribed material on a substrate, (b) a step of irradiating the substrate with beams of low energy levels causing no sputtering of the prescribed material from directions which are perpendicular to a plurality of densest crystal planes having different directions in the single-crystalline thin film to be formed under a low temperature causing no crystallization of the prescribed material by the step (a) alone while carrying out the step (a), (c) a step of forming a masking material on the thin film after the steps (a) and (b), (d) a step of selectively removing the masking material, and (e) a step of etching the thin film while utilizing the selectively removed masking material as a screen, thereby selectively removing the thin film.

In the method according to the present invention, an amorphous or poly-crystalline thin film is formed on the substrate with application of molecular beams under a prescribed temperature for facilitating action of the law of Bravais, thereby converting the thin film as being formed sequentially to a single-crystalline thin film. Thereafter the single-crystalline thin film is selectively removed while leaving a specific region on the substrate. Thus, it is possible to selectively form a single-crystalline thin film having a regulated crystal orientation on an arbitrary specific region of the substrate.

According to the present invention, a method of forming a single-crystalline thin film of a prescribed material comprises (a) a step of forming an amorphous or polycrystalline thin film of the prescribed material on a substrate, (b) a step of irradiating the substrate with beams of low energy levels causing no sputtering of the prescribed material from directions which are perpendicular to a plurality of densest crystal planes having different directions in the single-crystalline thin film to be formed under a high temperature below the crystallization temperature of the prescribed material, (c) a step of forming a masking material on the thin film after the step (b), (d) a step of selectively removing the masking material, and (e) a step of irradiating the substrate with the beams of low energy levels causing no sputtering of the prescribed material from directions which are perpendicular to the plurality of densest crystal planes having different directions in the single-crystalline thin film to be formed and different from those in the step (b), while utilizing the selectively removed masking material as a screen.

In the method according to the present invention, the amorphous or polycrystalline thin film formed on the substrate is irradiated with beams under a prescribed temperature to facilitate action of the law of Bravais and vertical solid phase epitaxial growth, thereby converting the thin film to a single-crystalline thin film. Thereafter a masking material is selectively formed on this single-crystalline thin film, which in turn is again irradiated with beams from new directions. At this time, the masking material serves as a screen for the beams, whereby the single-crystalline thin film is converted to a second single-crystalline thin film having a new crystal orientation on a region where the masking material is selectively removed. Namely, it is possible to selectively form single-crystalline thin films having different crystal orientations on a plurality of arbitrary specific regions of the substrate.

The atomic weight of an element forming the gas is preferably lower than the maximum one of the atomic weights of elements forming the prescribed material.

The atomic weight of the element forming the beams which are applied onto the substrate is lower than the maximum one of the atomic weights of the elements forming the thin film as irradiated, whereby most parts of the atoms forming the applied gas are rearwardly scattered on the surface of the thin film as irradiated or in the vicinity thereof, to hardly remain in the thin film. Thus, it is possible to obtain a single-crystalline thin film having a small amount of impurities.

The atomic weight of an element forming the gas is preferably lower than the maximum one of the atomic weights of elements forming the masking material.

The atomic weight of the element forming the beams which are applied onto the substrate is lower than the maximum one of the atomic weights of the elements forming the masking material, whereby most parts of the atoms forming the gas as applied are rearwardly scattered on the surface of the masking material or in the vicinity thereof, to hardly penetrate into the masking material and the thin film as irradiated. Thus, it is possible to obtain a single-crystalline thin film having a small amount of impurities.

The present invention is also directed to an apparatus for forming a single-crystalline thin film. According to the present invention, an apparatus for forming a single-crystalline thin film of a prescribed material on a substrate comprises irradiation means for irradiating the substrate with beams of low energy levels causing no sputtering of the prescribed material from directions which are perpendicular to a plurality of densest crystal planes having different directions in the single-crystalline thin film to be formed, and substrate moving means for making the substrate scanned with respect to the irradiation means.

Preferably, the apparatus for forming a single-crystalline thin film further comprises beam focusing means for bringing sections of the beams into strip shapes on the substrate.

In the apparatus according to the present invention, the substrate can be scanned by the substrate moving means, whereby it is possible to form a single-crystalline thin film having high homogeneity on a long substrate.

Further, the apparatus according to the present invention comprises beam focusing means for bringing sections of the beams into strip shapes on the substrate, whereby it is possible to efficiently form a single-crystalline thin film with higher homogeneity by scanning the substrate.

According to the present invention, an apparatus for forming a single-crystalline thin film of a prescribed material on a substrate comprises a single beam source for supplying a beam of a gas, a reflector for reflecting at least a part of the beam which is supplied by the beam source, thereby implementing irradiation of the substrate with the gas in a plurality of prescribed directions of incidence, and reflector driving means for varying the angle of inclination of the reflector.

In the apparatus according to the present invention, the beams to be applied to the thin film are obtained by a single beam source and a reflector which is arranged in a path, whereby it is possible to irradiate the thin film with the beams from a plurality of prescribed directions which are different to each other with no requirement for a plurality of beam sources. Further, this apparatus comprises reflector driving means, whereby it is possible to change and re-set directions of incidence of the beams upon the substrate. Thus, it is possible to form a plurality of types of single-crystalline thin films having different crystal structures or different crystal orientations by a single apparatus.

According to the present invention, an apparatus for forming a single-crystalline thin film of a prescribed material on a substrate comprises a single beam source for supplying a beam made from a gas, a plurality of reflectors, each of which reflects at least a part of the beam supplied by the beam source, thereby implementing irradiation of the substrate with the gas in a plurality of prescribed directions of incidence related to the angle of inclination of the reflector, and reflector exchange means for selecting a prescribed one from the plurality of reflectors and utilizing the same for reflecting the beam.

In the apparatus according to the present invention, the beams to be applied to the thin film are obtained by a single beam source and a reflector which is arranged in a path, whereby it is possible to irradiate the thin film with the beams from a plurality of prescribed directions which are different from each other with no requirement for a plurality of beam sources. Further, this apparatus comprises reflector exchange means, whereby it is possible to arbitrarily select directions of incidence of the beams upon the substrate from a plurality of reflectors to re-set the same. Thus, it is possible to form a plurality of types of single-crystalline thin films having different crystal structures or crystal orientations by a single apparatus.

The apparatus for forming a single-crystalline thin film preferably further comprises film forming means for forming an amorphous or polycrystalline thin film of the same material as the single-crystalline thin film on the substrate.

The apparatus of the present invention comprises film forming means such as chemical vapor deposition means, for example, whereby it is possible to sequentially convert the thin film as being formed to a single-crystalline thin film by forming the thin film while irradiating the same with beams. Thus, there is no need to facilitate vertical epitaxial growth of the thin film, whereby the single-crystalline thin film can be formed under a low temperature.

According to the present invention, an apparatus for forming a single-crystalline thin film of a prescribed material on a substrate comprises etching means for etching a surface of the substrate, film forming means for forming an amorphous or polycrystalline thin film of the prescribed material on the surface of the substrate, and irradiation means for irradiating the substrate with beams of low energy levels causing no sputtering of the prescribed material from directions which are perpendicular to a plurality of densest crystal planes having different directions in the single-crystalline thin film to be formed. Treatment chambers provided in the aforementioned means for storing the substrate communicate with each other. The apparatus further comprises substrate carrying means for introducing and discharging the substrate into and from the respective treatment chambers.

The apparatus according to the present invention comprises etching means, film forming means and irradiation means having treatment chambers communicating with each other, whereby it is possible to start film formation by carrying out etching treatment for removing an oxide film and preventing new progress of oxidation before forming the thin film on the substrate by employing this apparatus. Further, this apparatus comprises substrate carrying means, whereby the substrate can be efficiently carried into the respective treatment chambers.

According to the present invention, an apparatus for forming a single-crystalline thin film of a prescribed material on a substrate having a single-crystalline structure comprises irradiation means for irradiating the substrate with beams of low energy levels causing no sputtering of the prescribed material from directions which are perpendicular to a plurality of densest crystal planes having different directions in the single-crystalline thin film to be formed, and attitude control means for controlling the attitude of the substrate for setting prescribed relations between directions of crystal axes of the substrate and directions of incidence of the beams.

The apparatus according to the tenth aspect of the present invention comprises attitude control means, whereby it is possible to set prescribed relations between the crystal axes of the single-crystalline substrate and the directions of incidence of the beams by employing this apparatus. Thus, it is possible to epitaxially form a new single-crystalline thin film on a single-crystalline substrate at a temperature below the crystallization temperature.

According to the present invention, an apparatus for forming a single-crystalline thin film of a prescribed material on a substrate comprises film forming means for forming an amorphous or polycrystalline thin film of the prescribed material on the substrate by supplying a reaction gas, irradiation means for irradiating the substrate with beams of low energy levels causing no sputtering of the prescribed material from directions which are perpendicular to a plurality of densest crystal planes having different directions in the single-crystalline thin film to be formed, and substrate rotating means for rotating the substrate.

The apparatus according to the present invention comprises substrate rotating means, whereby it is possible to facilitate formation of an amorphous or polycrystalline thin film by intermittently applying the beams while regularly supplying the reaction gas and rotating the substrate during application pauses. Thus, it is possible to form an amorphous or polycrystalline thin film having high homogeneity, whereby high homogeneity is also attained in a single-crystalline thin film which is obtained by converting the same.

According to the present invention, an apparatus for forming a single-crystalline thin film of a prescribed material on a substrate comprises film forming means for forming an amorphous or polycrystalline thin film of the prescribed material on the substrate by supplying a reaction gas, and irradiation means for irradiating the substrate with beams of low energy levels causing no sputtering of the prescribed material from directions which are perpendicular to a plurality of densest crystal planes having different directions in the single-crystalline thin film to be formed. The film forming means has supply system rotating means for rotating an end portion of a supply path for supplying the substrate with the reaction gas with respect to the substrate.

The apparatus according to the present invention comprises supply system rotating means, whereby it is possible to obtain a single-crystalline thin film having high homogeneity while regularly supplying the reaction gas and applying the beams with no intermittent application of the beams. Namely, it is possible to efficiently form a single-crystalline thin film having high homogeneity.

According to the present invention, an apparatus for forming a single-crystalline thin film of a prescribed material on a substrate comprises a plurality of irradiation means for irradiating the substrate with a plurality of beams of low energy levels causing no sputtering of the prescribed material from directions which are perpendicular to a plurality of densest crystal planes having different directions in the single-crystalline thin film to be formed respectively, and control means for independently controlling operating conditions in the plurality of irradiation means respectively.

In the apparatus according to the present invention, control means independently controls operating conditions in irradiation means such as output beam densities, for example, whereby states of a plurality of beams which are applied to the substrate are optimumly controlled. Thus, it is possible to efficiently form a high-quality single-crystalline thin film.

The irradiation means preferably comprises an electron cyclotron resonance type ion source, and the beams are supplied by the ion source.

According to the present invention, an apparatus for forming a single-crystalline thin film of a prescribed material on a substrate comprises irradiation means for irradiating the substrate with beams of a gas supplied by an ion source at low energy levels causing no sputtering of the prescribed material from directions which are perpendicular to a plurality of densest crystal planes having different directions in the single-crystalline thin film to be formed, and bias means for applying a bias voltage across the ion source and the substrate in a direction for accelerating ions.

In the apparatus according to the present invention, bias means applies a bias voltage across the ion source and the substrate, whereby the beams are improved in directivity. Thus, it is possible to form a high-quality single-crystalline thin film having high homogeneity of the crystal orientation.

According to the present invention, an apparatus for forming a single-crystalline thin film of a prescribed material on a substrate comprises irradiation means for irradiating the substrate with beams of a gas supplied by an ion source at low energy levels causing no sputtering of the prescribed material from directions which are perpendicular to a plurality of densest crystal planes having different directions in the single-crystalline thin film to be formed, with a grid which is provided in the vicinity of an ion outlet of the ion source, and grid voltage applying means for applying a voltage to the grid for controlling conditions for extracting ions from the ion source.

In the apparatus according to the present invention, grid voltage applying means optimumly controls conditions for extracting ions from the ion source, whereby it is possible to efficiently form a high-quality single-crystalline thin film.

In the apparatus according to the present invention, the beam source is preferably an electron cyclotron resonance type ion source.

In the apparatus according to the present invention, the beams are supplied by an electron cyclotron resonance type ion source, whereby the ion beams are excellent in directivity while it is possible to obtain strong neutral beams having excellent directivity at positions beyond a prescribed distance from the ion source without employing means for neutralizing ions.

According to the present invention, a beam irradiator for irradiating a target surface of a sample with a beam comprises a container for storing the sample, and a beam source for irradiating the target surface of the sample which is set in a prescribed position of the container with the beam, and at least a surface of a portion irradiated with the beam is made of a material having threshold energy which is higher than energy of the beam in sputtering by irradiation with the beam among an inner wall of the container and a member which is stored in the container.

At least the surface of the portion irradiated with the beam is made of a material having threshold energy which is higher than energy of the beam in sputtering by the irradiation with the beam among the inner wall of the container and the member stored in the container, whereby no sputtering is caused even if the beam reaches the member. Therefore, consumption of the member by sputtering is suppressed, while contamination of the target sample with the material element forming the member is prevented.

According to the present invention, a beam irradiator for irradiating a target surface of a sample with a beam comprises a container for storing the sample, and a beam source for irradiating the target surface of the sample which is set in a prescribed position of the container with the beam, and at least a surface of a portion irradiated with the beam is made of a material having threshold energy with respect to sputtering which is higher than that in the target surface of the sample among an inner wall of the container and a member which is stored in the container.

At least the surface of the portion irradiated with the beam is made of a material having threshold energy with respect to sputtering which is higher than that in the target surface of the sample among the inner wall of the container and the member stored in the container, whereby no sputtering is caused in this member when the target surface of the sample is irradiated with the beam causing no sputtering. Therefore, consumption of the member by sputtering is suppressed under such usage, while contamination of the target sample with the material element forming the member is prevented.

According to the present invention, a beam irradiator for irradiating a target surface of a sample with a beam comprises a container for storing the sample, and a beam source for irradiating the target surface of the sample which is set in a prescribed position of the container with the beam, and at least a surface of a portion irradiated with the beam is made of a material containing an element which is larger in atomic weight than that forming the gas among an inner wall of the container and a member which is stored in the container.

At least the surface of the portion irradiated with the beam is made of a material containing an element which is larger in atomic weight than that forming the beam among the inner wall of the container and the member stored in the container, whereby permeation of a different element in the member is suppressed. Therefore, deterioration of the member caused by invasion of the different element is suppressed.

According to the present invention, a beam irradiator for irradiating a target surface of a sample with a beam comprises a container for storing the sample, and a beam source for irradiating the target surface of the sample which is set in a prescribed position of the container with the beam, and at least a surface of a portion irradiated with the beam is made of the same material as that forming the target surface of the sample among an inner wall of the container and a member which is stored in the container.

At least the surface of the portion irradiated with the beam is made of the same material as that forming the target surface of the sample among the inner wall of the container and the member stored in the container, whereby the target sample is not contaminated with the material element forming the member even if sputtering is caused in this member.

The member stored in the container preferably includes reflecting means which is interposed in a path of the beam for separating the beam into a plurality of components and irradiating the target surface of the sample with the plurality of components from directions which are different from each other.

The reflecting means is stored in the container and at least the surface of the portion irradiated with the beam is made of a material causing no sputtering, the same material as that of the target surface of the sample, or a material containing an element which is larger in atomic weight than that forming the beam gas, whereby contamination of the sample by sputtering of the reflecting means is prevented or deterioration of the reflecting means is suppressed.

The present invention is also directed to a beam irradiating method. According to the present invention, a beam irradiating method of irradiating a target surface of a sample with a beam comprises a step of setting the sample in a prescribed position of a container, and a step of irradiating the target surface of the sample which is set in the container with the beam, and the target surface is irradiated with the beam at energy which is lower than threshold energy of sputtering in a surface of a portion which is irradiated with the beam among an inner wall of the container and a member stored in the container.

The target surface is irradiated with the beam at energy which is lower than threshold energy of sputtering on the surface of the portion irradiated with the beam among the inner wall of the container and the member stored in the container, whereby no sputtering is caused even if the beam reaches the member. Therefore, consumption of the member by sputtering is suppressed, while contamination of the target sample with the material element forming the member is prevented.

The present invention is also directed to a method of forming single-crystalline thin film. According to the present invention, a method of forming a single-crystalline thin film of a prescribed material on a substrate comprises a step of depositing the prescribed material on the substrate under a low temperature causing no crystallization of the prescribed material and irradiating the prescribed material as deposited with a beam of low energy causing no sputtering of the prescribed material from one direction, thereby forming an axially oriented polycrystalline thin film of the material, and a step of irradiating the axially oriented polycrystalline thin film with beams of low energy causing no sputtering of the prescribed material under a high temperature below a crystallization temperature of the prescribed material from directions which are perpendicular to a plurality of densest crystal planes of different directions in the single-crystalline thin film, thereby converting the axially oriented polycrystalline thin film to a single-crystalline thin film.

The axially oriented polycrystalline thin film is previously formed on the substrate and thereafter irradiated with the beams from a plurality of directions so that the thin film is converted to a single-crystalline thin film. Therefore, even if the substrate is not uniformly irradiated with the beams from the plurality of directions due to a screen formed on the substrate, for example, at least either a single-crystalline thin film or an axially oriented polycrystalline thin film is formed on any portion on the substrate, whereby no remarkable deterioration of characteristics is caused.

According to the present invention, a method of forming a single-crystalline thin film of a prescribed material on a substrate comprises a step of depositing the prescribed material on the substrate thereby forming a thin film of the material, a step of irradiating the thin film with a beam of low energy causing no sputtering of the prescribed material under a high temperature below a crystallization temperature of the prescribed material from one direction after the step, thereby converting the thin film to an axially oriented polycrystalline thin film, and a step of irradiating the axially oriented polycrystalline thin film with beams of low energy causing no sputtering of the prescribed material under a high temperature below the crystallization temperature of the prescribed material from directions which are perpendicular to a plurality of densest crystal planes of different directions in the single-crystalline thin film, thereby converting the axially oriented polycrystalline thin film to a single-crystalline thin film.

The axially oriented polycrystalline thin film is previously formed on the substrate and thereafter irradiated with the beams from a plurality of directions, so that the thin film is converted to a single-crystalline thin film. Therefore, even if the substrate is not uniformly irradiated with the beams from the plurality of directions due to a screen formed on the substrate, for example, at least either a single-crystalline thin film or an axially oriented polycrystalline thin film is formed on any portion on the substrate, whereby no remarkable deterioration of characteristics is caused.

The direction of the beam in formation of the axially oriented polycrystalline thin film is preferably identical to one of the plurality of directions of the gas beams in the conversion of the axially oriented polycrystalline thin film to the single-crystalline thin film.

The direction of application of the gas beam in formation of the axially oriented polycrystalline thin film is identical to one of the plurality of directions of gas beams for converting the axially oriented polycrystalline thin film to a single-crystalline thin film, whereby conversion to the single-crystalline thin film is smoothly carried out.

The is preferably an inert gas.

The beam of a gas, preferably, an inert gas, is so applied that no particularly remarkable influence is exerted on the electrophysical properties of the thin film even if the gas remains in the single-crystalline thin film as formed, while it is possible to easily remove the as-invaded gas from the thin film.

The atomic weight of an element forming the inert gas is preferably lower than the maximum atomic weight among those of elements forming the prescribed material.

The atomic weight of the element forming the inert gas is lower than the maximum atomic weight of elements forming the prescribed material which is grown as the thin film, whereby most part of atoms or ions of the applied inert gas are rearwardly scattered on the surface of the thin film or in the vicinity thereof, to hardly remain in the thin film.

The prescribed material preferably contains an element forming a gas material which is a gas under a normal temperature, and the beam is preferably a beam of the gas material.

The gas as applied contains an element forming the material grown as a thin film. Even if atoms or ions of the element remain in the thin film after irradiation, therefore, these will not exert a bad influence on the single-crystalline thin film as impurities.

The beam is preferably formed by an electron cyclotron resonance ion source.

The beam generation source is an electron cyclotron resonance ion generation source. Therefore, the ion beam has high directivity, while a strong neutral beam can be obtained at a distance exceeding a prescribed length from the ion generation source without employing means for neutralizing ions. Further, it is possible to employ an electrically insulating substrate without employing means for neutralizing the ions.

According to the present invention, a beam irradiator for irradiating a target surface of a sample with a gas beam comprises a single beam source for supplying the beam, and reflecting means for reflecting the beam which is supplied by the beam source, thereby enabling irradiation of the target surface with the gas in a plurality of prescribed directions of incidence, and the reflecting means comprises a reflector having a plurality of reflecting surfaces for reflecting the beam in a plurality of directions, and a screen which is interposed in a path of the beam between the beam source and the reflecting surfaces for selectively passing the beam thereby preventing multiple reflection by the plurality of reflecting surfaces.

Multiple reflection of the beam by the plurality of reflecting surfaces is prevented by the screen, whereby no beam is applied from a direction other than a prescribed direction of incidence.

The screen preferably further selectively passes the beam to uniformly irradiate the target surface with the beam.

The target surface is uniformly irradiated with the beam by action of the screen. Therefore, a high quality single-crystalline thin film is formed when the apparatus is applied to formation of a single-crystalline thin film, for example.

The present invention is also directed to a beam reflecting device. According to the present invention, a beam reflecting device for reflecting a beam which is supplied from a single beam source thereby enabling irradiation of a target surface of a sample with the gas in a plurality of prescribed directions of incidence comprises a reflector having a plurality of reflecting surfaces for reflecting the beam in a plurality of directions, and a screen which is interposed in a path of the beam between the beam source and the reflecting surfaces for selectively passing the beam thereby preventing multiple reflection by the plurality of reflecting surfaces.

Multiple reflection of the beam by the plurality of reflecting surfaces is prevented by the screen, whereby no beam is applied from a direction other than a prescribed direction of incidence.

The screen preferably further selectively passes the beam to uniformly irradiate the target surface with the beam.

The target surface is uniformly irradiated with the beam by action of the screen. Therefore, a high-quality single-crystalline thin film is formed when the apparatus is applied to the formation of a single-crystalline thin film, for example.

According to the present invention, a beam irradiator for irradiating a target surface of a sample with a beam comprises a single beam source for supplying the beam, and reflecting means for reflecting the beam which is supplied by the beam source, thereby enabling irradiation of the target surface with the gas in a plurality of prescribed directions of incidence, and the reflecting means comprises a first reflector which is arranged in a path of the beam supplied from the beam source for reflecting the beam in a plurality of directions thereby generating a plurality of divergent beams having beam sections which are two-dimensionally enlarged with progress of the beams, and a second reflector having a concave reflecting surface for further reflecting the plurality of divergent beams to be incident upon the target surface substantially as parallel beams from a plurality of directions.

The beams applied to the target surface of the sample are obtained by the single beam source and the reflecting means provided in the path, whereby it is possible to irradiate the target surface with beams from a plurality of different prescribed directions with no requirement for a plurality of beam sources. Further, the beam is reflected by the first reflector to be two-dimensionally diverged in a plurality of directions and then converted to substantially parallel beams by the second reflector, whereby the beam can be uniformly applied to the target surface which is wider than the section of the beam supplied from the beam source. Therefore, it is possible to widely and efficiently form a single-crystalline thin film of a prescribed material on a wide substrate provided with a thin film of the prescribed material on its surface or a wide substrate having a thin film of the prescribed material being grown on its surface without scanning the substrate, by irradiating the substrate with a beam by this apparatus.

The reflecting means preferably further comprises rectifying means which is provided in a path of the beams between the first reflector and the substrate for regularizing directions of the beams.

The rectifying means is arranged in the path of the beam between the first reflector and the sample, whereby the beam can be regulated along a prescribed direction. Therefore, no strict accuracy is required for the shapes and arrangement of the respective reflectors, whereby the apparatus can be easily structured.

The reflecting means preferably further comprises beam distribution adjusting means which is interposed in a path of the beam between the beam source and the first reflector for adjusting distribution of the beam on a section which is perpendicular to the path, thereby adjusting the amounts of respective beam components reflected by the first reflector in the plurality of directions.

The beam distribution adjusting means adjusts the amounts of a plurality of beam components reflected by the first reflector, whereby the amounts of a plurality of beam components which are incident upon the target surface from a plurality of directions can be adjusted. Therefore, the amounts of the respective beam components incident upon the substrate can be optimumly set to be identical to each other, for example, whereby it is possible to efficiently form a high-quality single-crystalline thin film.

According to the present invention, a beam reflecting device for reflecting a gas beam which is supplied from a single beam source thereby enabling irradiation of a target surface of a sample with the gas in a plurality of prescribed directions of incidence comprises a first reflector for reflecting the beam in a plurality of directions thereby generating a plurality of divergent beams having beam sections which are two-dimensionally enlarged with progress of the beams, and a second reflector having a concave reflecting surface for further reflecting the plurality of divergent beams to be incident upon the target surface substantially as parallel beams from a plurality of directions.

The beam which is supplied from the single beam source is reflected by the first reflector to be two-dimensionally diverged in a plurality of directions and then converted to substantially parallel beams by the second reflector, whereby it is possible to irradiate the target surface which is wider than the section of the beam supplied from the beam source from a plurality of directions with no requirement for a plurality of beam sources. Therefore, it is possible to widely and efficiently form a single-crystalline thin film of a prescribed material on a wide substrate provided with a thin film of the prescribed material on its surface or a wide substrate having a thin film of the prescribed material being grown on its surface without scanning the substrate, by irradiating the substrate with a beam by this apparatus.

According to the present invention, a beam irradiator for irradiating a target surface of a sample with beams comprises a plurality of beam sources for supplying the beams, and a plurality of reflecting means for reflecting the beams which are supplied by the plurality of beam sources thereby enabling irradiation of a common region of the target surface with the gas in a plurality of prescribed directions of incidence, and each reflecting means comprises a first reflector which is arranged in a path of each beam supplied from each beam source for reflecting the beam thereby generating a beam having a beam section which is two-dimensionally enlarged with progress of the beam, and a second reflector having a concave reflecting surface for further reflecting the divergent beam to be incident upon a linear or strip-shaped common region of the target surface substantially as a parallel beam, while the beam irradiator further comprises moving means for scanning the sample in a direction intersecting with the linear or strip-shaped common region.

The beams are reflected by the first reflector to be substantially one-dimensionally diverged and thereafter converted to substantially parallel beams by the second reflector, whereby it is possible to irradiate a linear or strip-shaped region which is wider than the beams supplied from the beam sources with parallel beams from prescribed directions of incidence. Further, the sample is scanned in a direction intersecting with the linear or strip-shaped region, whereby the beams can be uniformly applied to a wide target surface. In addition, a plurality of beam sources and a plurality of reflecting means are so provided that a wide target surface can be uniformly irradiated with beams from a plurality of directions of incidence.

Each reflecting means preferably further comprises rectifying means which is provided in a path of each beam between the first reflector and the substrate for regulating the direction of the beam.

The rectifying means is arranged in the beam path between the first reflector and the substrate, whereby the beams can be regulated in a prescribed direction. Therefore, no strict accuracy is required for the shapes and arrangement of the respective reflectors, whereby the apparatus can be easily structured.

According to the present invention, a beam reflecting device for reflecting a gas beam which is supplied from a beam source thereby enabling irradiation of a target surface of a sample with the gas in a prescribed direction of incidence comprises a first reflector for reflecting the beam thereby generating a divergent beam having a beam section which is two-dimensionally enlarged with progress of the beam, and a second reflector having a concave reflecting surface for further reflecting the divergent beam to be incident upon a linear or strip-shaped region of the target surface substantially as a parallel beam.

The beams are reflected by the first reflector to be substantially one-dimensionally diverged and thereafter converted to substantially parallel beams by the second reflector, whereby it is possible to irradiate a linear or strip-shaped region which is wider than the beams supplied from the beam sources with the beams.

Accordingly, an object of the present invention is to provide a technique which can form an axially oriented polycrystalline thin film oriented in a desired direction and a single-crystalline thin film having a desired crystal orientation on an arbitrary substrate including a single-crystalline substrate.

Another object of the present invention is to provide a beam irradiator and a beam reflecting device for enabling efficient formation of a single-crystalline thin film.

Throughout the specification, the term "substrate" is not restricted to a substance simply serving as a base to be provided thereon with a thin film, but generally indicates a medium to be provided thereon with a thin film, including a device having a prescribed function, for example.

Throughout the specification, the term "molecular beam" refers to atomic beams and ion beams.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 7 is a graph showing characteristics of an ECR ion generator which is employed in the method according to the second preferred embodiment of the present invention;

FIG. 8 illustrates experimental data verifying the method according to the second preferred embodiment of the present invention;

FIG. 69 is a front sectional view showing an apparatus according to a twenty-fourth preferred embodiment of the present invention;

DESCRIPTION OF THE PREFERRED EMBODIMENTS

A. Formation of Single-Crystalline Thin Film or Axially Oriented Polycrystalline Thin Film Preferred embodiments for efficiently forming a single-crystalline thin film or axially oriented polycrystalline thin film on a substrate are now described.

A-1. First Preferred Embodiment

A first preferred embodiment of the present invention is now described.

A-1-1. Structure of Apparatus

Figure 1:
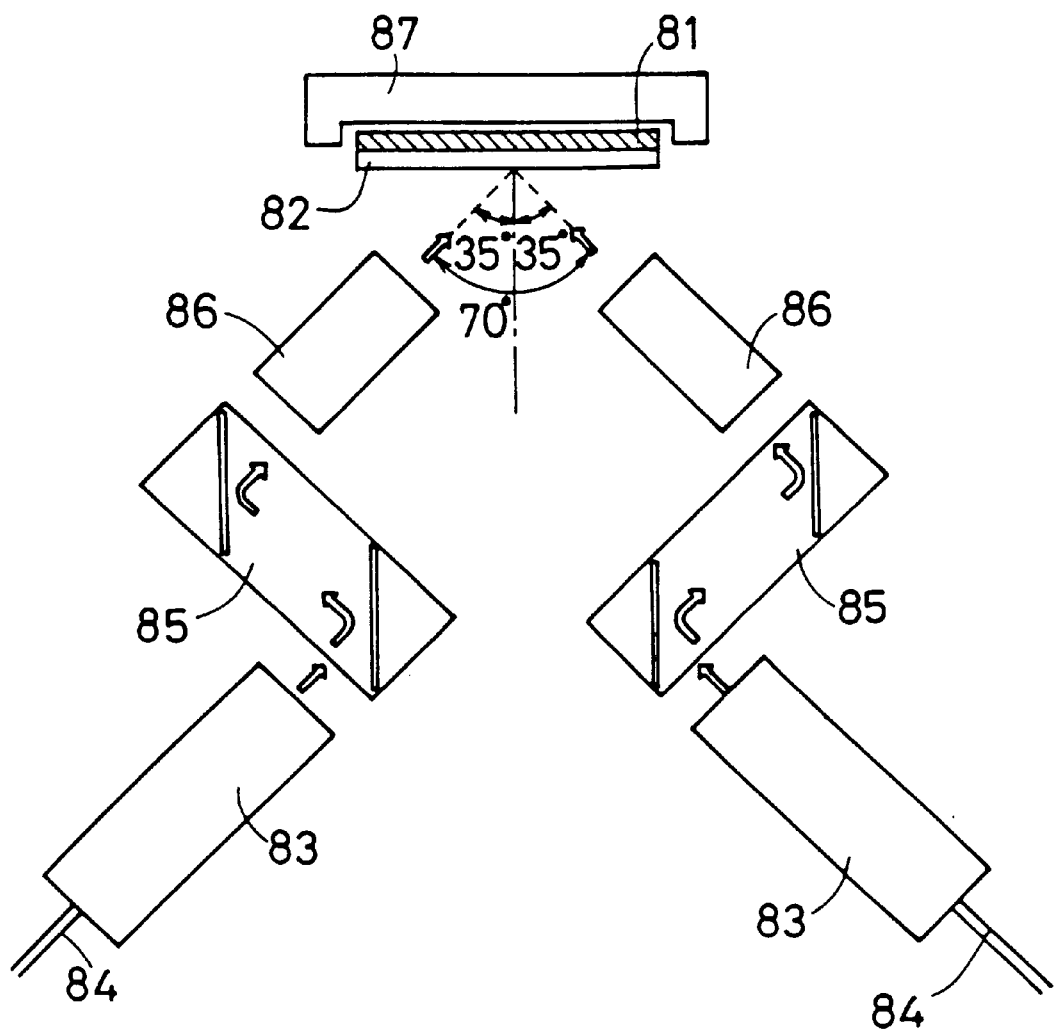
FIG. 1 is a model diagram showing an apparatus which is suitable for carrying out a method according to a first preferred embodiment of the present invention.

FIG. 1 is a model diagram showing the structure of an apparatus 80 for effectively implementing a method according to the first preferred embodiment of the present invention. This apparatus 80 is adapted to convert a polycrystalline thin film 82, which is formed on a substrate 81, to a single-crystalline thin film. Therefore, the apparatus 80 is supplied with a sample prepared by the polycrystalline thin film 82 of a prescribed material which is already formed on the substrate 81 by a well-known method.

For example, the substrate 81 is prepared from polycrystalline $SiO_2$ (quartz), and a polycrystalline Si (silicon) thin film 82 is formed on this quartz substrate 81, to be converted to a single-crystalline Si thin film. The apparatus 80 comprises cage-type ion sources 83. Inert gases are introduced into the ion sources 83 from conduits 84 and ionized therein by electron beams, thereby forming plasmas of the inert gases. Further, only ions are extracted from the ion sources 83 by action of electric fields which are formed by lead electrodes provided in the ion sources 83, whereby the ion sources 83 emit ion beams. For example, it is possible to accelerate Ne (neon) ions to 200 to 600 eV by the ion sources 83 of 10 cm in diameter, for example, with current densities of 1 to 9 $mA/cm^2$.

The ion beams which are emitted from the ion sources 83 are guided to reflection deaccelerators 85 and collimators 86, and thereafter applied to the surface of the polycrystalline thin film 82 at prescribed angles. Each reflection deaccelerator 85 is provided with two silicon single-crystalline plates having major surfaces of (100) planes. These silicon single-crystalline plates are in the form of discs having diameters of 15 cm, for example. These silicon single-crystalline plates successively reflect the ion beams which are incident on the major surfaces thereof at angles of incidence of 45° to reduce energy levels and neutralize electric charges thereof, thereby converting the ion beams to low-energy neutral atomic beams.

Figure 2A:
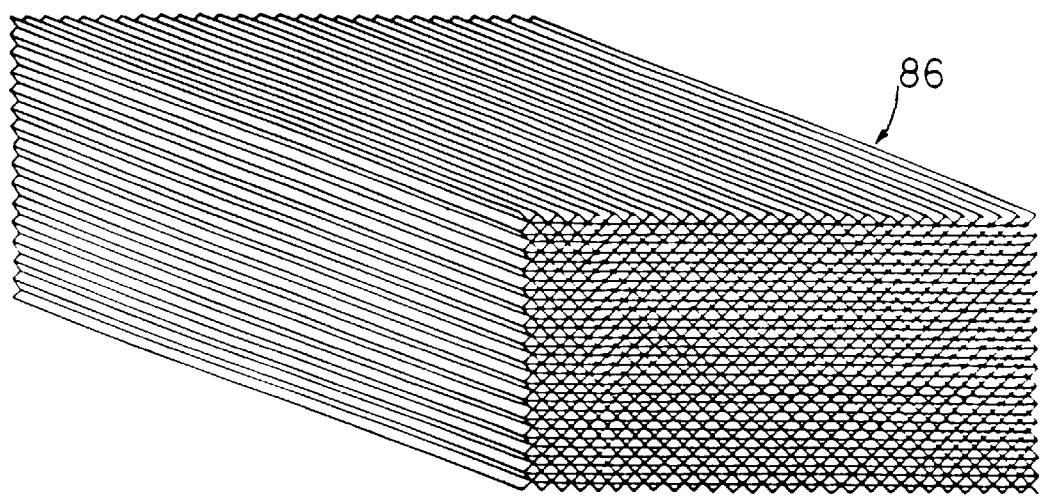
FIGS. 2A to 2C are perspective views showing a structure of a collimator.
Figure 2B:
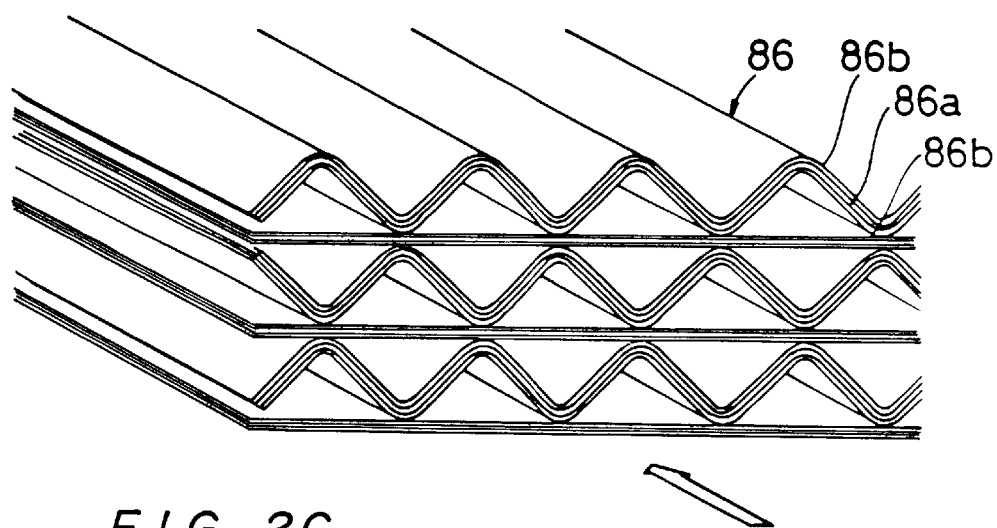
Figure 2C:
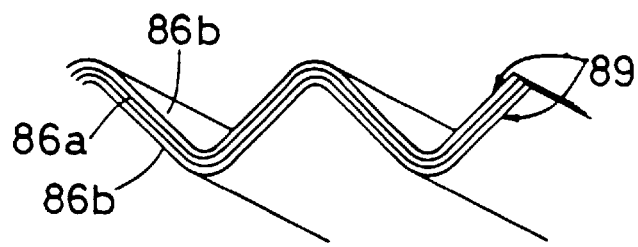

FIGS. 2A to 2C are perspective views showing the structure of each collimator 86. FIG. 2A is an overall perspective view, FIG. 2B is an enlarged perspective view and FIG. 2C is a further enlarged perspective view. The collimator 86 regulates directions of the atomic beams, thereby supplying the polycrystalline thin film 82 with atomic beams having high directivity. The collimator 86 is formed by alternately stacking corrugated members, which are prepared by evaporating silicon films 86b on both sides of aluminum plates 86a as shown in FIG. 2C, and flat plate members having similar structures as shown in FIG. 2B. This collimator 86 has 30 layers, for example. Both surfaces of the aluminum plates 86a are covered with the silicon films 86b, so that aluminum atoms which are different atoms will not reach the polycrystalline Si thin film 82 even if the corrugated members and the flat plate members are struck by a neutral atom current to cause sputtering. The atomic beams are regularized in direction within a range of ±0.5° while passing through thin channels defined between the corrugated and flat plate members, to be converted to atomic beams having high directivity.

The quartz substrate 81 is mounted on a heater 87, which is adapted to maintain the quartz substrate 81 at a prescribed high temperature.

A-1-2. Operation of Apparatus

The operation of the apparatus 80 is now described. The sample which is supplied to the apparatus 80 can be prepared by forming the polycrystalline Si thin film 82 on the quartz substrate 81 by well-known chemical vapor deposition (CVD), for example. The quartz substrate 81 is 1.5 mm in thickness, for example, and the polycrystalline Si thin film 82 is about 2000 Å in thickness, for example. First, the sample as prepared is mounted on the heater 87. This heater 87 maintains the sample, i.e., the quartz substrate 81 and the polycrystalline Si thin film 82, at a temperature of 550° C. This temperature is lower than the crystallization temperature of silicon, whereby no single-crystalline Si is converted to polycrystalline Si under this temperature. However, this temperature is so high that polycrystalline Si can be grown to single-crystalline Si if a seed crystal is present.

Then, Ne (neon) gases are introduced into the ion sources 83 from the conduits 84, to form Ne ion beams. The as-formed Ne ion beams pass through the reflection deaccelerators 85 and the collimators 86, to reach the surface of the polycrystalline Si thin film 82 as low energy neutral Ne atomic beams.

The two Ne atomic beams which are started from the two ion sources 83 are incident upon the surface of the polycrystalline Si thin film 82 at angles of incidence of 35° so that the directions of incidence are two-fold symmetrical with each other about a normal line on the surface of the polycrystalline Si thin film 82. The directions of incidence of these two beams, which are at an angle of 70° to each other, correspond to normal line directions of independent two densest planes, i.e., (111) planes of single-crystalline Si having a diamond crystal structure.

The energy levels of the plasmas formed by the ion sources 83 are so set that the Ne atoms reaching the polycrystalline Si thin film 82 are at levels causing no sputtering of the polycrystalline Si thin film 82, i.e., at levels lower than a value (=27 eV) known as a threshold energy level in sputtering of Si caused by irradiation with Ne atoms. Therefore, the so-called law of Bravais acts on the polycrystalline Si thin film 82. Namely, Si atoms provided in the vicinity of the surface of the polycrystalline Si thin film 82 are so rearranged that planes perpendicular to the directions of incidence of the Ne atomic beams which are applied to the polycrystalline Si thin film 82 define densest crystal planes.

Since the Ne atomic beams are incident from two directions corresponding to those perpendicular to the independent densest planes of the single-crystalline Si, whereby the Si atoms are so rearranged that planes perpendicular to the directions of incidence define the densest planes. Namely, two independent (111) planes are controlled by the two Ne atoms beams having independent directions of incidence to be rearranged in constant directions, whereby the crystal orientation is univocally decided. Thus, a layer which is close to the surface of the polycrystalline Si thin film 82 is converted to a single-crystalline Si layer having a regulated crystal orientation.

Figure 3A:
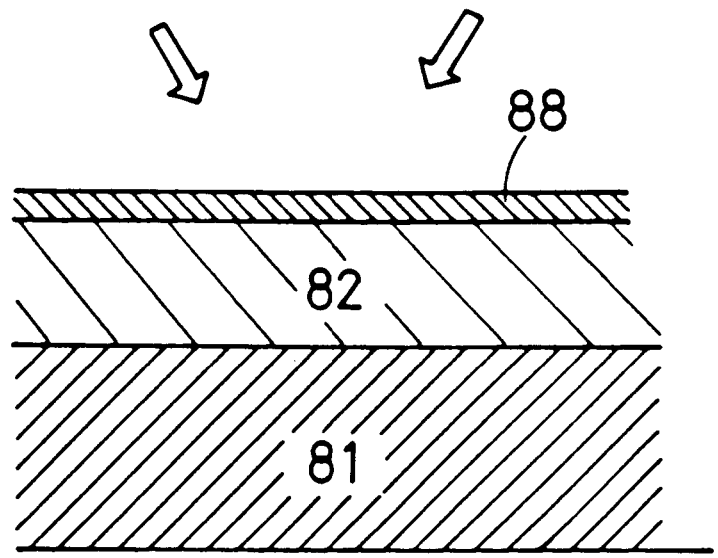
FIGS. 3A and 3B are sectional views showing a sample.
Figure 3B:
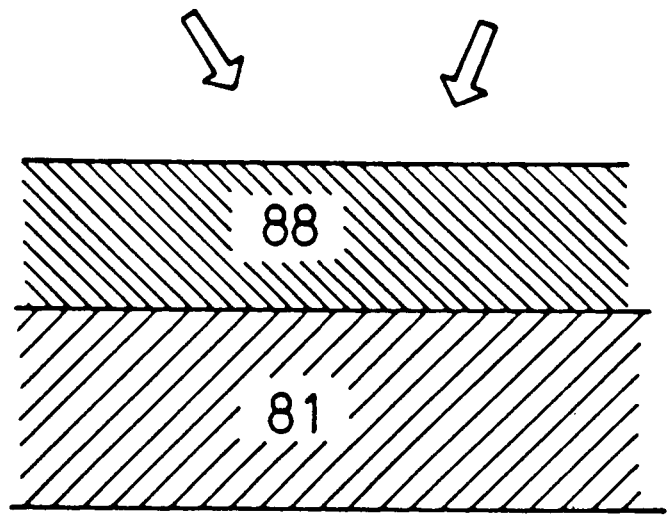

The above description corresponds to a first stage of single-crystallization of the polycrystalline Si thin film 82. FIGS. 3A and 3B are model diagrams showing internal structures of the sample in the first stage and a following second stage of single-crystallization. In the first stage, a single-crystalline Si layer 88 is formed only in the vicinity of the surface of the polycrystalline Si thin film 82, as shown in FIG. 3A.

As hereinabove described, the temperature of the polycrystalline Si thin film 82 is adjusted to a level which is suitable for growing a seed crystal. Therefore, the single-crystalline Si layer 88 which is formed on the surface of the polycrystalline Si thin film 82 serves as a seed crystal, to be grown toward a deep portion of the polycrystalline Si thin film 82. Finally the overall region of the polycrystalline Si thin film 82 is converted to the single-crystalline Si layer 88, as shown in FIG. 3B. Thus, a single-crystalline Si thin film having a regulated crystal orientation is formed on the quartz substrate 81. Since the polycrystalline Si thin film 82 is maintained at a temperature which is lower than the crystallization temperature of Si as hereinabove described, the single-crystalline Si layer 88 will not return to the polycrystalline structure, which is in a thermal equilibrium state.

The single-crystalline Si layer 88, which is formed on the polycrystalline Si thin film 82 by irradiation to serve as a seed crystal, is integrated with a polycrystalline Si layer remaining in its deep portion since this layer 88 is converted from the polycrystalline Si thin film 82. Namely, the polycrystalline Si layer 82 is completely in contact with the seed crystal. Therefore, vertical solid phase epitaxial growth progresses in an excellent state. Further, the seed crystal and the single-crystalline Si which is formed by the solid phase epitaxial growth are single crystals of the same material having the same crystal orientation, whereby it is not necessary to remove the seed crystal after formation of the single-crystalline Si thin film 88. Further, the single-crystalline Si thin film 88 is formed by the vertical solid phase epitaxial growth, whereby it is possible to efficiently obtain a desired single-crystalline Si thin film in a short time as compared with the prior art utilizing transverse growth.

An element forming the atomic beams which are applied to the polycrystalline Si thin film 82 is preferably prepared from Ne, as hereinabove described. Since Ne atoms are lighter than Si atoms, there is a high possibility that the relatively heavy Si atoms rearwardly scatter the relatively light Ne atoms when the atomic beams are applied to the Si thin film, whereby the Ne atoms hardly penetrate into the Si thin film to remain therein. Further, the inert element such as Ne is selected as an element forming the as-applied atomic beams since the inert element forms no compound with any element forming the thin film such as Si even if the same remains in the Si thin film, whereby the electronic/physical properties of the Si thin film are hardly influenced by this element and this element can be easily removed by increasing the temperature of the as-finished single-crystalline Si thin film to some extent.

The sample is irradiated with the neutralized atomic beams in place of direct Ne ion beams, for the following reasons: First, charged particle beams such as ion beams are spread to lose directivity by repulsion between the particles caused by static electricity. Second, charges are stored in the thin film when charged particle beams are employed for the thin film which is made of a material having high resistivity or the like, such that the beams cannot reach the thin film beyond a certain amount due to repulsion of the stored charges. When neutral atomic beams are employed, on the other hand, no charges are stored in the thin film while parallel beams having excellent directivity reach the thin film to facilitate smooth crystallization.

A-1-3. Other Exemplary Sample

While the above description has been made on the case of converting the polycrystalline Si thin film 82 to a single-crystalline Si thin film, the inventive method is applicable not only to a polycrystalline thin film but to an amorphous thin film, to attain a similar effect. Experimental data verifying this point is now described.

In the experiment, a sample was prepared by previously forming an amorphous Si thin film on a quartz substrate by plasma CVD. Inert gases to be applied to the sample were prepared from Ne gases. The quartz substrate was 1.5 mm in thickness, and the amorphous Si thin film was about 2000 Å in thickness. This sample was mounted on the heater 87, and maintained at a temperature of 550° C. In this state, the sample was irradiated with beams for about 20 seconds under conditions of acceleration voltages of ion sources of 2000 V and current densities of 2 mA/cm$^2$. As a result, a brown color specific to amorphous Si disappeared from the as-irradiated central portion of the sample, and this portion was changed to a slightly yellowish transparent state. In this portion, a part of about 1 cm$^2$ was examined with X rays and by directive etching, whereby it was provided that single-crystalline Si was formed with (110) axes along a normal line direction of the substrate.

The crystal orientation was chosen by covering the crystal planes with SiO$_2$ (silicon dioxide) films, forming small holes in these oxide films, etching the same with KOH (potassium hydroxide) and confirming etching bits. As a result, it was possible to confirm that the etching bits were hexagonal, thereby confirming that single-crystalline Si having (110) axes in the normal line direction was completed.

A-2. Second Preferred Embodiment

A second preferred embodiment of the present invention is now described.

A-2-1. Overall Structure of Apparatus

Figure 4:
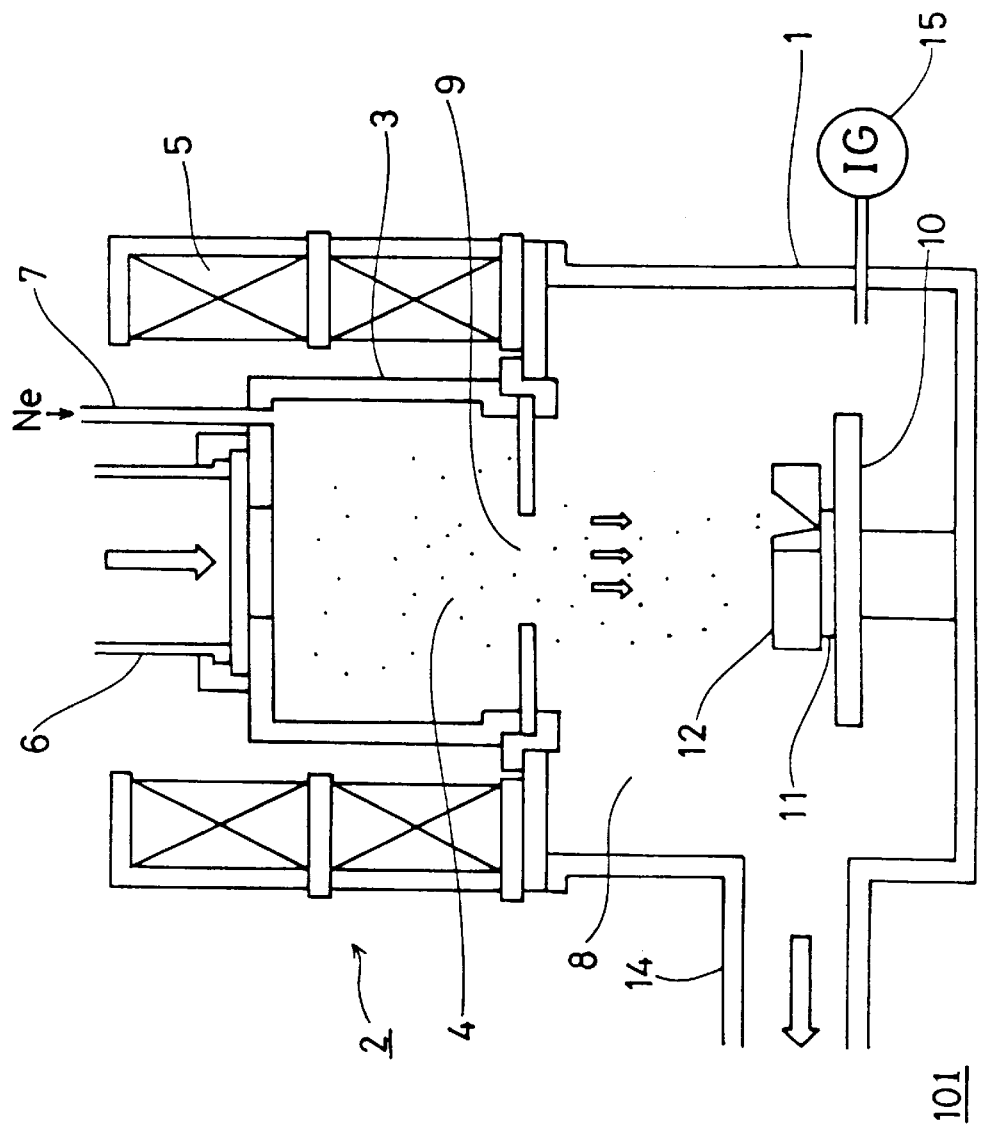
FIG. 4 is a front sectional view showing an apparatus which is suitable for carrying out a method according to a second preferred embodiment of the present invention.

FIG. 4 is a front sectional view showing an apparatus 101 for effectively implementing a method according to the second preferred embodiment of the present invention. This apparatus 101 is also adapted to convert a polycrystalline thin film, which is previously formed on a substrate 11, to a single-crystalline thin film, similarly to the aforementioned apparatus 80.

This apparatus 101 comprises a reaction vessel 1, and an electron cyclotron resonance (ECR) ion generator 2 which is built in an upper portion of the reaction vessel 1. The ECR ion generator 2 comprises a plasma container 3 which defines a plasma chamber 4 in its interior. A magnetic coil 5 is provided around the plasma container 3, to apply a dc high magnetic field to the plasma chamber 4. Further, a waveguide 6 and an inlet pipe 7 are provided on an upper surface of the plasma container 3 for introducing a microwave and an inert gas such as Ne gas into the plasma chamber 4 respectively.

The reaction vessel 1 defines a reaction chamber 8 in its interior. The bottom portion of the plasma container 3 defines an outlet 9 for passing a plasma in its center. The reaction chamber 8 and the plasma chamber 4 communicate with each other through the outlet 9. In the interior of the reaction chamber 8, a sample holder 10 is arranged on a position immediately under the outlet 9. The substrate 11 is placed on the sample holder 10, while a reflector 12 is placed to be located above the substrate 11. The sample holder 10 comprises a heater (not shown), to heat the substrate 11 and hold the same at a proper high temperature level.

The reflector 12 is preferably made of a metal. The sample holder 10 is coupled to a rotation driving mechanism (not shown), to be rotatable in a horizontal plane. Further, the sample holder 10 can horizontally move the substrate 11 while fixing the reflector 12.

The reaction chamber 8 communicates with an evacuation pipe 14. An end of the evacuation pipe 14 is coupled with a vacuum unit (not shown) to evacuate the reaction chamber 8 through the evacuation pipe 14, thereby maintaining the reaction chamber 8 at a prescribed degree of vacuum. A vacuum gauge 15 for displaying the degree of vacuum in the reaction chamber 8 is provided in communication with the reaction chamber 8.

A-2-2. Structure of Reflector

Figure 5:
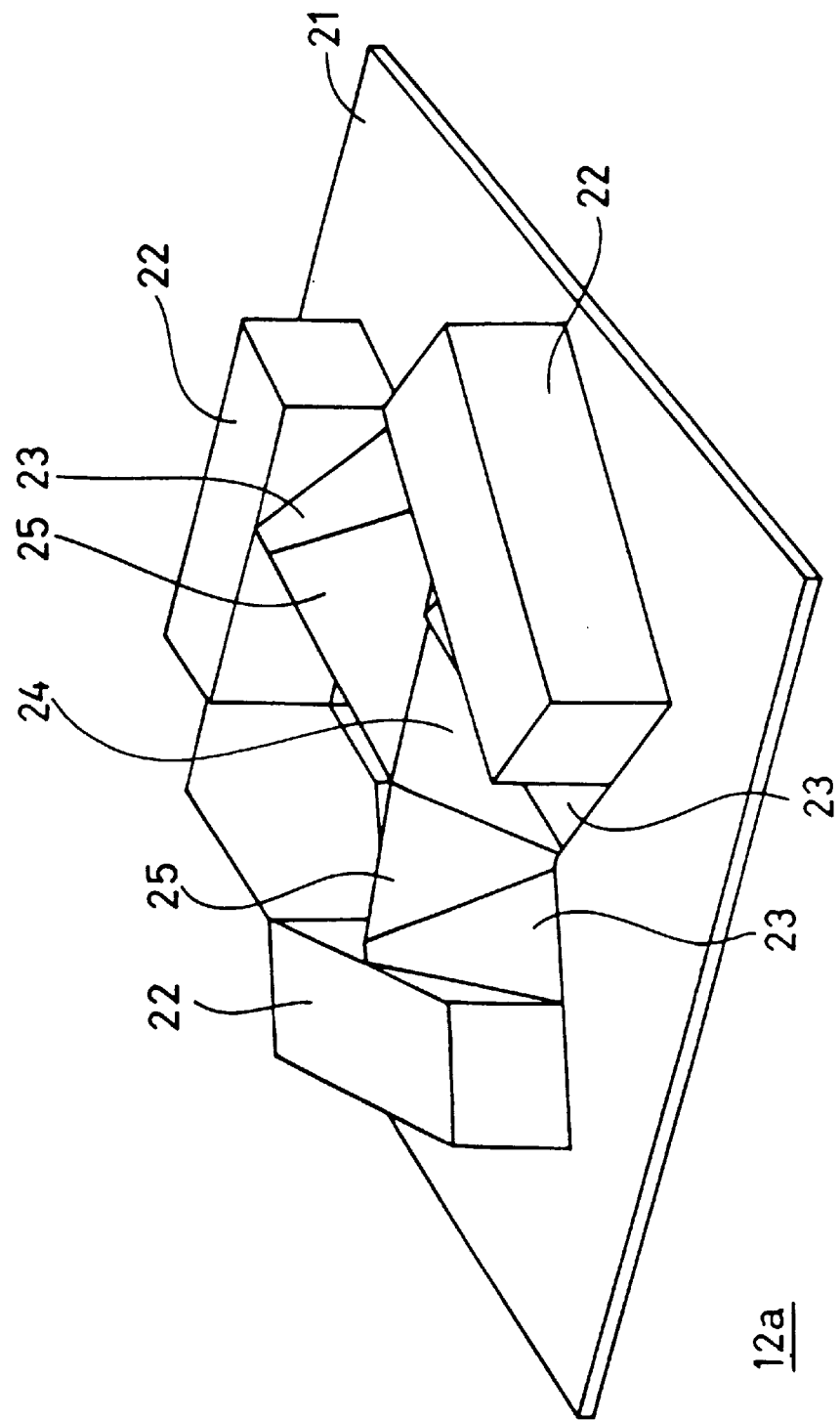
FIG. 5 is a perspective view showing a reflector which is employed in the method according to the second preferred embodiment of the present invention.

FIG. 5 is a perspective view showing an exemplary reflector 12a. This reflector 12a is adapted to form a single crystal having a diamond structure, such as single-crystalline Si. The reflector 12a defines an opening on a central portion of a flat plate type base 21. Three blocks 22 in the form of rectangular parallelepipeds are fixedly provided around the opening, and reflecting blocks 23 are fixed to inner sides of the blocks 22 respectively. Consequently, an equilateral triangular opening 24 which is trimmed with the reflecting blocks 23 is defined at the central portion of the base 21. In the reflecting blocks 23, slopes 25 facing the opening 24 serve as reflecting surfaces for reflecting a gas beam. Therefore, the angles of inclination of the slopes 25 are set at proper levels in correspondence to the directions of crystal axes of the single crystal to be formed.

Figure 6B:
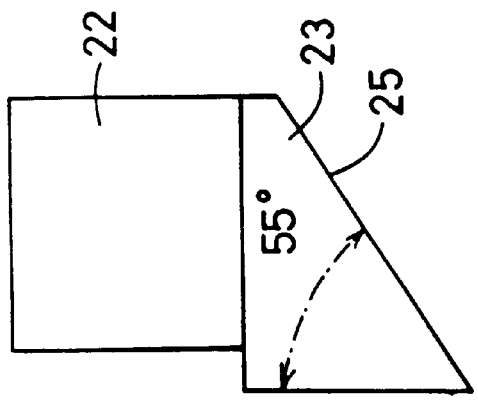
FIGS. 6A, 6B and 6C are a plan view, a side elevational view and a front elevational view showing an example of the reflector which is employed in the method according to the second preferred embodiment of the present invention.
Figure 6A:
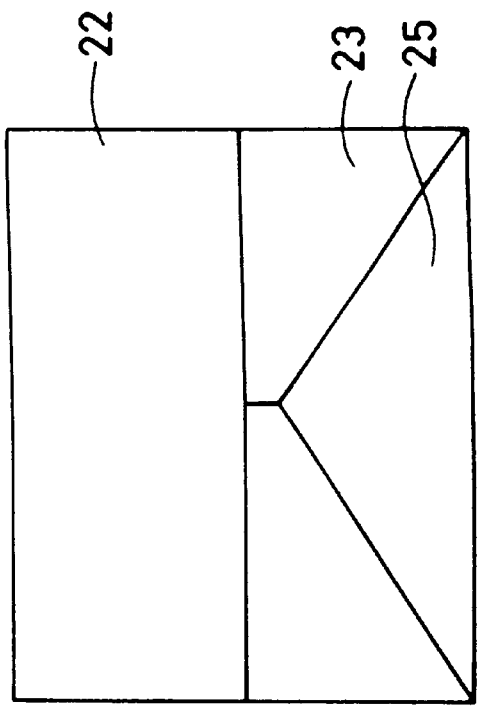
Figure 6C:
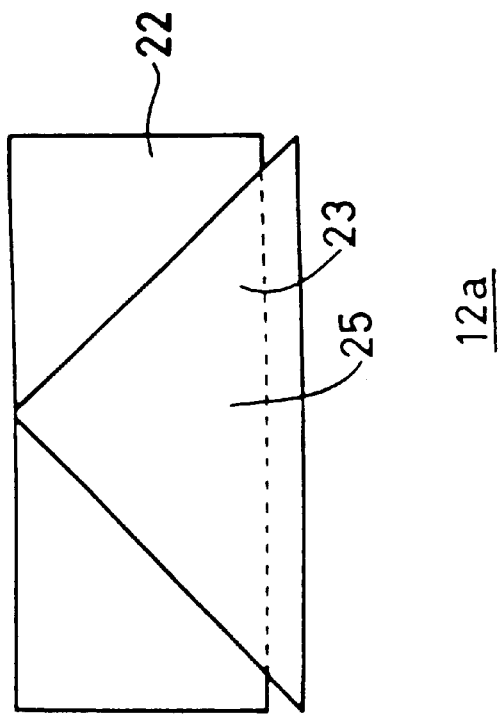

FIGS. 6A, 6B and 6C are a plan view, a side elevational view and a front elevational view of the reflector 12a which is formed by the blocks 22 and the reflecting blocks 23 respectively. As shown in FIG. 6B, the angle of inclination of each slope 25 is set at 55°. The reflector 12a is in a structure not fixing the substrate 11, whereby the substrate 11 can be relatively horizontally moved with respect to the reflector 12a. Therefore, it is possible to form a single-crystalline thin film on the substrate 11 having a large area by horizontally moving the substrate 11 while fixing the reflector 12a on the sample holder 10.

A-2-3. Operation of ECR Ion Generator

Referring again to FIG. 4, the operation of the ECR ion generator 2 is now described. An inert gas such as Ne gas or Ar gas is introduced from the inert gas inlet pipe 7 into the plasma chamber 4, while a microwave is simultaneously introduced from the waveguide 6 into the plasma chamber 4. Further, a dc current is also simultaneously supplied to the magnetic coil 5, to form a dc magnetic field in the plasma chamber 4 and its periphery. The gas as supplied is maintained in a plasma state by actions of the microwave and the dc magnetic field. This plasma is formed by high-energy electrons which are in screw motion in the principle of cyclotron by the microwave and the dc magnetic field.

These electrons, which have diamagnetic properties, are moved to a weaker magnetic field side, to form an electron stream along a line of magnetic force. Consequently, positive ions also form an ion current along the line of magnetic force following the electron stream, in order to maintain electrical neutrality. In other words, the electron stream and the ion current are downwardly directed from the outlet 9 into the reaction chamber 8. The ion current and the electron stream thus flowing in parallel with each other are recombined with each other after a lapse of a deionization time, to form a neutral atom current. Therefore, substantially only a neutral atom current is formed in a position downwardly separated from the outlet 9 beyond a prescribed distance.

FIG. 7 is a graph showing the result of relation between ion current density and the distance from the outlet 9 actually measured when $Ar^+$ ions of 10 eV were discharged from the outlet 9 by the ECR ion generator 2. It is understood from this graph that the ion current density is abruptly reduced at a distance of about 4 to 5 cm from the outlet 9, and attenuated to a level of $1/10$ to $1/12$ at a position of 14 cm. The neutral atom current is increased by such attenuation of the ion current, whereby substantially only a neutral atom current downwardly flows in a position downwardly separated from the outlet 9 by at least 14 cm.

Thus, the ECR ion generator 2 for generating ions forms an ion current in parallel with the electron stream, whereby it is possible to easily obtain a neutral atom current having high density by employing the ECR ion generator 2, with no employment of other means for neutralizing the ion current. Since the ion current is formed in parallel with the electron stream, further, it is possible to obtain an ion current which is close to a parallel current having a regulated direction of progress substantially with no divergence. Since the parallel ion current is converted to the neutral atom current, the atom current is also close to a parallel current having a regulated direction of progress.

A-2-4. Operation of Apparatus 101

Referring again to FIG. 4, the operation of the apparatus 101 is now described. It is assumed that the reflector 12 is implemented by the reflector 12a shown in FIGS. 5 and 6A to 6C and the substrate 11 is prepared from polycrystalline $SiO_2$ (quartz), so that a single-crystalline Si thin film is formed on the quartz substrate 11. A polycrystalline Si thin film is previously formed on the quartz substrate 11 by a well-known method such as CVD.

First, the sample is mounted between the sample holder 10 and the reflector 12a (12). The heater provided in the sample holder 10 holds the sample, i.e., the quartz substrate 11 and the polycrystalline Si thin film, at a temperature similar to that in the first preferred embodiment, i.e., a temperature of 550° C.

An inert gas which is introduced from the inert gas inlet pipe 7 is preferably prepared from Ne gas having a smaller atomic weight than Si atoms. Due to the action of the ECR ion generator 2, an $Ne^+$ ion current and an electron stream are formed downwardly from the outlet 9. The distance between the outlet 9 and the reflector 12a (12) is preferably set at a sufficient level for substantially converting the $Ne^+$ ion current to a neutral Ne atom current. The reflector 12a (12) is set in a position receiving the downwardly directed Ne atom current.

A part of the downwardly directed Ne atom current is reflected by the three slopes 25 which are formed in the reflector 12a, to be applied to the polycrystalline Si thin film provided on the $SiO_2$ substrate 11 through the opening 24. Another part of the Ne atom current is not incident upon the slopes 25 but directly incident upon the polycrystalline Si thin film through the opening 24. In other words, the polycrystalline Si thin film is irradiated with four Ne atom current components, i.e., a component straightly received from the outlet 9 and three components reflected by the three slopes 25. Since the angles of inclination of the slopes 25 are set at 55°, directions of incidence of the four Ne atom current components correspond to four directions which are perpendicular to four independent densest crystal planes of the Si single crystal to be formed, i.e., (111) planes.

The energy of the plasma which is formed by the ECR ion generator 2 is so set that the Ne atoms reaching the $SiO_2$ substrate 11 are at energy levels which are lower than threshold energy (=27 eV) in sputtering of Si by irradiation with Ne atoms. Therefore, the law of Bravais acts on the polycrystalline Si thin film. As the result, the Si atoms in the polycrystalline Si thin film are so rearranged that planes which are perpendicular to the direction of incidence of the Ne atomic current as applied define densest crystal planes. Since the Ne atom current as applied has four components which are incident in directions corresponding to those perpendicular to four independent densest planes of the single-crystalline Si, the Si atoms are so rearranged that all planes perpendicular to the directions of incidence define the densest planes. Namely, the directions of rearrangement of the four independent (111) planes are controlled by four Ne atomic beams having directions of incidence which are independent of each other, whereby the crystal orientation is univocally decided. Thus, a layer in the vicinity of the surface of the polycrystalline Si thin film is converted to a single-crystalline Si layer having a regulated crystal orientation.

The temperature of the polycrystalline Si thin film 82 is adjusted to 550° C, i.e., a level within a range suitable for growing a seed crystal. Therefore, the single-crystalline Si layer which is formed on the surface of the polycrystalline Si thin film 82 serves as a seed crystal, to be grown toward a deep portion of the polycrystalline Si thin film 82. Then, the overall region of the polycrystalline Si thin film 82 is converted to a single-crystalline Si layer. Thus, a single-crystalline Si layer having a regulated crystal orientation is formed on the quartz substrate 11. The aforementioned FIGS. 3A and 3B typically express the aforementioned formation of the single-crystalline Si layer and the process of its growth.

As hereinabove described, the reflector 12 is preferably made of a metal, since $Ne^+$ ions are converted to neutral atoms when an $Ne^+$ ion current which is slightly mixed in the neutral Ne atom current is reflected by the conductive reflector 12, so that the substrate 11 is irradiated with the as-converted neutral Ne atom current. The neutral atom current is advantageously incident upon the substrate 11 as a flow having a regulated direction since its direction of progress hardly diverges dissimilarly to an ion current.

In the process of irradiating the sample with the Ne atomic current, the rotation driving mechanism (not shown) may be driven to rotate the sample holder 10. Thus, it is possible to improve homogeneity in distribution of an amount of irradiation on the polycrystalline Si thin film.

A-2-5. Valid Data

Description is now made on a test verifying formation of a single-crystalline thin film by the method according to the second preferred embodiment. FIG. 8 illustrate experimental data showing electron beam diffraction images of samples comprising polycrystalline $SiO_2$ substrates and single-crystalline Si thin films formed thereon on the basis of the aforementioned method. The sample was obtained by irradiating a substrate with four Ne atom current components using a reflector.

In this sample, three-fold rotation-symmetrical diffraction spots were obtained as shown in FIG. 8. This verifies that the as-obtained sample was formed as single-crystalline Si having regulated crystal axes. Since it was possible to convert a polycrystalline Si thin film having a polycrystalline structure of higher regularity in atomic arrangement than an amorphous structure to a single-crystalline Si thin film, it is conceivably decided possible to convert a thin film having an amorphous structure such as amorphous Si to a single-crystalline thin film, as a matter of course.

A-2-6. Methods of Forming Single-Crystalline Thin Films other than Si Thin Film

While the structure and the operation of the apparatus 101 have been described with reference to formation of a single-crystalline Si thin film, it is also possible to form single-crystalline thin films other than an Si thin film through the apparatus 101.

TABLE 1

Threshold Energy

Incident Ion (*Actually Measured Value)

| Target | He | Ne | Ar | Kr | Xe | Hg | Hg (Actually Measured Value) |
|---|---|---|---|---|---|---|---|
| Al | 127 | 59 | 59 | 77 | 100 | 136 | 120 ~ 140 |
| Si | 60 | 27 | 27 | 35 | 45 | 61 | 60 ~ 70 |
|  |  |  | 25* |  |  |  |  |
| GaAs |  |  | 25* |  |  |  |  |
| Ge | 225 | 66 | 49 | 45 | 48 | 57 | 40 ~ 50 |
| Ta | 1620 | 385 | 233 | 233 | 159 | 147 | 120 ~ 140 |
| W | 1037 | 245 | 147 | 100 | 89 | 87 | 89 ~ 87 |
| Pt | 850 | 198 | 118 | 79 | 69 | 67 | 70 ~ 90 |

Table 1 shows values of sputtering threshold energy in various combinations of types of atoms or ions as applied and elements forming target thin films. In each combination, it is necessary to apply an ion current or an atom current which is at a lower energy level than the as-listed threshold energy. As to thin films formed by compounds, refer to threshold energy levels related to elements having the maximum atomic weights among the elements. The values shown in Table 1 have been obtained on the basis of simulation, unless otherwise stated.

When the thin film as irradiated is formed not by a simple substance such as Si but a compound such as GaAs, for example, it is advisable to apply atoms which are lighter than an element having the maximum atomic weight. Further, beams of a compound such as those of $N_2$ may be applied in place of beams of simple atoms, for example. In this case, an element (for example, N atoms) forming the compound is preferably lighter than the element having the maximum atomic weight forming the thin film as irradiated.

A-2-7. Other Examples of Reflector

Figure 9:
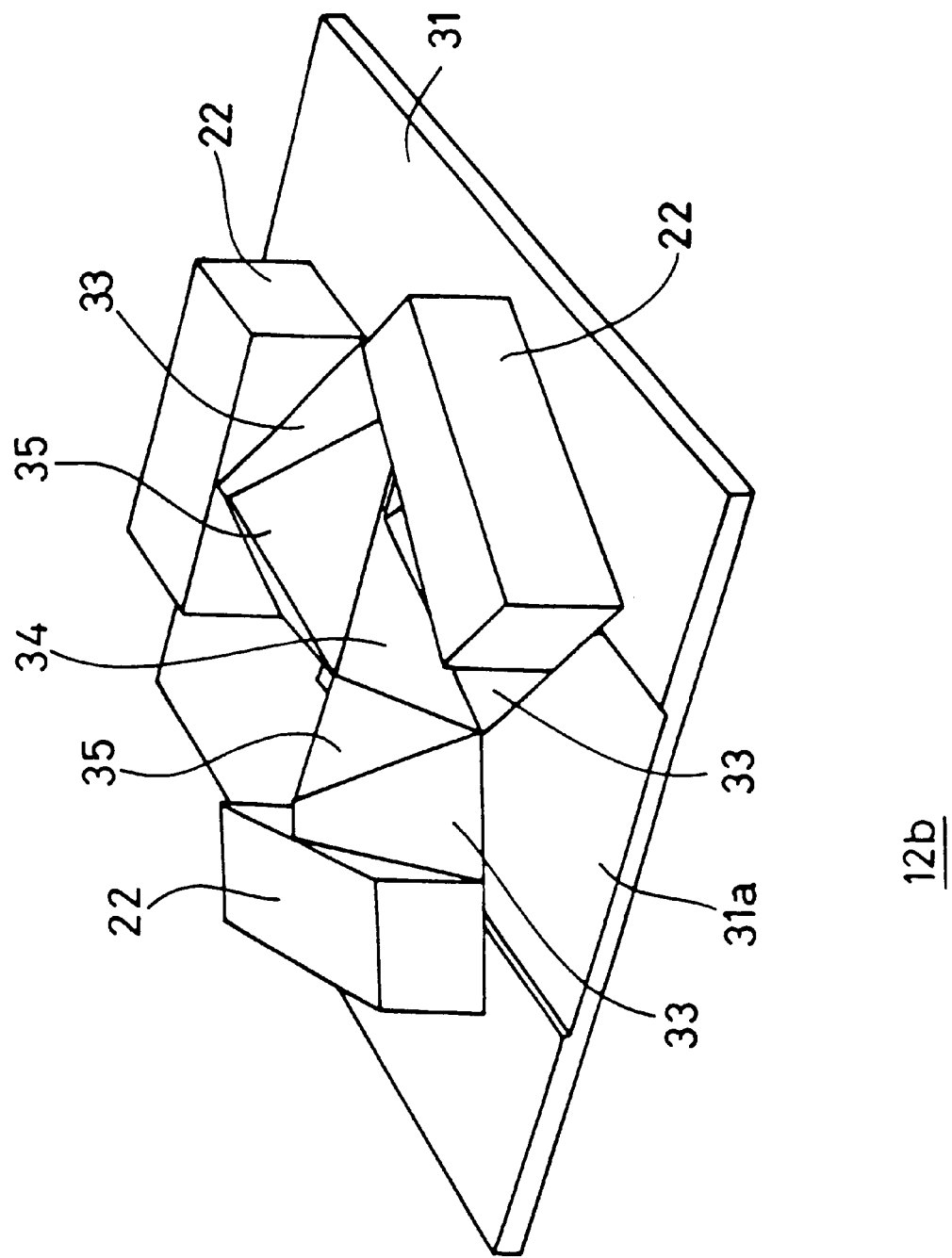
FIG. 9 is a perspective view showing another example of the reflector employed in the method according to the second preferred embodiment of the present invention.
Figure 10A:
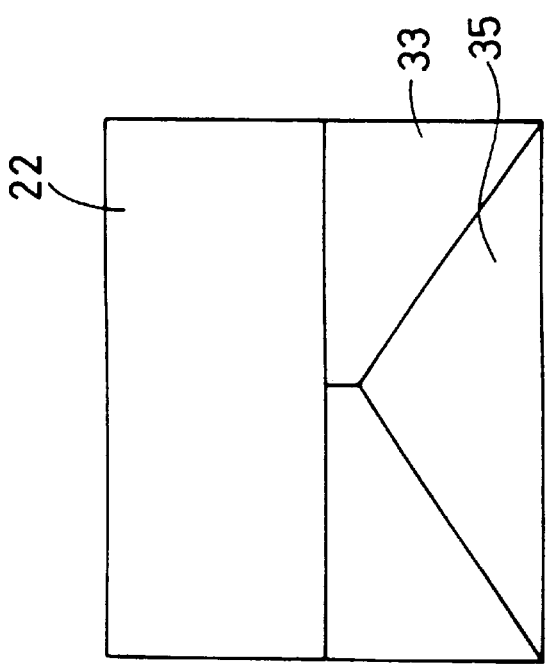
FIGS. 10A, 10B and 10C illustrate three surfaces of still another example of the reflector employed in the method according to the second preferred embodiment of the present invention.
Figure 10B:
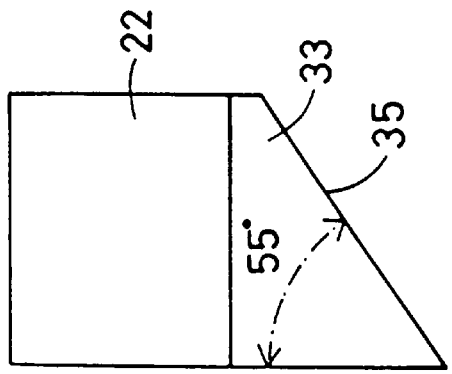
Figure 10C:
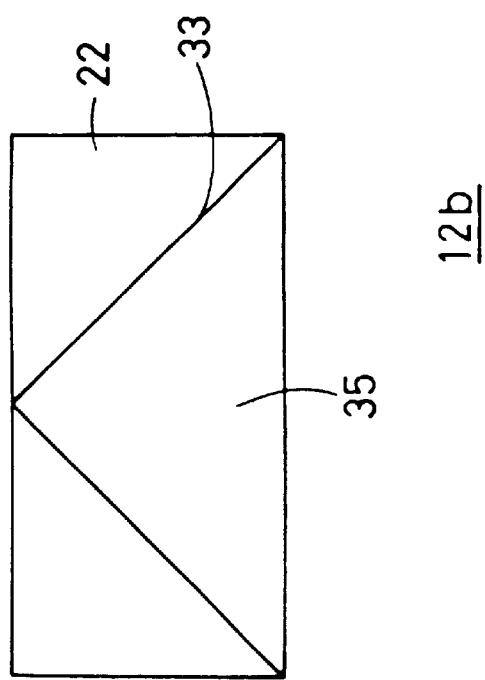

Description is now made on other exemplary structures of the reflector. FIGS. 9 and 10A to 10C illustrate a reflector 12b for forming a single-crystalline thin film having a diamond crystal structure whose (111) planes define densest planes, similarly to the reflector 12a shown in FIG. 5. FIG. 9 is a perspective view of the reflector 12b, and FIGS. 10A to 10C illustrate three surfaces thereof. This reflector 12b is provided with a groove 31a for sliding the substrate 11 on an upper surface of a base 31 which is mounted on the sample holder 10, so that the substrate 11 is built in the base 31. Therefore, the substrate 11 is fixed to the groove 31a when the same is irradiated, dissimilarly to the reflector 12a. Bottom surfaces of reflecting blocks 33 are placed on the upper surface of the base 31, so that the reflecting blocks 33 are located on the substrate 11. As shown in FIG. 10B, the angles of inclination of slopes 35 provided in the reflecting blocks 33 are set at 55°, similarly to those of the reflector 12a.

It is also possible to form a single-crystalline thin film having a crystal structure other than a diamond structure. In this case, still another reflector may be prepared to have a crystal structure which is suitable for the target crystal structure. Further, it is also possible to form a single-crystalline thin film having various crystal orientations in the same crystal structure. In this case, a reflector which is suitable for respective crystal orientations is prepared, as hereinafter described.

Figure 11A:
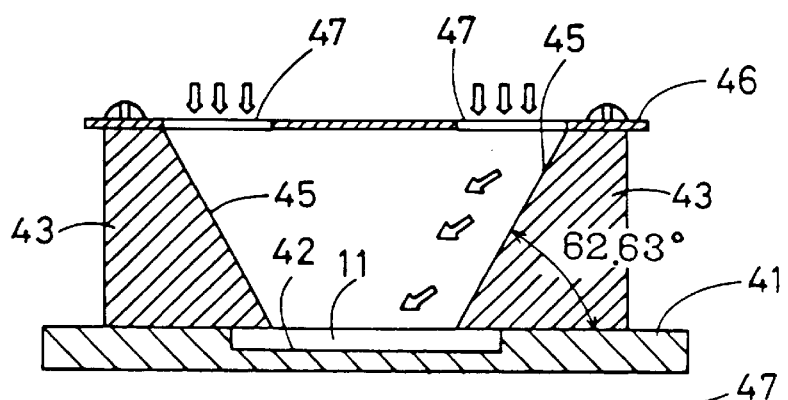
FIGS. 11A and 11B are structural diagrams showing a further example of the reflector employed in the method according to the second preferred embodiment of the present invention.
Figure 11B:
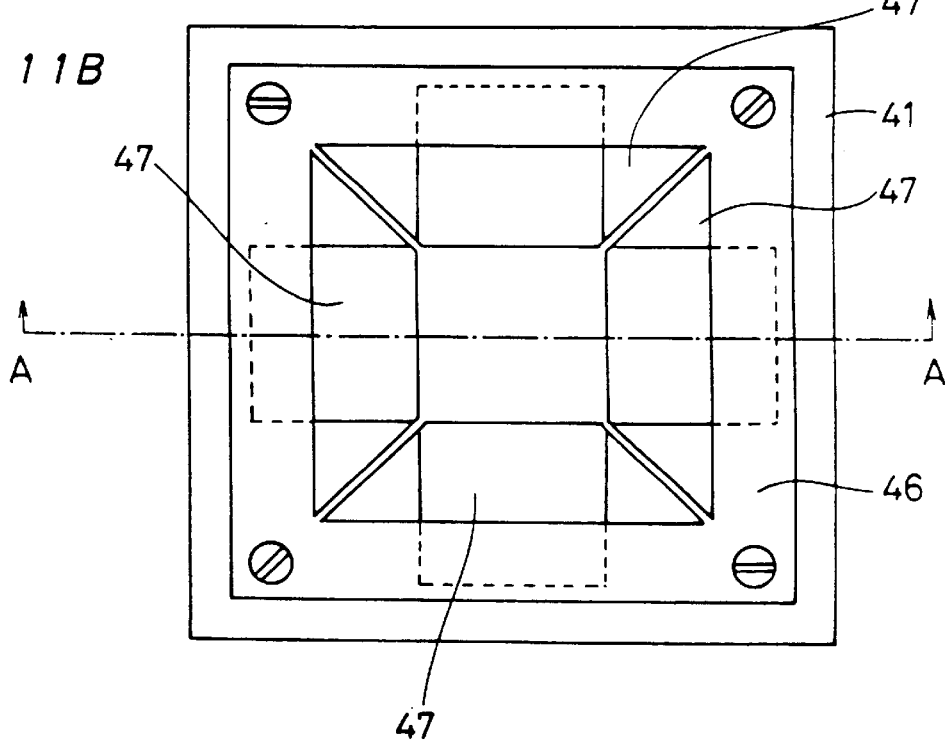

FIGS. 11A and 11B illustrate an exemplary reflector 12c corresponding to a single crystal of a diamond structure, whose (100) planes are parallel to a substrate surface. FIG.

11A is a front sectional view taken along the line A—A in FIG. 11B, which is a plan view showing the reflector 12c. A groove 42 is formed on an upper surface of a flat plate type base 41. The substrate 11 is inserted in this groove 42. Namely, the reflector 12c is adapted to receive the substrate 11, which cannot be relatively horizontally moved with respect to the reflector 12c when the same is irradiated. This base 41 is placed on the sample holder 10.

Four reflecting blocks 43 are arranged on the base 41 around the substrate 11, to be perpendicularly adjacent to each other. A shielding plate 46 having openings 47 only above slopes 45 of the reflecting blocks 43 is set on upper surfaces of the reflecting blocks 43. An atom current or an ion current which is incident upon the shielding plate 46 downwardly from above passes through the openings 47 alone, to be entirely reflected by the slopes 45. Namely, only four components of the atom current or the ion current as reflected are incident upon the substrate 11, with no presence of a component which is directly incident from the above. The angles of inclination of the slopes 45 are set at 62.63°. Therefore, the directions of incidence of the four components match with directions perpendicular to four (111) planes, which are independent of each other, in the crystal of the diamond structure.

Figure 12A:
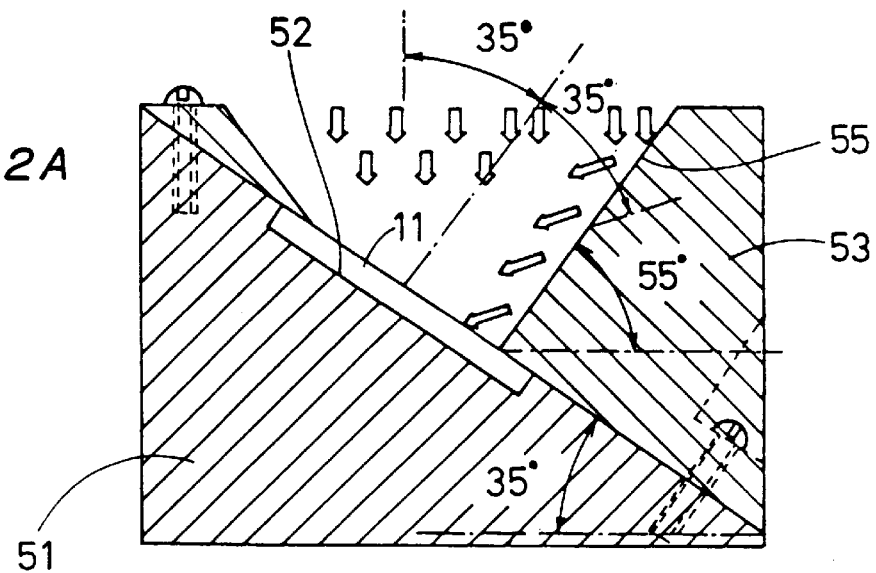
FIGS. 12A and 12B are structural diagrams showing a further example of the reflector employed in the method according to the second preferred embodiment of the present invention.
Figure 12B:
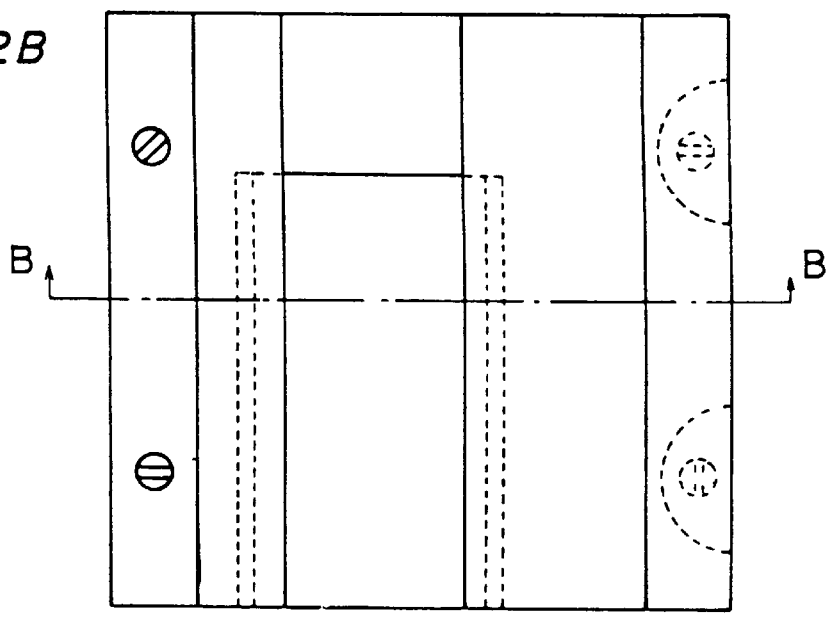

FIGS. 12A and 12B illustrate a reflector 12d corresponding to a single crystal of a diamond structure whose (110) planes are parallel to a substrate surface. FIG. 12A is a front sectional view taken along the line B—B in FIG. 12B, which is a plan view showing the reflector 12d. A groove 52 is formed on an upper surface of a base 51 having an angle of inclination of 35°. The substrate 11 is inserted in this groove 52. Namely, this reflector 12d is adapted to receive the substrate 11, which cannot be relatively horizontally moved with respect to the reflector 12d when the same is irradiated. This base 51 is placed on the sample holder 10.

A single reflecting block 53 is arranged on the base 51. A slope 55 of the reflecting block 53 is set at an angle of inclination of 90° with respect to the upper surface of the base 51. Therefore, an atom current or an ion current which is incident from above is divided into two components including that which is directly incident upon the substrate 11 at an angle of incidence of 35° and that which is reflected by the slope 55 and incident from an opposite side similarly at an angle of incidence of 35°. Directions of incidence of these components match with directions which are perpendicular to two independent planes among four independent (111) planes in the crystal of a diamond structure. Namely, these two components define directions of two densest planes which are independent of each other, whereby it is possible to form a single-crystalline thin film of a diamond structure having a regulated crystal orientation so that the (110) planes are parallel to the substrate surface by employing the reflector 12d.

A-3. Third Preferred Embodiment

A third preferred embodiment of the present invention is now described.

A-3-1. Overall Structure of Apparatus

Figure 13:
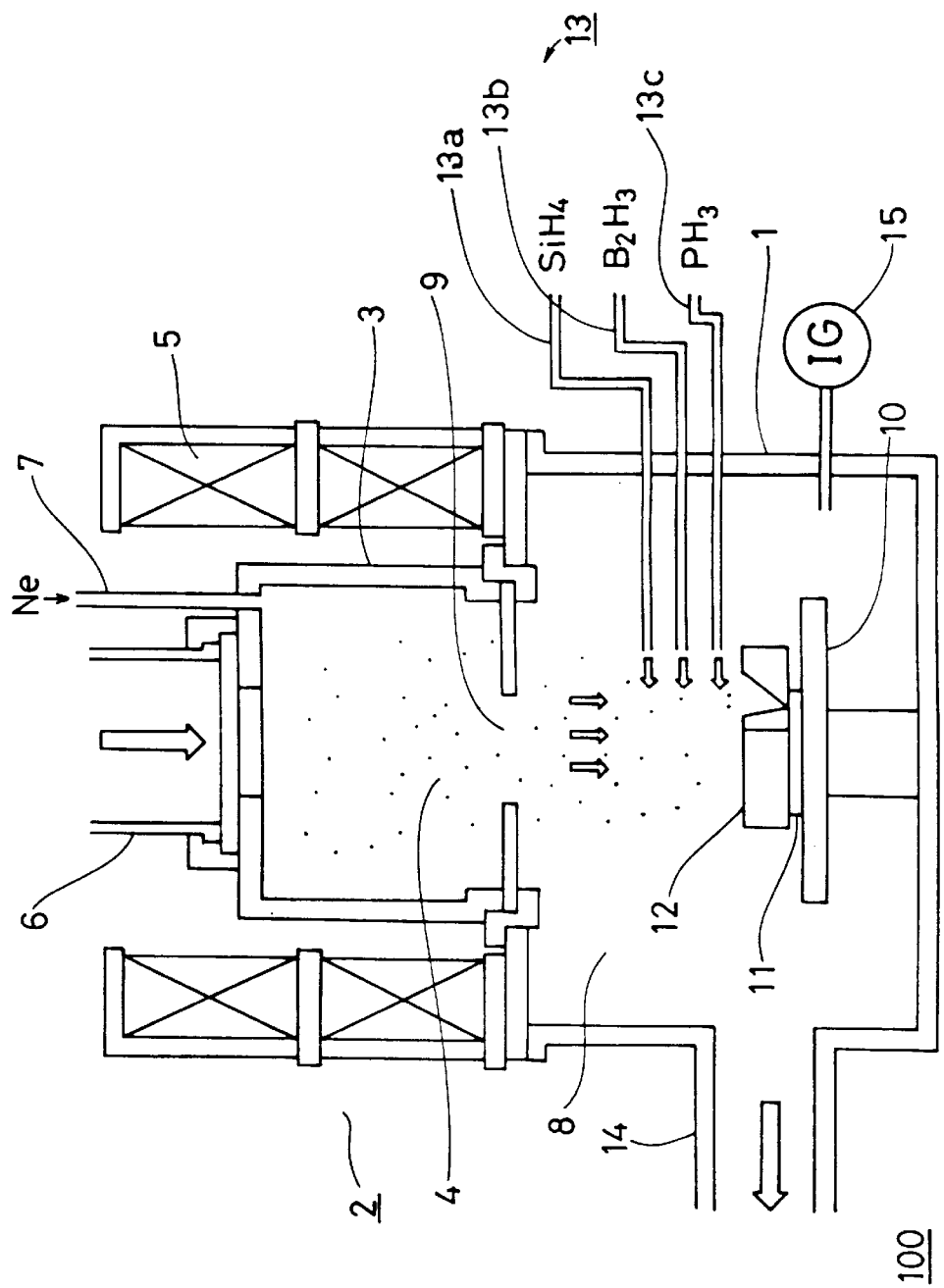
FIG. 13 is a front sectional view showing an apparatus which is suitable for carrying out a method according to a preferred embodiment of the present invention.

FIG. 13 is a front sectional view showing a structure of a single-crystalline thin film forming apparatus 100 for effectively implementing a method of forming a single-crystalline thin film according to a preferred embodiment of the present invention. In FIG. 13, the identical numerals are employed with FIG. 4 to represent the identical components, and therefore, the detailed description of the numerals in FIG. 13 is omitted. Similarly to the apparatus 101, the apparatus 100 comprises a reaction vessel 1, and an electron cyclotron resonance (ECR) ion generator 2 which is built in an upper portion of the reaction vessel 1. In the interior of the reaction chamber 8, a sample holder 10 is arranged on a position immediately under the outlet 9. In this apparatus 101, the sample holder 10 is not required to comprise a heater. A substrate 11 is placed on the sample holder 10, while a reflector 12 is placed to be located above the substrate 11. The substrate 11, which is a flat plate of a material having a polycrystalline structure or an amorphous structure, is one of elements forming a sample. A desired single-crystalline thin film is formed on this substrate 11. The reflector 12a (FIG. 5, FIGS. 6A to 6C), 12b (FIG. 9, FIGS. 10A and 10B), 12c (FIGS. 11A and 11B) or 12b (FIGS. 12A and 12B) can be adopted as the reflector 12.

The reaction chamber 8 communicates with reaction gas supply pipes 13. Reaction gases are supplied through the reaction gas supply pipes 13, for forming a thin film of a prescribed material on the substrate 11 by plasma CVD. The preferred embodiment shown in FIG. 1 is provided with three reaction gas supply pipes 13a, 13b and 13c. Similarly to the apparatus 101, an end of the evacuation pipe 14 is coupled with a vacuum unit (not shown) to evacuate the reaction chamber 8 through the evacuation pipe 14, thereby maintaining the reaction chamber 8 at a prescribed degree of vacuum.

A-3-2. Operation of Apparatus 100

The operation of the apparatus 100 is now described. It is assumed that the reflector 12 is implemented by the reflector 12a shown in FIGS. 5 and 6A to 6C and the substrate 11 is prepared from polycrystalline $SiO_2$ (quartz), so that a thin film of single-crystalline Si is formed on the quartz substrate 11. The reaction gas supply tubes 13a, 13b and 13c supply $SiH_4$ (silane) gas for supplying Si, which is a main material for the single-crystalline Si, and $B_2H_3$ (diborane) gas and $PH_3$ (phosphine) gas for doping the substrate 11 with p-type and n-type impurities respectively. An inert gas which is introduced from the inert gas inlet pipe 7 is preferably prepared from Ne gas having a smaller atomic weight than Si atoms.

Due to the action of the ECR ion generator 2, an $Ne^+$ ion current and an electron stream are formed downwardly from the outlet 9. The distance between the outlet 9 and the reflector 12a (12) is preferably set at a sufficient level for substantially converting the $Ne^+$ ion current to a neutral Ne atom current. The reflector 12a (12) is set in a position receiving the downwardly directed Ne atom current. The silane gas which is supplied from the reaction gas supply tube 13a is dashed against the $SiO_2$ substrate 11 by the $Ne^+$ ion current or the Ne atom current. Consequently, a plasma CVD reaction progresses on the upper surface of the $SiO_2$ substrate 11, to grow a thin film formed by Si which is supplied by the silane gas, i.e., an Si thin film. On the other hand, the diborane gas or the phosphine gas is supplied with a properly adjusted flow rate, whereby a plasma CVD reaction caused by this gas also progresses to form the Si thin film containing B (boron) or P (phosphorus) in desired density.

The $SiO_2$ substrate 11 is not heated and hence maintained substantially at an ordinary temperature, whereby the Si thin film is grown substantially under the ordinary temperature. In other words, the Si thin film is formed at a temperature not more than a level facilitating crystallization by plasma CVD. Thus, the Si thin film is first formed as an amorphous Si film by plasma CVD.

A part of the downwardly directed Ne atom current is reflected by the three slopes 25 which are formed in the reflector 12a, to be incident upon the upper surface of the $SiO_2$ substrate 11 through the opening 24. Another part of the Ne atom current is not incident upon the slopes 25 but directly incident upon the upper surface of the $SiO_2$ substrate 11 through the opening 24. In other words, the Si thin film being formed on the upper surface of the $SiO_2$ substrate 11 is irradiated with four Ne atom current components, i.e., a component straightly received from the outlet 9 and three components reflected by the three slopes 25. Since the angles of inclination of the slopes 25 are set at 55°, directions of incidence of the four Ne atom current components correspond to four directions which are perpendicular to four independent densest crystal planes of the Si single crystal to be formed, i.e., (111) planes.

The energy of the plasma which is formed by the ECR ion generator 2 is so set that the Ne atoms reaching the $SiO_2$ substrate 11 are at energy levels causing no sputtering in the as-formed Si thin film, i.e., levels lower than the threshold energy level in sputtering of Si by irradiation with Ne atoms (=27 eV). Therefore, the law of Bravais acts on the as-grown amorphous Si thin film. Namely, the Si atoms in the amorphous Si are rearranged so that planes which are perpendicular to the Ne atom current components applied to the amorphous Si define densest crystal planes. Since the Ne atom current as applied has four components which are incident in directions corresponding to those perpendicular to the densest planes of the single-crystalline Si having a single crystal orientation, the Si atoms are so rearranged that all planes perpendicular to the directions of incidence of the respective components define the densest planes. The directions of the (111) planes are controlled by the plurality of components of the Ne atom current having directions of incidence which are independent of each other, whereby single-crystalline Si having a single crystal orientation is formed by such rearrangement of the Si atoms. In other words, the amorphous Si thin film being grown by plasma CVD is sequentially converted to a single-crystalline Si thin film having a regulated crystal orientation.

The diborane gas or the phosphine gas is supplied by the reaction gas supply pipe 13b or 13c simultaneously with the silane gas, thereby forming a p-type or n-type single-crystalline Si thin film containing B or P. It is also possible to form an equiaxed n-type single-crystalline Si layer on a p-type single-crystalline Si layer, for example, by alternating these reaction gases containing impurity elements.

As hereinabove described, the $SiO_2$ substrate 11 is not heated and the Si thin film is formed under a temperature which is lower than that facilitating crystallization by plasma CVD. This is because the crystal orientation is arbitrarily directed regardless of the directions of the Ne atom current components and cannot be controlled while a polycrystal is inevitably formed under a high temperature facilitating crystallization of Si by plasma CVD alone with no application of the Ne atom current components.

As described in the first preferred embodiment, Ne which is lighter than Si atoms is preferably selected as an element forming the atom current which is applied to the Si thin film. As described in the second preferred embodiment, the reflector 12 is preferably made of a metal.

In the apparatus 100, conversion to a single crystal sequentially progresses at the same time in the process of growth of the Si thin film by plasma CVD. Thus, it is possible to form a single-crystalline Si thin film having a large thickness under a low temperature. Since a single-crystalline thin film can be formed under a low temperature, it is possible to further form a new single-crystalline thin film on a substrate which is already provided with a prescribed device without changing properties of the device, for example.

Thus, it is possible to form a single-crystalline thin film not only on a substrate which serves only as a support member for a thin film but on a substrate of a device having a prescribed structure and functions in this apparatus 100.

An experimental test was performed in order to verify the formation of a single-crystalline thin film by the aforementioned method. A similar electron beam diffraction image to that shown in FIG. 8 was observed for a sample comprising polycrystalline $SiO_2$ substrates and single-crystalline Si thin films formed thereon.

This verifies that the sample obtained by use of the reflector 12 was formed as single-crystalline Si having regulated crystal axes. Since it was possible to form a single-crystalline Si thin film on an $SiO_2$ substrate of a polycrystalline structure having higher regularity than an amorphous structure in atomic arrangement, it is conceivably decided possible to form a single-crystalline thin film on a substrate having an amorphous structure, such as an amorphous Si substrate, as a matter of course.

A-3-3. Preferred Methods of Forming Single-Crystalline Thin Films other than Si Thin Film While the structure and the operation of the apparatus 100 have been described with reference to formation of a single-crystalline thin film, it is also possible to form single-crystalline thin films other than an Si thin film through the apparatus 100. Tables 2 to 5 show conditions for forming semiconductor single-crystalline thin films having relatively high demands, including the Si thin film as already described, for example. Table 2 shows types of inert gases and reaction gases as supplied.

Tables 3 to 5 show reaction gas flow rates, inert gas flow rates and other process control conditions in formation of respective semiconductor single-crystalline thin films.

TABLE 2

Gas Material for Crystal Forming Step

| for GaAs | |
|---|---|
| Ion Beam: | Ar, Ne |
| Element: | $Ga(CH_3)_3$ |
| | $AsH_3$ |
| Impurity: | $Zn(CH_3)_3$, $Zn(C_2H_5)_3$ (p-type) |
| | $SiH_4$ (n-type) |
| for GaN | |
| Ion Beam: | Ar, Ne, $NH_3$ |
| Element: | $Ga(CH_3)_3$ |
| | $NH_3$ |
| Impurity: | $Zn(CH_3)_3$, $Zn(C_2H_5)_3$ (p-type) |
| | $SiH_4$ (n-type) |
| for Si | |
| Ion Beam: | Ne |
| Element: | $SiH_4$ |
| | $Si_2H_6$ |
| Impurity: | $B_2H_3$ (p-type) |
| | $AsH_3$ (n-type) |
| $PH_3$ (n-type) | |

TABLE 3

Process Control Condition for Forming Si

| Gas Flow Rate | |
|---|---|
| $SiH_4$ or $Si_2H_6$ | 5 sccm ($1 \times 10^{-5} \sim 4 \times 10^{-5}$ mol/min) |
| $AsH_3$ | 5 sccm ($5 \times 10^{-7}$ mol/min) for n-type |
| (Diluted to 10% with Ne) | Crystal |
| $B_2H_6$ | 5 sccm ($5 \times 10^{-7}$ mol/min) for p-type |

TABLE 3-continued

Process Control Condition for Forming Si

| | |
|---|---|
| (Diluted to 10% with Ne) | Crystal |
| Ne (for ECR Chamber) | 25 sccm ($1 \times 10^{-3}$ mol/min) |
| Substrate Temperature (SiO$_2$ Substrate) | Room Temperature |
| Degree of Vacuum | |
| Back Pressure | $\sim 10^{-7}$ Torr |
| Operating Pressure | $1 \times 10^{-4} \sim 4 \times 10^{-4}$ Torr |
| Microwave Power (2.34 GHz) | 300 W |
| Growth Rate | 2 $\mu$/hr |

TABLE 4

Process Control Condition for Forming GaN

Gas Flow rate

| | |
|---|---|
| TMG (Trimethyl Gallium) | Bubbler employed. Held at $-12°$ C. $\sim 10°$ C. |
| Carrier Gas N$_2$ | 5 sccm ($1 \times 10^{-5} \sim 4 \times 10^{-5}$ mol/min) |
| NH$_3$ | 10 sccm ($4 \times 10^{-4}$ mol/min) |
| DMZ (Dimethyl Zinc) | for Forming p-type Crystal |
| Carrier Gas N$_2$ | 5 sccm ($1 \times 10^{-5} \sim 2.4 \times 10^{-5}$ mol/min) |
| SiH$_4$ | for Forming n-type Crystal |
| (Diluted to 10% with Ne) | 5 sccm ($1 \times 10^{-5} \sim 2.4 \times 10^{-5}$ mol/min) |
| Ne (For ECR Chamber) | 15 ccm ($7 \times 10^{-4}$ mol/min) |
| Substrate Temperature (Si Substrate) | 370° C. |
| Degree of Vacuum | |
| Back Pressure | $\sim 10^{-7}$ Torr |
| Operating Pressure | $1 \times 10^{-4} \sim 4 \times 10^{-4}$ Torr |
| Microwave Power (2.34 GHz) | 300 W |
| Growth Rate | $0.1 \sim 0.3$ $\mu$/hr |

TABLE 5

Process Control Condition for Forming GaAs

Gas Flow rate

| | |
|---|---|
| TMG (Trimethyl Gallium) | Bubbler employed. Held at $-12°$ C. $\sim 10°$ C. |
| Carrier Gas Ar | 5 sccm ($1 \times 10^{-5} \sim 4 \times 10^{-5}$ mol/min) |
| AsH$_3$ (Diluted to 10% with Ar) | 10 sccm ($4 \times 10^{-4}$ mol/min) |
| DMZ (Dimethyl Zinc) | for Forming p-type Crystal |
| Carrier Gas Ar | 5 sccm ($1 \times 10^{-5} \sim 2.4 \times 10^{-5}$ mol/min) |
| H$_2$Te | for Forming n-type Crystal |
| (Diluted to 10% with Ar) | 5 sccm ($1 \times 10^{-5} \sim 2.4 \times 10^{-5}$ mol/min) |
| Ar (For ECR Chamber) | 15 ccm ($7 \times 10^{-4}$ mol/min) |
| Substrate Temperature (Si Substrate) | 500° C. |
| Degree of Vacuum | |
| Back Pressure | $\sim 10^{-7}$ Torr |
| Operating Pressure | $1 \times 10^{-4} \sim 4 \times 10^{-4}$ Torr |
| Microwave Power (2.34 GHz) | 300 W |
| Growth Rate | $0.1 \sim 0.3$ $\mu$/hr |

Thus, in each of the apparatuses 100 and 101, it is possible to form not only the aforementioned Si single-crystalline thin film but various types of single-crystalline thin films on substrates such as compound single-crystalline thin films of GaAs, GaN and the like and a single-crystalline thin film of an insulator such as SiO$_2$, for example.

A-4. Modifications of First to Third Preferred Embodiments (1) In the first or second preferred embodiment, in order to form single-crystalline thin film of GaN, for example, a polycrystalline GaN film may be first grown on an Si substrate by general CVD. Thereafter, by use of the apparatus 101, for example, N$_2$ (nitrogen) gas or NH$_3$ (ammonia) gas containing N atoms may be introduced into the inert gas inlet pipe 7, to irradiate the GaN thin film with a molecular flow of the gas or a dissociated N atom current. N atoms which may remain in the interior of GaN are assembled into the single crystal as an element forming GaN, and hence there is no possibility of exerting a bad influence on properties of GaN.

(2) In the first or second preferred embodiment, in order to form a GaAs single-crystalline thin film, a GaAs polycrystalline thin film may be first grown on an Si substrate by general molecular beam epitaxy, so that conditions identical to those for forming an Si single-crystalline thin film are employed except that the substrate temperature is maintained at 500° C., the gas as applied is prepared from low-priced Ar gas and the reflector is prepared from a Ta plate. It was possible to obtain a GaAs single-crystalline thin film by this method.

(3) In the third preferred embodiment, in order to form single-crystalline thin film of GaN, for example, N$_2$ (nitrogen) gas or NH$_3$ (ammonia) gas containing N atoms may be introduced into the inert gas inlet pipe 7 of the apparatus 100, to irradiate the GaN thin film with a molecular flow of the gas or a dissociated N atom current. Nitrogen which may remain in the interior of GaN is assembled into the single crystal as an element forming GaN, and hence there is no possibility of exerting a bad influence on properties of GaN.

(4) In place of the reflector 12, ECR ion generators 2 may be provided in a number corresponding to that of components of an atom current which is applied to the thin film, to directly apply the atom current from the ECR ion generators 2 to the thin film. As compared with this method, however, the method shown in FIG. 4 or FIG. 13 employing a single ECR ion generator 2 and a single reflector 12 is superior since the apparatus can be simplified in structure and it is possible to maintain a high degree of vacuum in the reaction chamber 8.

In the apparatus 100, further, the ECR ion generator 2 also serves as an energy source which is required for providing energy to the reaction gas for carrying out plasma CVD. Namely, the method shown in FIG. 13 employing a single ECR ion generator 2 and a single reflector 12 has a specific advantage such that the same can be carried out by simply adding the reflector 12 to a structure which is originally necessary for carrying out plasma CVD.

(5) The ECR ion generator 2 may be replaced by another ion source such as a Cage type or Kaufmann type one. In this case, however, flow of the as-formed ion current is inclined to be diffused by repulsion caused by static electricity between ions, leading to reduction of directivity. Therefore, it is desirable to provide means for neutralizing ions and converting the same to an atom current or means for improving the directivity such as a collimator in a path of the ion current. When an electrical insulating substrate is employed as the substrate 11, in particular, it is desirable to provide the means for neutralizing ions in order to prevent the progress of irradiation from being disabled due to storage of charges in the substrate 11. Alternatively, the reflector 12 may be made of a conductive material such as a metal, to simultaneously carry out reflection of the ion current and conversion to a neutral atom current.

In the aforementioned method employing the ECR ion generator 2, on the other hand, a neutral atom current can be easily obtained in a form close to a parallel current with no employment of means for neutralizing the ion current. Therefore, the thin film can be easily irradiated with an atom current having high incidence angle accuracy. Since a neutral atom current is mainly incident upon the thin film, further, the substrate 11 can be prepared from an insulating substrate such as an $SiO_2$ substrate.

A-5. Fourth Preferred Embodiment

Next, an apparatus according to a fourth preferred embodiment of the present invention is described.

Figure 14:
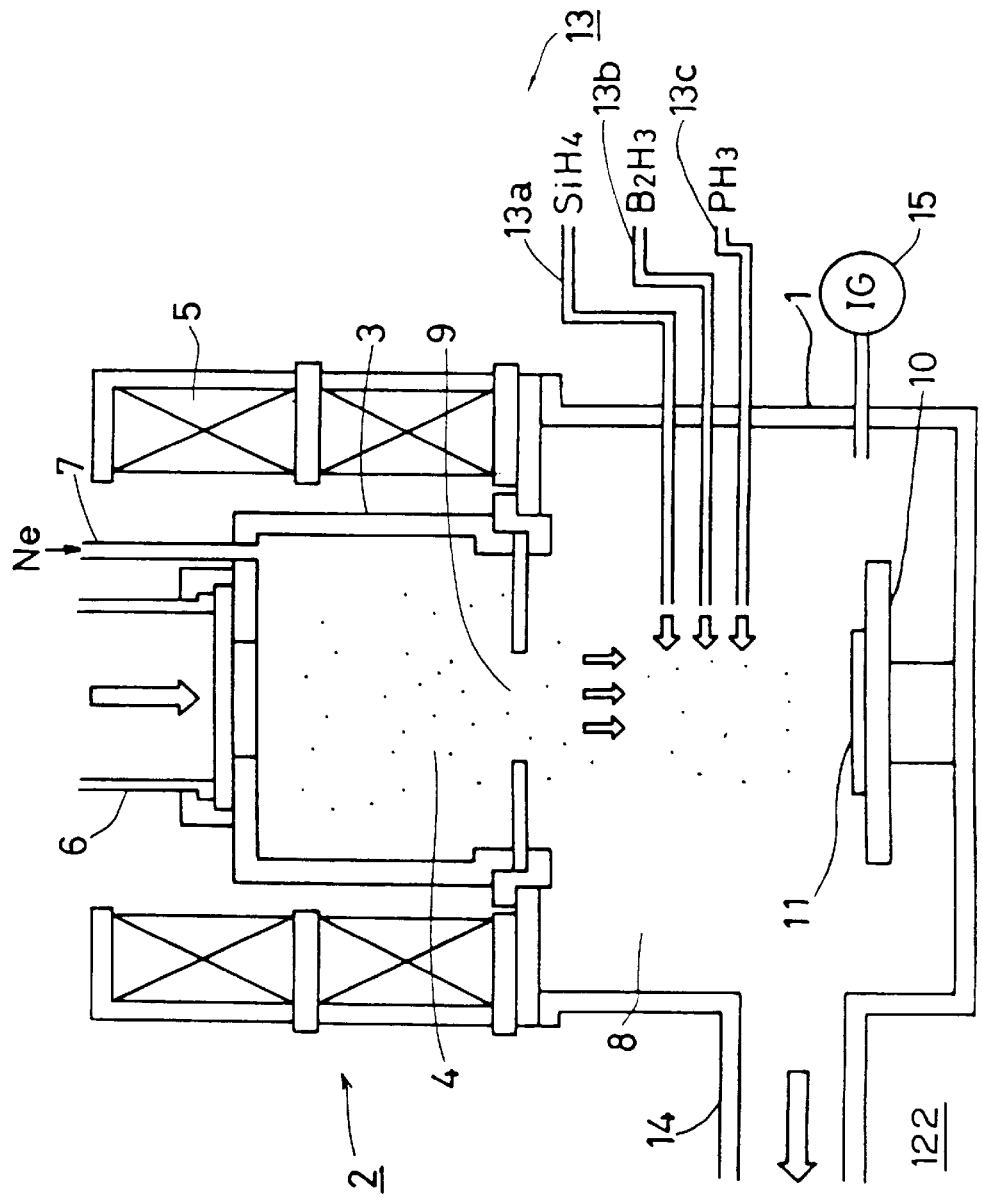
FIG. 14 is a front sectional view showing an apparatus according to a fourth preferred embodiment of the present invention.

FIG. 14 is a front sectional view showing the overall structure of an axially oriented polycrystalline thin film forming apparatus 122 according to the fourth preferred embodiment. This apparatus 122 is adapted to grow a thin film of a prescribed material on a substrate and to simultaneously convert the thin film to a uniaxially oriented polycrystalline thin film, thereby forming an axially oriented polycrystalline thin film on the substrate. This apparatus 122 is characteristically different from the apparatus 100 shown in FIG. 13 in that a reflector 12 is not provided therein.

Referring to FIG. 14, the operation of the apparatus 122 is now described. It is assumed that the substrate 11 is prepared from polycrystalline $SiO_2$ (quartz), so that a thin film of single-crystalline Si is formed on the quartz substrate 11. The reaction gas supply tubes 13a, 13b and 13c supply $SiH_4$ (silane) gas for supplying Si, which is a main material for the single-crystalline Si, and $B_2H_3$ (diborane) gas and $PH_3$ (phosphine) gas for doping the substrate 11 with p-type and n-type impurities respectively. The inert gas introduced from the inert gas inlet pipe 7 is preferably prepared from Ne gas, which has smaller atomic weight than Si atoms and is inert gas.

Due to the action of the ECR ion generator 2, an $Ne^+$ ion current and an electron current are formed downwardly from the outlet 9. The distance between the outlet 9 and the substrate 11 is preferably set at a value which is sufficient for converting most part of the $Ne^+$ ion current to a neutral Ne atom current. The silane gas which is supplied from the reaction gas supply tube 13a is dashed against the substrate 11 by the $Ne^+$ ion current or the Ne atom current. Consequently, a plasma CVD reaction progresses on the upper surface of the substrate 11, to grow a thin film formed by Si which is supplied by the silane gas, i.e., an Si thin film. On the other hand, the diborane gas or the phosphine gas is supplied with a properly adjusted flow rate, whereby a plasma CVD reaction caused by this gas also progresses to form the Si thin film containing B (boron) or P (phosphorus) in desired density.

The substrate 11 is not heated and hence maintained substantially at an ordinary temperature. Therefore, the Si thin film is grown substantially under the ordinary temperature. In other words, the Si thin film is formed at a temperature not more than a level facilitating crystallization by plasma CVD. Thus, the Si thin film is first formed as an amorphous Si film by plasma CVD.

The aforementioned downwardly directed Ne atom current is perpendicularly incident upon the upper surface of the substrate 11. Namely, the Si thin film being formed on the upper surface of the substrate 11 is irradiated with the Ne atom current which is linearly discharged from the outlet 9.

The energy of the plasma which is formed by the ECR ion source 2 is so set that the energy of Ne atoms reaching the substrate 11 is at a value causing no sputtering in the Si thin film, i.e., lower than the threshold energy (=27 eV) in sputtering of Si by irradiation with Ne atoms. Therefore, the so-called law of Bravais acts on the amorphous Si thin film as being grown. Namely, the Si atoms in the amorphous Si are rearranged so that a plane which is perpendicular to the direction of incidence of the Ne atom current applied to the amorphous Si defines the densest crystal plane, i.e., the (111) plane.

In other words, the amorphous Si thin film being grown by plasma CVD is sequentially converted to a polycrystalline Si thin film in which directions of crystal axes perpendicular to a single densest plane are regulated in a direction perpendicular to the surface of the substrate 11, i.e., an uniaxially oriented polycrystalline crystalline Si thin film. Consequently, a polycrystalline Si thin film is formed on the substrate 11, so that a (111) plane is exposed on the surface of any crystal grain forming this polycrystalline structure.

The diborane gas or the phosphine gas is supplied by the reaction gas supply pipe 13b or 13c simultaneously with the silane gas, thereby forming a p-type or n-type uniaxially oriented polycrystalline Si thin film containing B or P.

In the apparatus 122, portions which may be irradiated with the Ne atom current or the Ne ion current before neutralization, such as the inner wall of the reaction vessel 1 and the upper surface of the sample holder 10, for example, are made of materials causing no sputtering by the irradiation. In other words, the same are made of materials having higher threshold energy values than the energy of the Ne ion current. Therefore, no sputtering is caused in these members by irradiation with the Ne atom current or the Ne ion current, whereby the thin film is prevented from contamination with material elements forming these members. Further, these members are prevented from damage caused by sputtering.

Since the energy of the Ne ion current is set to be lower than the threshold energy in the Si thin film to be formed, the reaction vessel 1, the sample holder 10 and the like may be made of materials, such as Ta, W, Pt and the like shown in Table 2, for example, having threshold energy values which are higher than that of the Si thin film in Ne irradiation. Alternatively, the surfaces of these members, such as the inner wall of the reaction vessel 1 and the surface of the sample holder 10, for example, may be coated with materials such as Ta having high threshold energy, to obtain a similar effect.

While the structure and the operation of the apparatus 122 have been described with reference to formation of an Si thin film, it is also possible to form an axially oriented polycrystalline thin film of a material other than Si. For example, it is also possible to form a GaAs thin film. In this case, reaction gases supplied from the reaction gas supply pipes 13a, 13b and 13c are prepared from reaction gases containing $Ga(CH_3)_3$ etc., which are suitable for formation of GaAs. While GaAs is a compound consisting of two elements, an element for forming the ion current or the atom current as applied may be prepared from an element such as Ne or Ar, for example, which is lighter than As having larger atomic weight in these two elements. The irradiation energy is similarly set to be lower than the threshold energy which is related to As having large atomic weight.

When the thin film to be formed is made of a plurality of elements, the element forming the ion current or the atom current as applied may be prepared from that which is lighter than that having the maximum atomic weight among the plurality of elements, in general. The irradiation energy is similarly set to be lower than threshold energy which is related to the element having the maximum atomic weight. In this case, the surface of the member such as the sample holder 10 which is irradiated with the ion current or the atom current in the apparatus 122 may be made of a material having higher threshold energy than the material for the thin film.

Alternatively, the surface may be made of the same material as the thin film. When the apparatus 122 is structured as that for forming an axially oriented polycrystalline thin film of Si, for example, the surface of the sample holder 10 etc. may be coated with Si. In this case, no contamination of the Si thin film is caused by a different element even if sputtering is caused in the sample holder 10 or the like.

Further, the surface of the member such as the sample holder 10 which is irradiated with the ion current or the atom current may be made of a material containing an element which is heavier than that forming the ion current or the atom current as applied. In this case, the element forming the ion current or the atom current hardly penetrates into the member following application of the ion current or the atom current. Thus, deterioration of the member caused by penetration of a different element is suppressed.

In the apparatus 122, conversion to a uniaxially oriented polycrystalline film sequentially progresses simultaneously with growth of the Si thin film by plasma CVD. Thus, it is possible to form an axially oriented polycrystalline Si thin film having a large film thickness under a low temperature. Since the axially oriented polycrystalline thin film can be formed under a low temperature, it is possible to form a uniaxially oriented crystalline thin film on a substrate which is already integrated with a prescribed device, for example, without changing characteristics of this device.

In the above description, the substrate 11 is horizontally placed on the sample holder 10, whereby the atom current is perpendicularly incident upon the substrate 11. When an axially oriented polycrystalline thin film of Si, for example, is formed on the substrate 11, therefore, the surface of the thin film is defined by a (111) plane. However, it is also possible to form an axially oriented polycrystalline thin film of Si in which (111) planes are uniformly oriented in a desired direction which is inclined with respect to the surface of the thin film, by placing the substrate 11 on the sample holder 10 in an inclined manner.

The sample holder 10 may be coupled to a rotary mechanism or the like, to be capable of horizontally rotating the substrate 11. Alternatively, the sample holder 10 may be coupled to a horizontal moving mechanism or the like, to be capable of horizontally moving the substrate 11. Thus, it is possible to uniformly form a uniaxially oriented thin film on the substrate 11.

A-1-4. Valid Data

Figure 15:
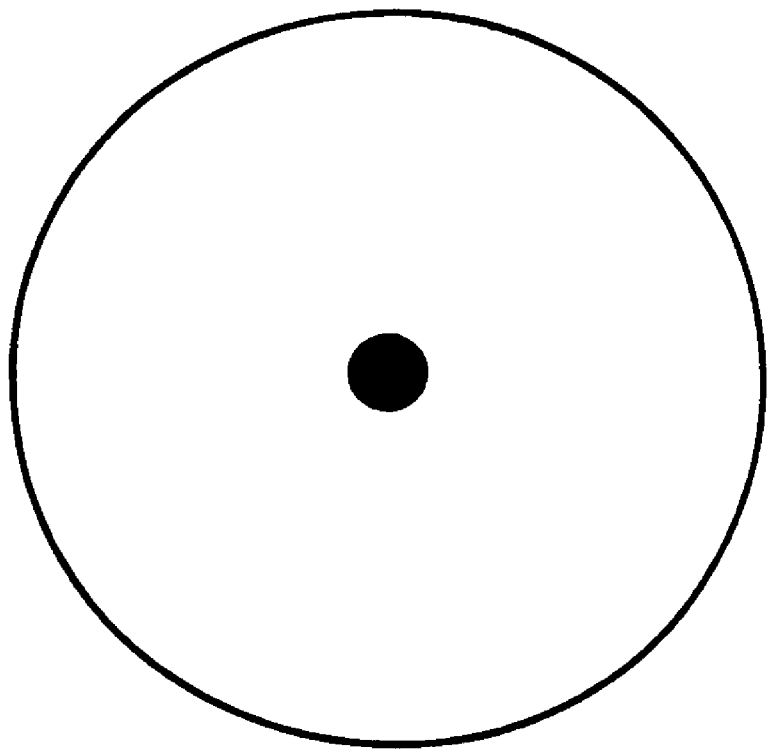
FIG. 15 illustrates a result of a verification test in the apparatus according to the fourth preferred embodiment of the present invention.

Description is now made on a test verifying formation of an axially oriented polycrystalline thin film by the aforementioned method. FIG. 15 illustrates experimental data showing an electron beam diffraction image of a sample comprising an axially oriented polycrystalline Si thin film formed on a polycrystalline quartz substrate 11 on the basis of the aforementioned method. In this verification test, the surface of the substrate 11 was perpendicularly irradiated with an Ne atom current.

As shown in FIG. 15, a diffraction spot appears on a single point, and is continuously distributed along a circumference around the same. Namely, the result of the experiment indicates that a single (111) plane of the Si thin film as formed is oriented to be perpendicular to the direction of incidence of the atom current, while orientation around the direction of incidence is arbitrary and not regulated in one direction. Namely, it is verified that this sample is formed as polycrystalline Si in which only a single crystal axis is regulated, i.e., as axially oriented polycrystalline Si.

Since it was possible to form an axially oriented polycrystalline Si thin film on the quartz substrate 11 having a polycrystalline structure which is higher in regularity in atom arrangement than an amorphous structure, it can be decided possible to form an axially oriented polycrystalline thin film on a substrate having an amorphous structure of amorphous Si or the like, as a matter of course. It can also be decided possible to form an axially oriented polycrystalline thin film on a substrate having a single-crystalline structure which is equivalent to a structure obtained by enlarging polycrystal grains, similarly to the above.

A-6. Fifth Preferred Embodiment

A fifth preferred embodiment of the present invention is now described.

A-6-1. Overall Structure of Apparatus

Figure 16:
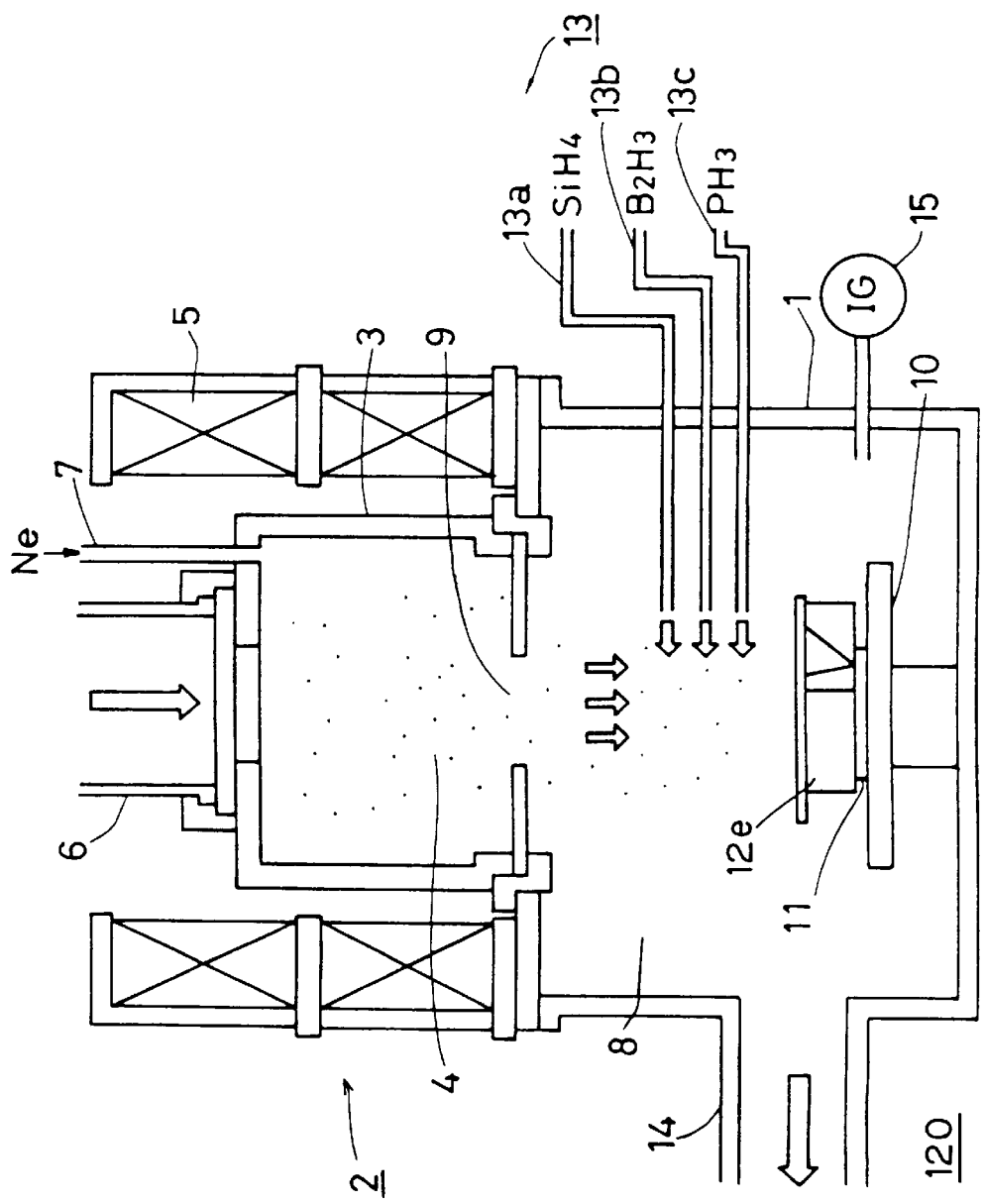
FIG. 16 is a front sectional view showing an apparatus according to a fifth preferred embodiment of the present invention.

FIG. 16 is a front sectional view showing the overall structure of an apparatus 120 according to the fifth preferred embodiment. This apparatus 120 is, similarly to the apparatus 100 shown in FIG. 13, an apparatus for forming a single-crystalline thin film which is adapted to grow a thin film of a prescribed material on a substrate and to simultaneously convert the thin film to a single-crystalline thin film, thereby forming a single-crystalline thin film on the substrate. This apparatus 120 is characteristically different from the apparatus 100 shown in FIG. 13 in structure of the reflector 12. Furthermore, each part of the apparatus 103 is composed of specific materials, as described later.

The reflector 12e is adapted to reflect an atom current which is supplied from an ECR ion source 2, thereby irradiating a substrate 11 with the atom current from a plurality of directions. Therefore, the reflector 12e is set to be located immediately under an outlet 9 above the substrate 11.

A-6-2. Structure and Function of Reflector

Figure 17:
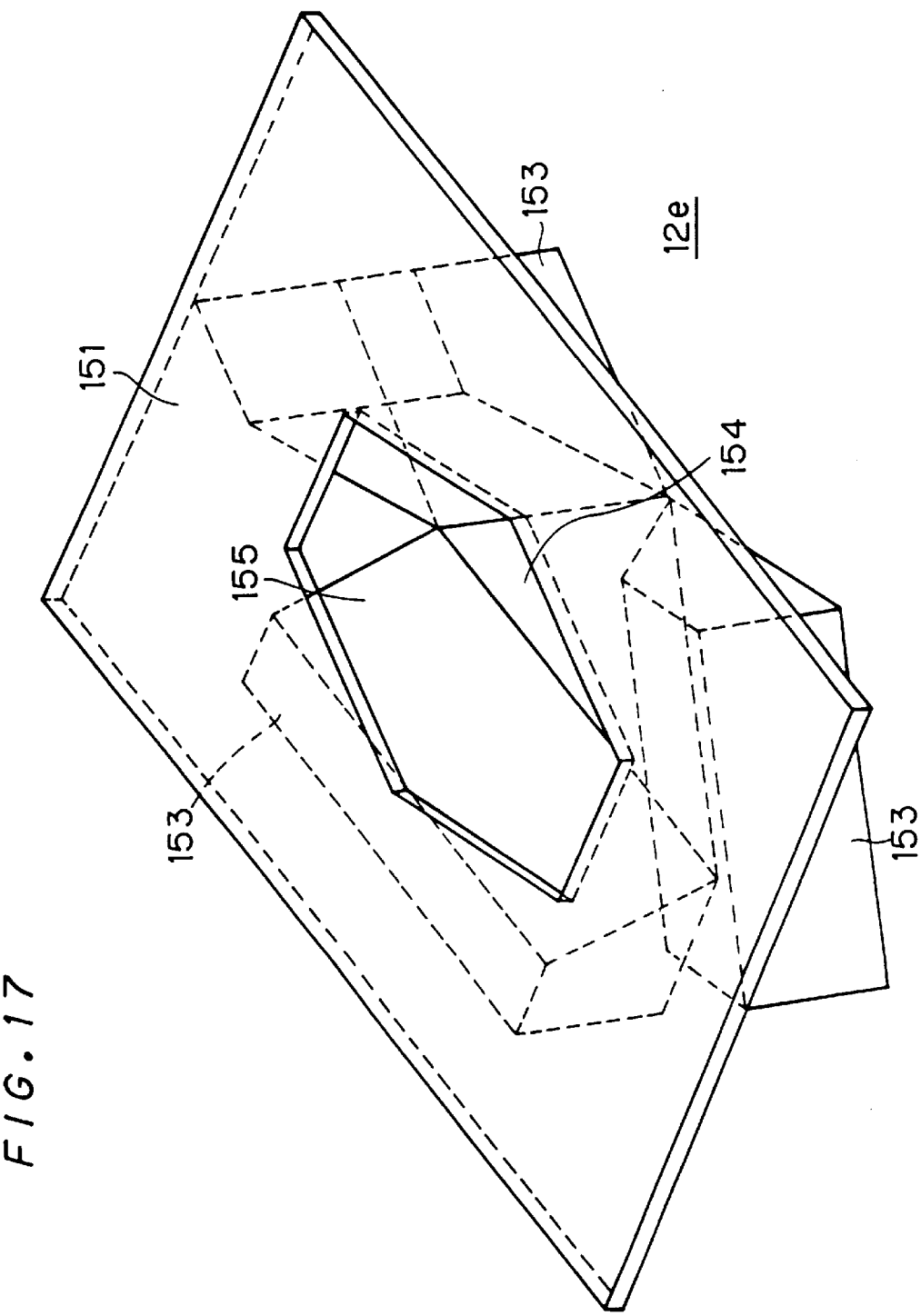
FIG. 17 is a perspective view showing a reflector in the fifth preferred embodiment.
Figure 18:
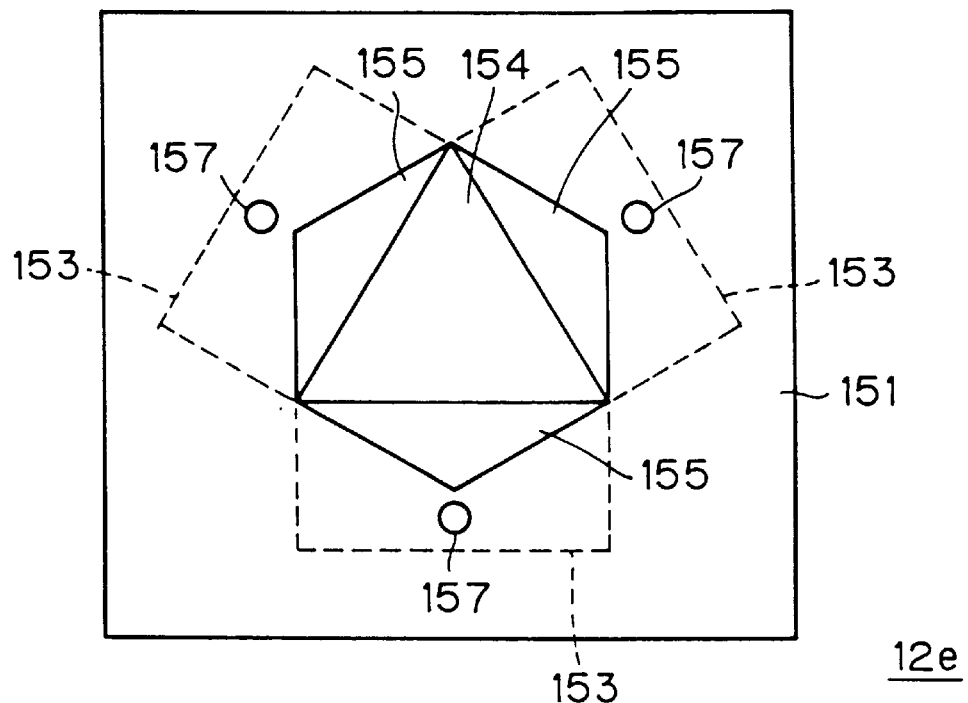
FIG. 18 is a plan view of the reflector shown in FIG. 17.
Figure 19:
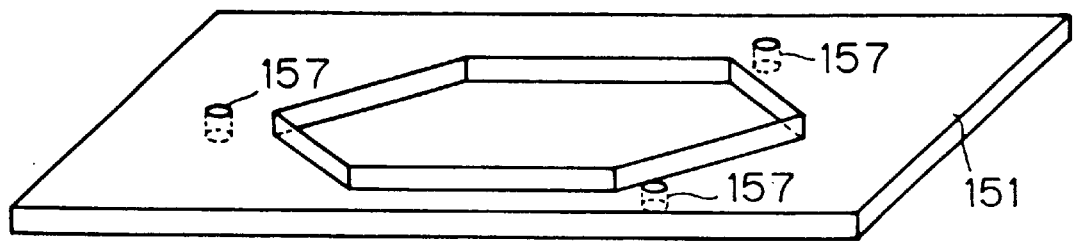
FIG. 19 is an exploded perspective view of the reflector shown in FIG. 17.
Figure 20:
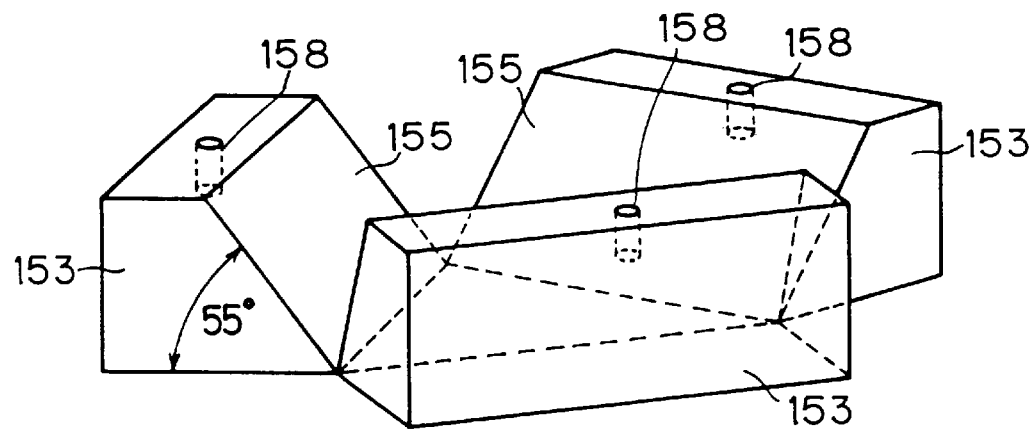
FIG. 20 is an exploded perspective view of the reflector shown in FIG. 17.

FIG. 17 is a perspective view showing a preferable example of the reflector 12e. FIG. 18 is a plan view of the reflector 12e shown in FIG. 17, and FIGS. 19 and 20 are exploded views. With reference to these figures, the example of the reflector 12e is now described.

This reflector 12e is an exemplary reflector for forming a single crystal such as single-crystalline Si, having a diamond structure. The reflector 12e defines an equilateral hexagonal opening in a central portion of a flat plate type screen plate 151. Three reflecting blocks 153 are fixedly provided on a lower surface of the screen plate 151, to enclose the opening. These reflecting blocks 153 are fastened to the screen plate 151 by screws passing through holes 157 to be fitted with screw holes 158. Consequently, an equilateral triangular opening 154 which is trimmed with these reflecting blocks 153 is defined immediately under the opening of the screen plate 151.

The atom current which is applied from above is selectively screened by the screen plate 151, to pass only through the equilateral hexagonal opening. In the reflecting blocks 153, slopes 154 facing the opening 154 serve as reflecting surfaces for reflecting the gas beam. As shown in FIG. 18 in a plan view, the three slopes 155 are selectively exposed on the equilateral hexagonal opening of the screen plate 151 respectively. Therefore, the atom current which is applied from above is divided into four components in total including a first component passing through the opening 154 to be directly perpendicularly incident upon the substrate 11 and second to fourth components reflected by the three slopes 155 respectively to be incident upon the substrate 11 from oblique directions.

As shown in FIG. 18, each of the three corners of the equilateral triangular opening 154 coincides with every other corner of the equilateral hexagonal opening, as viewed from above. In other words, the three slopes 155 are selectively exposed on three isosceles triangles having adjacent pairs of sides of the equilateral hexagonal opening as isosceles sides. This prevents multiple reflection by the plurality of slopes 155, while enabling uniform irradiation of the substrate 11 with the respective atom current components. This is now described with reference to FIGS. 21 and 22.

Figure 21:
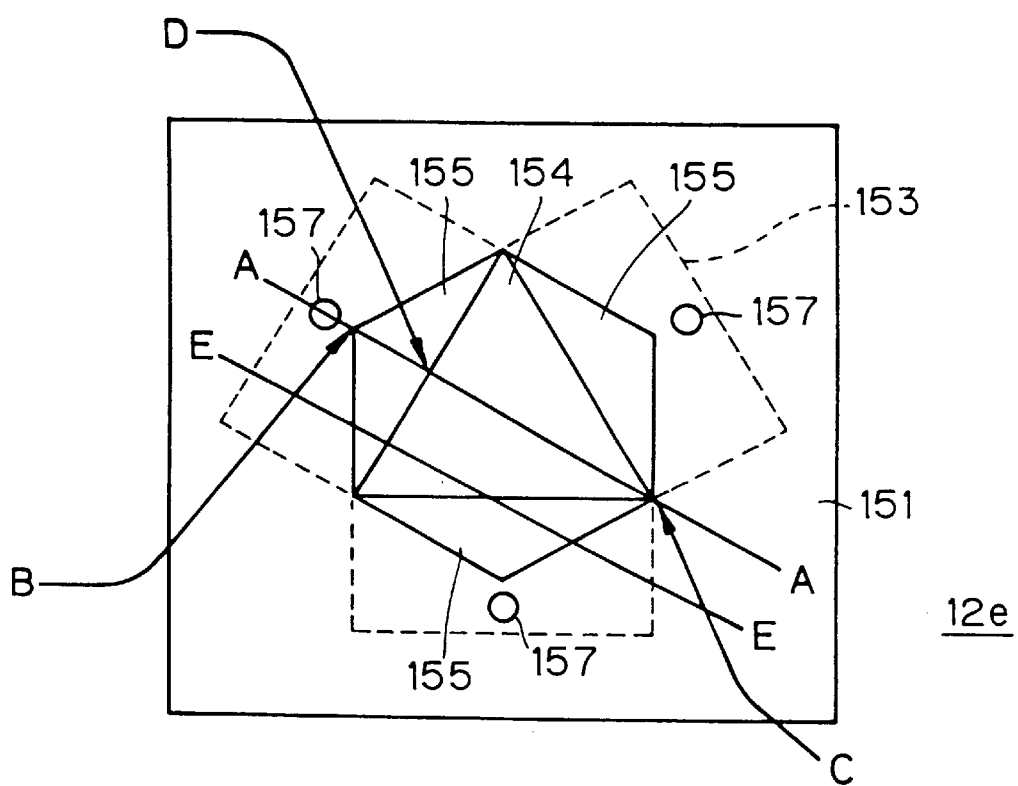
FIG. 21 is a plan view of the reflector shown in FIG. 17.
Figure 22:
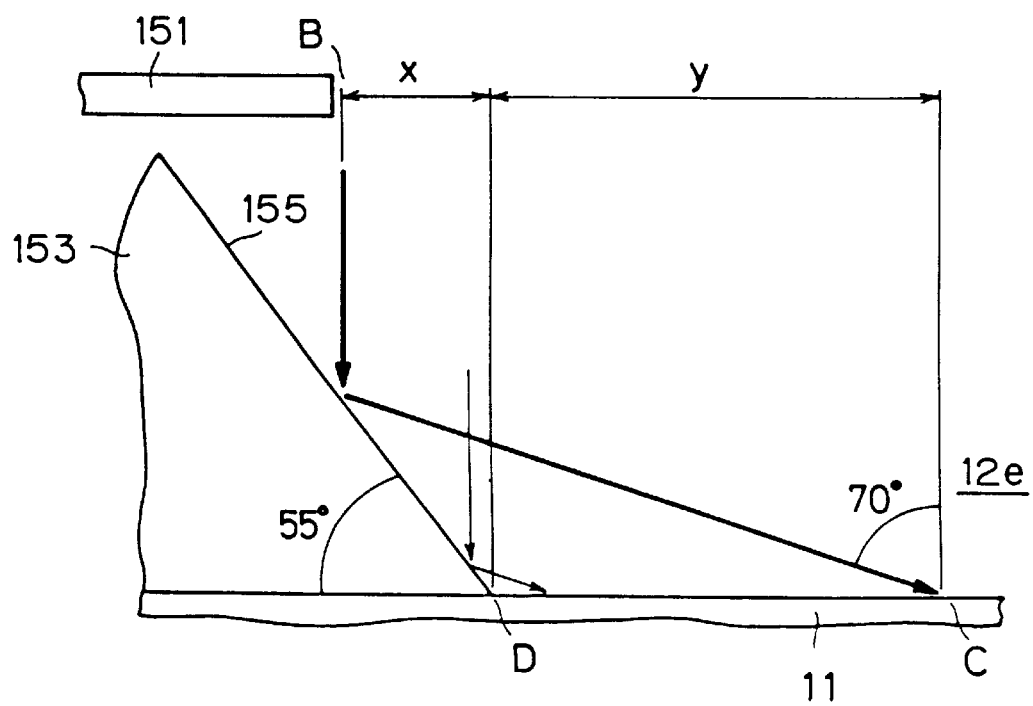
FIG. 22 is a sectional view taken along the line A—A in FIG. 21.

FIG. 21 is a plan view of the reflector 12e, which is similar to FIG. 18. FIG. 22 is a sectional view taken along the line A—A in FIG. 21. As shown in FIGS. 21 and 22, an atom current which is incident upon a position (B in the figures) on one slope 155 corresponding to the apex of the equilateral triangle is reflected and then incident upon an opposite apex (C in the figures) of the equilateral triangular opening 154. Assuming that D represents an intersection between one side of the opening 154 and the line A—A, an atom current which is applied across the points B and D on the slope 155 is uniformly distributed across the points D and C of the opening 154.

This also applies to an atom current which is applied onto an arbitrary line E—E deviating in parallel with the line A—A. Namely, the atom current which is discharged from the outlet 9 is selectively supplied onto the slopes 155 by the screen plate 151, whereby as-reflected atom currents of three components are uniformly incident upon a region of the substrate 11 which is located immediately under the opening 154.

Each atom current which is supplied to one slope 155 through the equilateral hexagonal opening is entirely incident upon the opening 154, and is not incident upon the adjacent slope 155. Thus, no components multiplexly reflected by the plurality of slopes 155 are incident upon the substrate 11.

The angle of inclination of each slope 155 is set at 55°, for example, as shown in FIG. 22. The atom current which is reflected by each slope 155 is incident upon the substrate 11 which is located immediately under the opening 154 at an angle of incidence of 70°. Namely, the first component is perpendicularly incident upon the substrate 11, while the second to fourth components are incident upon the same at angles of incidence of 70° in directions which are three-fold symmetrical about the direction of incidence of the first component. At this time, the directions of incidence of the first to fourth components correspond to four directions which are perpendicular to four (111) planes, being densest planes of the Si single crystal.

A-6-3. Operation of Apparatus

Referring again to FIG. 16, the operation of the apparatus 120 is now described. It is assumed that the reflector 12e is prepared from that shown in FIGS. 17 to 20, and the substrate 11 is prepared from polycrystalline $SiO_2$ (quartz), so that a thin film of single-crystalline Si is formed on the quartz substrate 11. It is also assumed that the slopes 155 in the reflector 12e are set at 55°.

Reaction gas supply pipes 13a, 13b and 13c supply $SiH_4$ (silane) gas for supplying Si, which is a main material for the single-crystalline Si, and $B_2H_3$ (diborane) gas and $PH_3$ (phosphine) gas for doping the substrate 11 with p-type and n-type impurities respectively. Inert gas which is introduced from an inert gas inlet pipe 7 is preferably prepared from Ne gas, which has smaller atomic weight than Si atoms.

Due to the action of an ECR ion generator 2, an $Ne^+$ ion current and an electron current are formed downwardly from the outlet 9. The distance between the outlet 9 and the reflector 12e is preferably set at a value sufficient for converting most of the $Ne^+$ ion current to a neutral Ne atom current.

Thus, a plasma CVD reaction progresses on the upper surface of the substrate 11 similarly to the apparatus 122 shown in FIG. 13, to grow an amorphous Si thin film. On the other hand, the diborane gas or the phosphine gas is supplied with a properly adjusted flow rate, whereby a plasma CVD reaction caused by this gas also progresses to form the Si thin film containing B (boron) or P (phosphorus) in desired density.

At the same time, the amorphous Si thin film which is being formed on the substrate 11 is irradiated with the four components of the Ne atom current, by the action of the reflector 12e. As hereinabove described, directions of incidence of these four components correspond to directions which are perpendicular to four (111) planes of an Si single crystal. Similarly to the apparatus 122, further, the energy of plasma which is formed by the ECR ion source 2 is so set that the energy of Ne atoms reaching the substrate 11 is at a value causing no sputtering in the Si thin film, i.e., lower than the threshold energy (=27 eV) in sputtering of Si by irradiation with Ne atoms. Therefore, the amorphous Si thin film being grown by plasma CVD is sequentially converted to a single-crystalline Si thin film having a regulated crystal orientation, similarly to the apparatus 100. Consequently, a single-crystalline Si thin film having a regulated crystal orientation is finally formed on the substrate 11. This single-crystalline Si thin film has a (111) plane on its surface.

In the apparatus 120, due to employment of the reflector 12e, no multiple reflection of the atom current is caused by the plurality of slopes 155. Thus, the substrate 11 is irradiated with no atom current from a direction other than the prescribed four directions. Further, the reflector 12e implements uniform irradiation of the substrate 11 with the atom current, whereby the substrate 11 is uniformly irradiated with the atom current from the prescribed four directions. Thus, the single-crystalline Si thin film is uniformly formed on the substrate 11.

In the apparatus 120, portions which may be irradiated with the Ne atom current or an Ne ion current before neutralization, such as the reflector 12e, the inner wall of the reaction vessel 1 and the sample holder 10, for example, are made of materials causing no sputtering by the irradiation, i.e., materials having higher threshold energy values than the energy of the Ne ion current, such as Ta, W, Pt or the like shown in Table 2, for example. Therefore, no sputtering is caused in these members by irradiation with the Ne atom current or the Ne ion current, whereby the thin film is prevented from contamination with material elements forming these members.

Alternatively, surfaces of the members irradiated with the Ne atom current such as the upper surface of the screen plate 151 and the slopes 155 may be coated with materials such as Ta having high threshold energy, to attain a similar effect.

While the structure and the operation of the apparatus 120 have been described with reference to formation of an Si thin film, it is also possible to form an axially oriented polycrystalline thin film of a material other than Si. For example, it is also possible to form a GaAs thin film. It is possible to form a single-crystalline thin film of an arbitrary material having a desired crystal structure and a desired crystal orientation by properly changing the structure of the reflector 12e such as the angles of inclination and the number of the slopes 155. The surface of the reflector 12e etc. is made of a material having higher threshold energy than that of the thin film.

Alternatively, the surface of the reflector 12e etc. may be made of the same material as that for the thin film. When the apparatus 120 is structured as an apparatus for forming a single-crystalline thin film of Si, for example, the surface of the reflector 12e etc. may be coated with Si. In this case, no contamination of the Si thin film is caused by a different element even if sputtering is caused in the reflector 12e or the like.

Further, the surface of the reflector 12e etc. may be made of a material containing an element which is heavier than that forming the ion current or the atom current as applied. Thus, the element forming the ion current or the atom current hardly penetrates into the members following irradiation with the ion current or the atom current. Thus, these members are inhibited from deterioration caused by penetration of the different element.

A-7. Sixth Preferred Embodiment

An apparatus according to a sixth preferred embodiment of the present invention is now described. FIG. 13 is a front sectional view showing the overall structure of the apparatus 121 according to this preferred embodiment. This apparatus 121 is, similarly to the apparatus 101 shown in FIG. 4, a single-crystalline thin film forming apparatus, which is adapted to previously form a thin film of a prescribed material having an amorphous or polycrystalline structure on a substrate and to thereafter convert the thin film to a single-crystalline thin film, thereby forming a single-crystalline thin film on the substrate.

This apparatus 121 is characteristically different from the apparatus 101 in structure of the reflector 12e. Furthermore, each part of the apparatus 121 is composed of specific materials, as described later. A sample holder 10, which comprises a heater (not shown), can heat a substrate 11 to hold the same at a proper high temperature.

Figure 23:
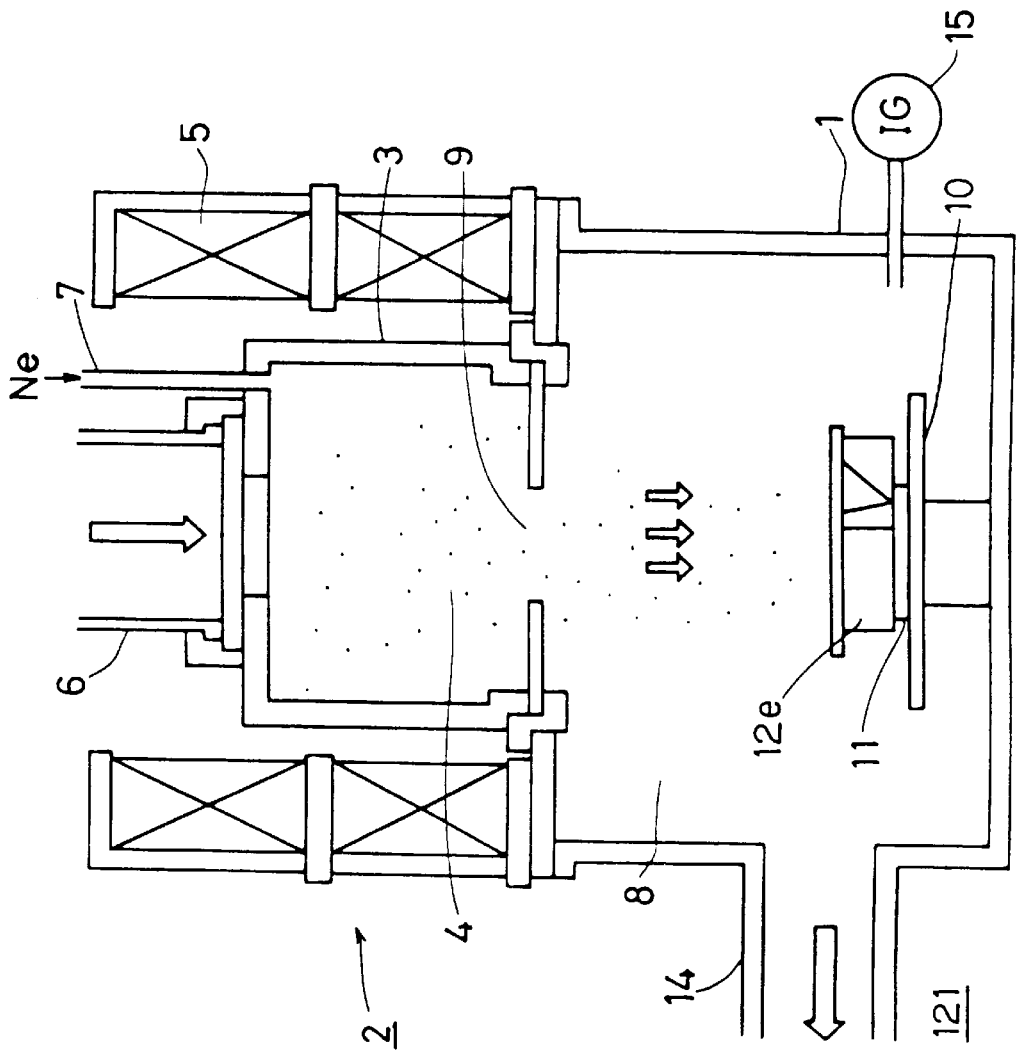
FIG. 23 is a perspective view showing an apparatus according to a sixth preferred embodiment of the present invention.

Referring to FIG. 23, the basic operation of the apparatus 121 is now described. It is assumed that a reflector 12e is implemented by that shown in FIGS. 17 to 20 and the substrate 11 is prepared from a polycrystalline quartz substrate, so that a single-crystalline Si thin film is formed on the quartz substrate 11. It is also assumed that a polycrystalline Si thin film is previously formed on the quartz substrate 11 by a well-known method such as CVD (chemical vapor deposition).

First, the substrate 11 is mounted between the sample holder 10 and the reflector 12e. The heater provided in the sample holder 10 holds the substrate 11 at a temperature of 550° C. Since this temperature is lower than the crystallization temperature of silicon, single-crystalline Si once formed will not return to polycrystalline Si under this temperature. At the same time, this temperature is so high that polycrystalline Si can be grown into single-crystalline Si from a nuclear of a seed crystal.

For the same reason as that described in relation to the fourth preferred embodiment, an Ne atom current is selected as an atom current to be applied to the substrate 11, and energy of Ne plasma which is formed by an ECR ion source 2 is so set that energy of Ne atoms reaching the substrate 11 is lower than threshold energy in sputtering of Si. Further, the polycrystalline Si thin film which is formed on the substrate 11 is irradiated with four components of the Ne atom current by the action of the reflector 12e. Directions of incidence of these four components correspond to those perpendicular to four (111) planes of the Si single crystal.

Therefore, the overall region of the polycrystalline Si thin film is converted to a single-crystalline Si layer similarly to the apparatus 101. Thus, a single-crystalline Si layer having a regulated crystal orientation is formed on the quartz substrate 11.

In the apparatus 121, due to employment of the reflector 12e, no multiple reflection of the atom current is caused by the plurality of slopes 155. Thus, the substrate 11 is irradiated with no atom current from a direction other than the prescribed four directions. Further, the reflector 12e implements uniform irradiation of the substrate 11 with the atom current, whereby the substrate 11 is uniformly irradiated with the atom current from the prescribed four directions. Thus, the single-crystalline Si thin film is uniformly formed on the substrate 11.

Similarly to the apparatus 120, portions which may be irradiated with the Ne atom current or an Ne ion current before neutralization, such as the reflector 12e, the inner wall of a reaction vessel 1 and the sample holder 10, for example, are made of materials causing no sputtering by the irradiation such as Ta, W, Pt or the like shown in Table 2, for example, also in the apparatus 121. Therefore, no sputtering is caused in these members by irradiation with the Ne atom current or the Ne ion current, whereby the thin film is prevented from contamination with material elements forming these members.

While the structure and the operation of the apparatus 121 have been described with reference to formation of an Si thin film, it is also possible to form an axially oriented polycrystalline thin film of a material other than Si with the apparatus 121. For example, it is also possible to form a GaAs thin film. Also in this case, the surface of the reflector 12e etc. is made of a material having higher threshold energy than that forming the thin film. Alternatively, the surface of the reflector 12e etc. may be made of the same material as that for the thin film, similarly to the apparatus 120. Further, the surface of the reflector 12e etc. may be made of a material containing an element which is heavier than that forming the ion current or the atom current as applied.

A-8. Seventh Preferred Embodiment

Figure 24:
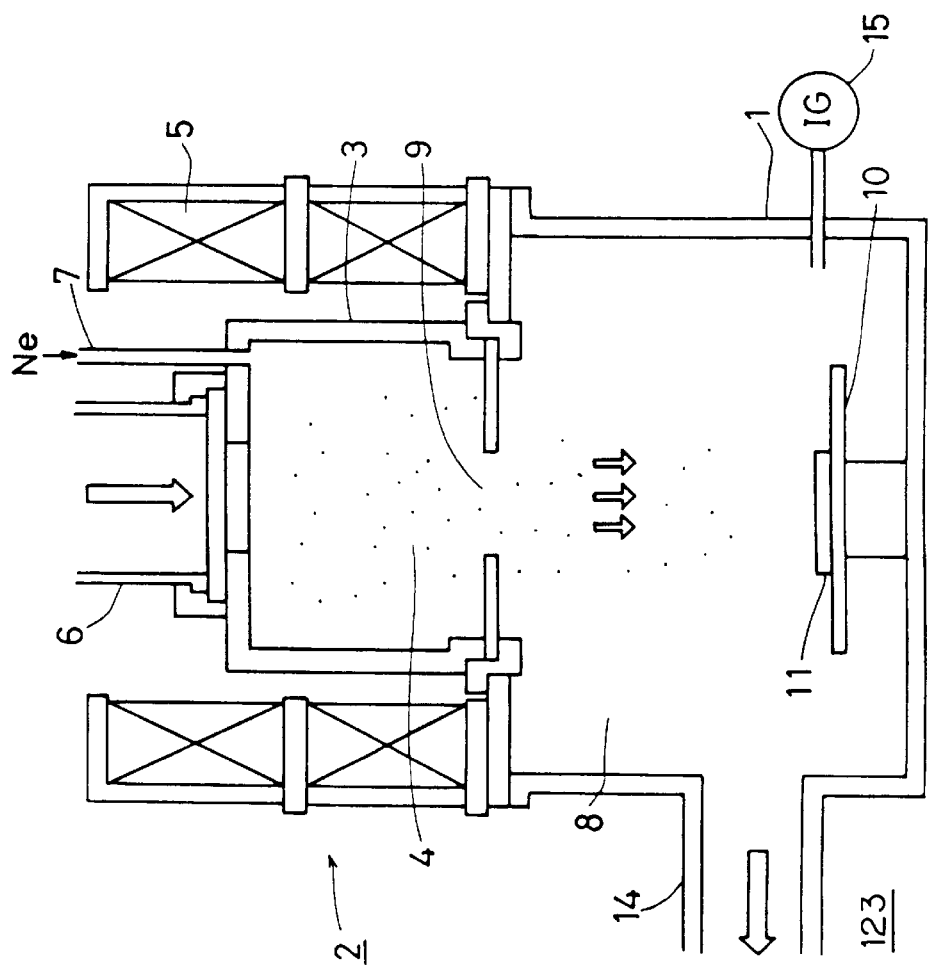
FIG. 24 is a perspective view showing an apparatus according to a seventh preferred embodiment of the present invention.

An apparatus according to a seventh preferred embodiment of the present invention is now described. FIG. 24 is a front sectional view showing the overall structure of the apparatus 123 according to this preferred embodiment. This apparatus 123 is an axially oriented polycrystalline thin film forming apparatus which is adapted to previously form a thin film of a prescribed material having an amorphous or polycrystalline structure on a substrate and to thereafter convert the thin film to an axially oriented polycrystalline thin film, thereby forming an axially oriented polycrystalline thin film on the substrate.

As shown in FIG. 24, this apparatus 123 has such a structure that the reflector 12e is removed from the apparatus 121 (FIG. 23). Similarly to the apparatus 121, a sample holder 10 comprises a heater (not shown), which can heat a substrate 11 to hold the same at a proper high temperature.

Referring to FIG. 24, the basic operation of the apparatus 123 is now described. It is assumed that the substrate 11 is prepared from a polycrystalline quartz substrate, so that an axially oriented polycrystalline Si thin film is formed on the quartz substrate 11. It is also assumed that a polycrystalline Si thin film is previously formed on the quartz substrate 11 by a well-known method such as CVD (chemical vapor deposition). This polycrystalline Si thin film may have such an ordinary polycrystalline structure that respective crystal grains are oriented in arbitrary directions.

First, the substrate 11 is mounted on the sample holder 10. The heater provided in the sample holder 10 holds the substrate 11 at a temperature of 550° C. Since this temperature is lower than the crystallization temperature of silicon, axially oriented polycrystalline Si once formed will not return to ordinary polycrystalline Si under this temperature. At the same time, this temperature is so high that ordinary polycrystalline Si can be grown into axially oriented polycrystalline Si from a nuclear of a seed crystal.

An ion current passing through an outlet 9 is converted to an atom current, which in turn is perpendicularly incident upon the surface of the substrate 11. For the same reason as that described in relation to the seventh preferred embodiment, an Ne atom current is selected as the atom current to be applied to the substrate 11, and energy of Ne plasma which is formed by an ECR ion source 2 is so set that energy of Ne atoms reaching the substrate 11 is lower than threshold energy in sputtering of Si.

Thus, the law of Bravais acts in a portion close to the surface of the polycrystalline Si thin film, whereby the Si atoms are rearranged in a portion close to the surface of the polycrystalline Si thin film so that a surface perpendicular to the direction of incidence of the Ne atom current which is applied to the polycrystalline Si thin film defines the densest crystal plane. Namely, a layer close to the surface of the polycrystalline Si thin film is converted to an axially oriented polycrystalline Si layer whose uniaxial direction is regulated so that the (111) plane is along its surface.

The temperature of the polycrystalline Si thin film is adjusted at 550°, i.e., within a range suitable for growing a seed crystal, as described above. Thus, the axially oriented polycrystalline Si layer which is formed on the surface of the ordinary polycrystalline Si thin film serves as a seed crystal, to grow the axially oriented polycrystalline Si layer toward a deep portion of the ordinary polycrystalline Si thin film. Then, the overall region of the polycrystalline Si thin film is converted to an axially oriented polycrystalline Si layer. Thus, an axially oriented polycrystalline Si layer which is so oriented that the (111) plane is along its surface is formed on the quartz substrate 11.

Alternatively, an amorphous Si thin film may be previously formed on the substrate 11 in place of the ordinary polycrystalline Si thin film to be thereafter treated with the apparatus 123, thereby forming an axially oriented polycrystalline Si thin film.

Also in the apparatus 123, portions which may be irradiated with the Ne atom current or an Ne ion current before neutralization, such as at least surfaces of the inner wall of a reaction vessel 1 and the sample holder 10, for example, are made of materials causing no sputtering by the irradiation, such as Ta, W, Pt or the like shown in Table 2, for example, similarly to the apparatus 122. Therefore, no sputtering is caused in these members by irradiation with the Ne atom current or the Ne ion current, whereby the thin film is prevented from contamination with material elements forming these members.

While the structure and the operation of the apparatus 123 have been described with reference to formation of an Si thin film, it is also possible to form an axially oriented polycrystalline thin film of a material other than Si by the apparatus 123. For example, it is also possible to form a GaAs thin film. Also in this case, the surface of the sample holder 10 etc. is made of a material having higher threshold energy than that of the thin film. Alternatively, the surface of the sample holder 10 etc. may be made of the same material as that for the thin film, similarly to the apparatus 122. Further, the surface of the sample holder 10 etc. may be made of a material containing an element which is heavier than that forming the ion current or the atom current as applied.

A-9. Eighth Preferred Embodiment

An eighth preferred embodiment of the present invention is now described. A method according to this preferred embodiment is adapted to form an axially oriented polycrystalline thin film on a substrate 11 and to thereafter convert the same to a single-crystalline thin film by irradiating the film with atom currents from a plurality of directions, thereby forming a single-crystalline thin film on the substrate 11. To this end, the apparatus 122 according to the fourth preferred embodiment may be employed to form an axially oriented polycrystalline thin film on the substrate 11, so that this thin film is converted to a single-crystalline thin film through the apparatus 121 according to the seventh preferred embodiment, for example.

Alternatively, the apparatus 120 according to the eighth preferred embodiment may be employed to form an axially oriented polycrystalline thin film by executing supply of reaction gas and application of an atom current at first while removing the reflector 12e, so that the reflector 12e is thereafter set in the apparatus 120 to execute application of an atom current while heating the substrate 11 for converting the thin film to a single-crystalline thin film, thereby forming a single-crystalline thin film on the substrate 11.

Alternatively, a thin film having an amorphous structure or an ordinary polycrystalline structure may be previously formed on the substrate 11 by CVD or the like so that the thin film is thereafter converted to an axially oriented polycrystalline thin film through the apparatus 123 and thereafter the film is further converted to a single-crystalline thin film through the apparatus 121, thereby forming a single-crystalline thin film on the substrate 11.

Thus, in the method according to this preferred embodiment, an axially oriented polycrystalline thin film is previously formed before a single-crystalline thin film is formed on the substrate 11. Even if a portion which is hard to form a single-crystalline thin film is present on the substrate 11, therefore, mechanical and electrical properties of the thin film are not remarkably deteriorated since the portion is provided with an axially oriented polycrystalline thin film having characteristics which are close to those of a single-crystalline thin film. Namely, it is possible to obtain a thin film having properly excellent characteristics without precisely executing a step of forming a single-crystalline thin film.

Figure 25:
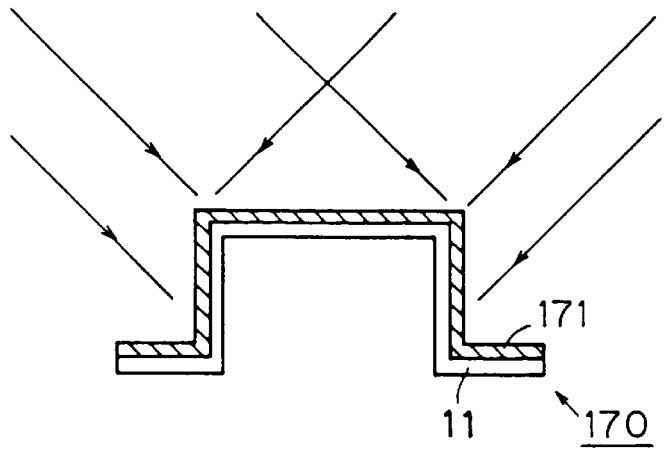
FIG. 25 is a process diagram for illustrating a method according to an eighth preferred embodiment of the present invention.
Figure 26:
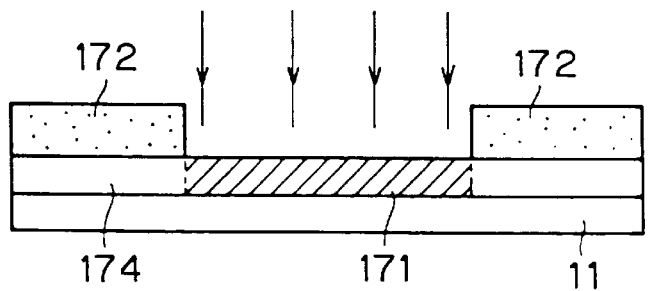
FIG. 26 is a process diagram for illustrating the method according to the eighth preferred embodiment of the present invention.
Figure 27:
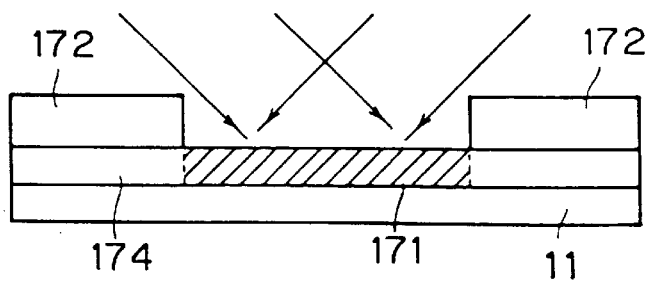
FIG. 27 is a process diagram for illustrating the method according to the eighth preferred embodiment of the present invention.

This is particularly effective when it is difficult to uniformly irradiate a prescribed region of the substrate 11 with atom currents from a plurality of directions since the substrate 11 is not in the form of a flat plate but is in the form of a cube, or a screen having a thickness is formed on the surface of the substrate 11. FIGS. 25 to 27 show such examples.

FIG. 25 is a sectional view typically illustrating such a state that the surface of a sample 170 comprising a substrate 11 having a cubic shape and an axially oriented polycrystalline Si thin film 171 previously formed thereon is irradiated with Ne atom currents from two directions. As shown in FIG. 25, the sample 170 has a cubic shape and hence the sample 170 itself serves as a screen for the atom currents. Consequently, a specific region of the axially oriented polycrystalline Si thin film 171 is irradiated with the Ne atom current from only one direction, and no irradiation from two directions is implemented.

FIGS. 26 and 27 are sectional views typically showing steps of selectively forming a single-crystalline Si thin film on a substrate 11 through a masking member 172 in a process of fabricating a thin-film semiconductor integrated circuit. An amorphous or ordinary polycrystalline Si thin film 174 is previously formed on the substrate 11 by CVD or the like. Thereafter the apparatus 123 is employed to perpendicularly irradiate the upper surface of the Si thin film 174 with an Ne atom current through an opening of the masking member 172 which is made of $SiO_2$ or the like, thereby selectively forming an axially oriented polycrystalline Si thin film 171 immediately under the opening of the masking member 172 (FIG. 26).

Then, the apparatus 121 is employed to irradiate the upper surface of the Si thin film 171 with Ne atom currents from a plurality of directions through the opening of the masking member 172, thereby converting the axially oriented polycrystalline Si thin film 171 to a single-crystalline Si thin film (FIG. 27). At this time, a portion close to an edge of the opening of the masking member 172 is not sufficiently irradiated with the Ne atom currents from the plurality of directions since the masking member 172 has a constant thickness. Thus, the single-crystalline Si thin film is hardly formed in the portion close to the edge of the opening of the masking member 172. However, at least the axially oriented polycrystalline Si thin film is provided in this portion even if no single-crystalline Si thin film is formed, whereby it is possible to minimize deterioration of electrical properties such as carrier mobility.

In the method according to this preferred embodiment, one of the plurality of directions of incidence of the atom currents which are applied to carry out conversion to a single-crystalline thin film is preferably coincident with the direction of incidence of the atom current which is applied in advance for forming the axially oriented polycrystalline thin film. In this case, conversion to a single-crystalline thin film is carried out without changing the common uniaxial direction in the axially oriented polycrystalline thin film, whereby the step of conversion to a single-crystalline thin film smoothly progresses in a short time.

A-10. Ninth Preferred Embodiment

A ninth preferred embodiment of the present invention is now described.

A-10-1. Structure of Apparatus

Figure 28:
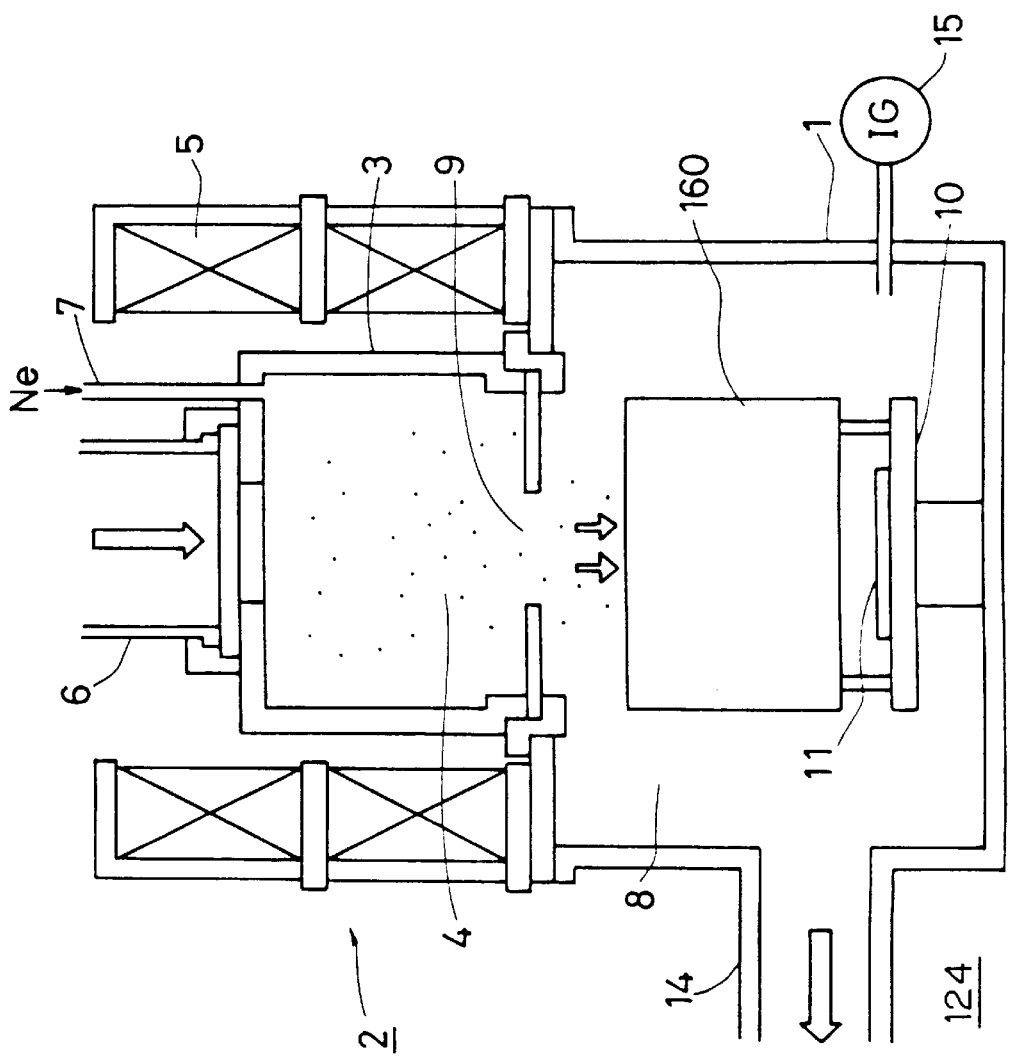
FIG. 28 is a front sectional view of an apparatus according to a ninth preferred embodiment of the present invention.

FIG. 28 is a front sectional view showing the overall structure of an apparatus 124 according to this preferred embodiment. This apparatus 124 is adapted to convert an amorphous, polycrystalline, or axially oriented polycrystalline thin film which is previously formed on a substrate 11 to a single-crystalline thin film, thereby forming a single-crystalline thin film on the substrate 11.

This apparatus 124 is characteristically different from the apparatus 121 in a point that a reflecting unit 160 is set in place of the reflector 12e. The reflecting unit 160, which is adapted to generate a plurality of atom current components to be incident upon the substrate 11 at a plurality of prescribed angles of incidence, is set on a sample holder 10, to be located above the substrate 11. The sample holder 10 comprises a heater (not shown), which can heat the substrate 11 to maintain the same at a proper high temperature.

A-10-2. Structure and Operation of Reflecting Unit

Figure 29:
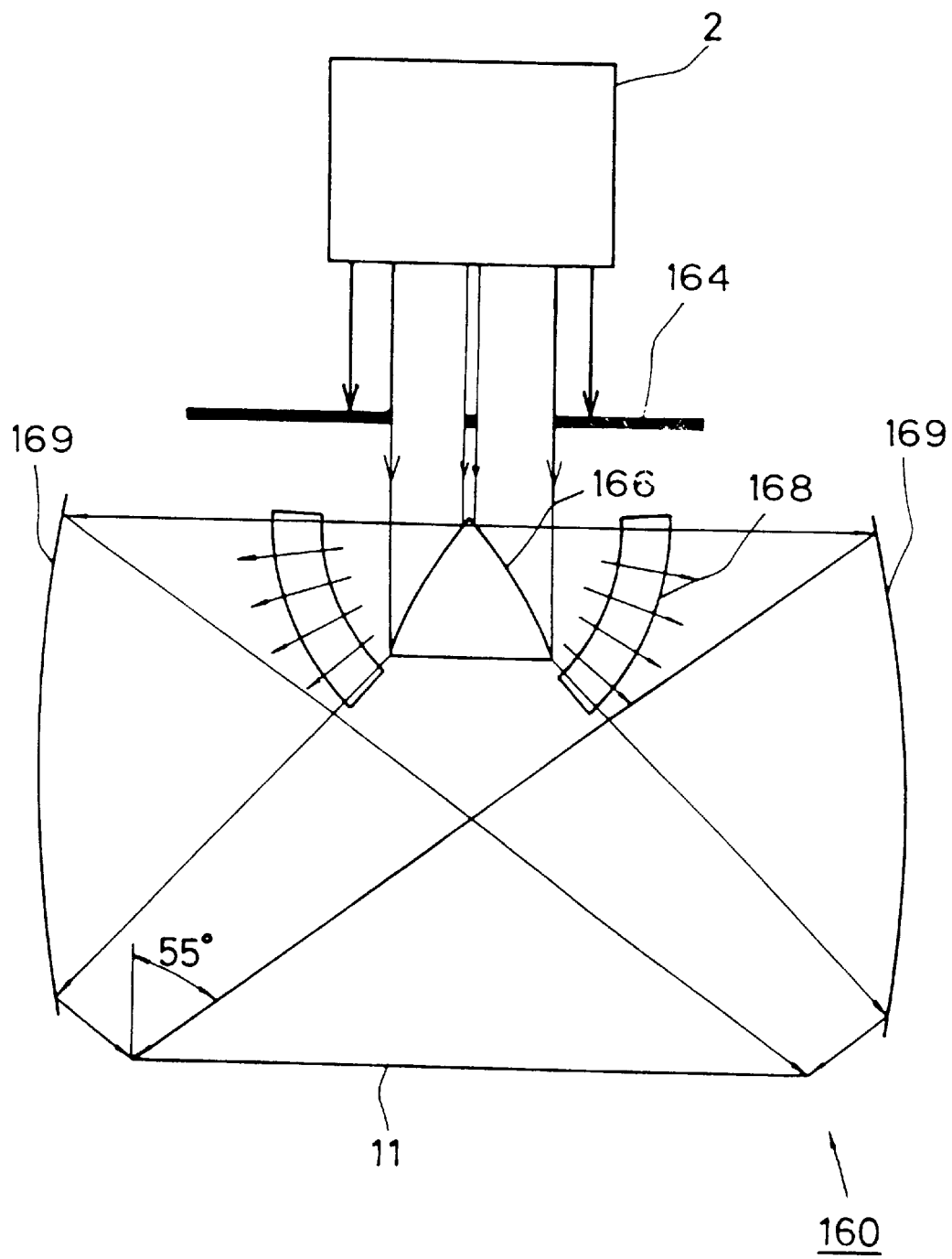
FIG. 29 is a front sectional view showing a reflecting unit in the ninth preferred embodiment of the present invention.
Figure 30:
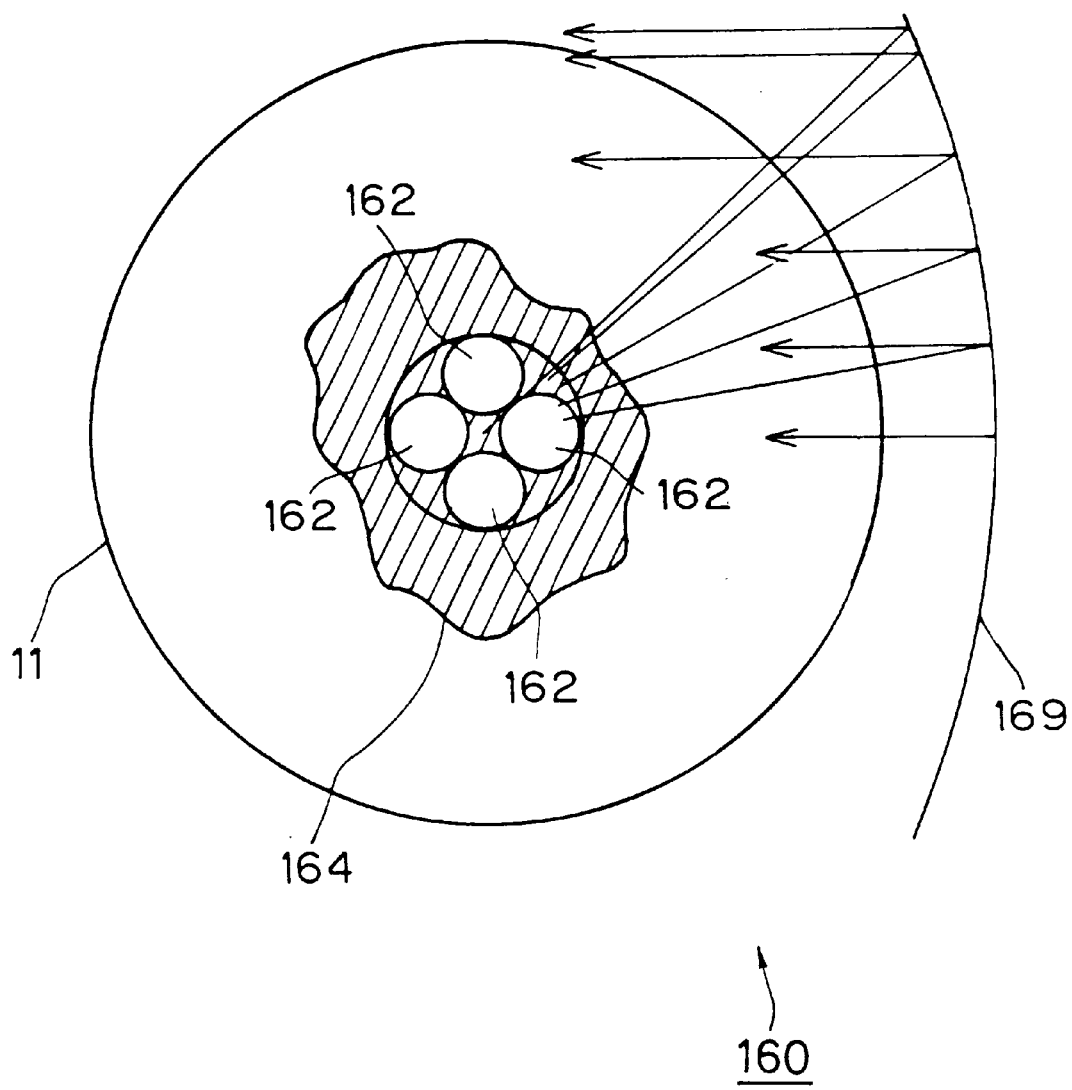
FIG. 30 is a plan view showing a reflecting unit in the ninth preferred embodiment.

The structure and the operation of the reflecting unit 160 are now described. FIGS. 29 and 30 are a front sectional view and a plan sectional view showing the structure of the reflecting unit 160 respectively. The reflecting unit 160 illustrated in FIGS. 29 and 30 is adapted to form a single crystal of a diamond structure such as single-crystalline Si. This reflecting unit 160 is arranged directly under an ion outlet 9 of an ECR ion source 2, i.e., downstream an atom current which is generated by the ECR ion source 2 to be downwardly directed.

A screen plate 164 which can selectively screen the atom current supplied from the ECR ion source 2 is horizontally provided on an upper portion of the reflecting unit 160. The reflecting unit 160 is so set that a distance between the outlet 9 and this screen plate 164 is at a sufficient value, such as at least 14 cm, for example, for converting an ion current outputted from the ECR ion source 2 to a neutral atom current. Namely, a substantially neutral atom current reaches the screen plate 164. Openings 162 are provided in this screen plate 164, to be in four-fold rotation symmetry about a central axis of the atom current from the ECR ion source 2. The atom current from the ECR ion source 2 passes only through the openings 162, to further flow downwardly.

A reflecting block 166 is set immediately under this screen plate 164. This reflecting block 166 is in the form of a four-fold rotary-symmetrical cone whose symmetry axis is coincident with the central axis of the atom current, and four side surfaces of the cone are located immediately under the four openings 162 respectively. These side surfaces are not necessarily plane, but are curved in general. These four side surfaces serve as reflecting surfaces for reflecting the atom current. Namely, the atom current passing through the openings 162 is reflected by the four side surfaces of the reflecting block 166, whereby four atom current components progressing toward directions separated from the central axis are obtained.

These four atom current components are divergent beams whose beam sections are two-dimensionally (planarly) enlarged. These four components pass through a rectifying member (rectifying means) 168 so that directions of progress thereof are accurately regulated in desired directions, to be thereafter incident upon four reflectors 169 respectively. The rectifying member 168, which is adapted to regulate the directions of the atom current components radially from the side surfaces of the reflecting block 166 toward the reflecting plates 169, can be formed by a well-known technique.

These four reflectors 169 are arranged around the substrate 11, which is the target of irradiation, to be four-fold rotation symmetrical about the symmetry axis of the reflecting block 166 (FIG. 30 typically shows only one reflector 169. FIG. 30 also illustrates only an atom current which is incident upon and reflected by an upper half portion of the single reflector 169). The atom current component which is incident upon each reflector 169 is again reflected by its reflecting surface. The reflecting surface of each reflector 169 has a shape of a proper concave surface. Therefore, the divergent atom current components are reflected by the reflecting surfaces and properly focused as the result, to form parallel beams which are uniformly applied to the overall upper surface of the substrate 11. Further, the parallel beams are incident upon the upper surface of the substrate 11 from four directions at angles of incidence of 55°, for example.

A-10-3. Operation of Apparatus 124

Referring to FIG. 28, the operation of the apparatus 124 is now described. It is assumed that the substrate 11 is prepared from an amorphous or polycrystalline $SiO_2$ (quartz) substrate, so that a single-crystalline Si thin film (which includes an axially oriented polycrystalline Si thin film) is formed on the quartz substrate 11. A polycrystalline Si thin film is previously formed on the quartz substrate 11 by CVD (chemical vapor deposition), for example.

First, the substrate 11 is mounted between the sample holder 10 and the reflecting unit 160. The heater provided in the sample holder 10 holds the sample, i.e., the substrate 11 and the polycrystalline Si thin film, at a temperature of 550° C. Similarly to the apparatus 121, a gas which is introduced from an inert gas inlet pipe 7 is preferably prepared from inert Ne gas having smaller atomic weight than Si atoms.

Due to the action of an ECR ion source 2, an Ne atom current is supplied to the reflecting unit 160, to be incident upon the overall upper surface of the substrate 11 from four directions at angles of incidence of 55°, for example. In this case, the directions of incidence of the four Ne atom current components correspond to four directions which are perpendicular to four independent densest crystal planes of an Si single crystal to be formed, i.e., (111) planes. Similarly to the apparatus 121, energy of plasma which is formed by the ECR ion source 2 is so set that energy of the Ne atoms reaching the substrate 11 is lower than threshold energy in sputtering of Si by irradiation with the Ne atoms.

Thus, the law of Bravais acts on the polycrystalline Si thin film, whereby the Si atoms are rearranged in a portion close to the surface of the polycrystalline Si thin film so that surfaces perpendicular to the directions of incidence of the four components of the Ne atom current which is applied to the polycrystalline Si thin film define densest crystal planes. Namely, a layer in the vicinity of the polycrystalline Si thin film is converted to a single-crystalline Si layer having a regulated crystal orientation.

The temperature of the polycrystalline Si thin film is adjusted at 550°, i.e., within a range suitable for growing a seed crystal, as described above. Thus, the single-crystalline Si layer which is formed on the surface of the polycrystalline Si thin film serves as a seed crystal, to grow the single-crystalline Si layer toward a deep portion of the polycrystalline Si thin film. After a lapse of a constant time, the overall region of the polycrystalline Si thin film is converted to a single-crystalline Si layer. Thus, a single-crystalline Si layer having a regulated crystal orientation is formed on the quartz substrate 11. The single-crystalline Si thin film as formed is so oriented that the (100) plane is along its surface.

The angle of incidence of 55° shown in FIG. 29 is a mere example as a matter of course, and it is possible to introduce parallel beams into the substrate 11 at an arbitrary angle of incidence which is decided in response to the crystal structure of the desired single-crystalline thin film by properly changing the shapes and directions of the reflectors 169. Since the divergent beams are generated by the reflecting block 166, it is possible to uniformly irradiate a wide substrate 11 with parallel beams by properly adjusting the distances between the reflectors 169 and the symmetry axis of the reflecting block 166 in response to the width of the substrate 11.

Thus, according to this apparatus 124, it is possible to uniformly irradiate the overall surface of the substrate 11 having an area which is extremely larger than the section of each beam supplied from the ECR ion source 2 with atom current components at desired angles of incidence. Namely, it is possible to uniformly and efficiently form a desired single-crystalline thin film on the substrate 11 having a large area.

Further, it is possible to independently adjust the amounts of the four component beams passing through the openings 162 by independently adjusting the areas of the four openings 162 provided in the screen plate 164. Thus, it is possible to optimumly set the respective amounts of the four component beams which are applied to the upper surface of the substrate 11 from a plurality of directions. For example, it is possible to uniformly regulate the amounts of the four component beams. Thus, a high-quality single-crystalline thin film can be efficiently formed.

Similarly to the apparatus 121, at least surfaces of respective members of the reflecting unit 160 such as the reflecting block 168, the rectifying member 168 and the reflectors 169 which are irradiated with the atom current components may be made of materials such as Ta, W, Pt or the like having higher threshold energy in sputtering than the thin film to be formed. Alternatively, the surfaces of the respective members of the reflecting unit 160 may be made of the same material as that for the thin film, similarly to the apparatus 121. Further, the surfaces of the respective members of the reflecting unit 160 may be made of a material containing an element which is heavier than that forming the ion current or the atom current as applied.

A-11. Tenth Preferred Embodiment

Figure 31:
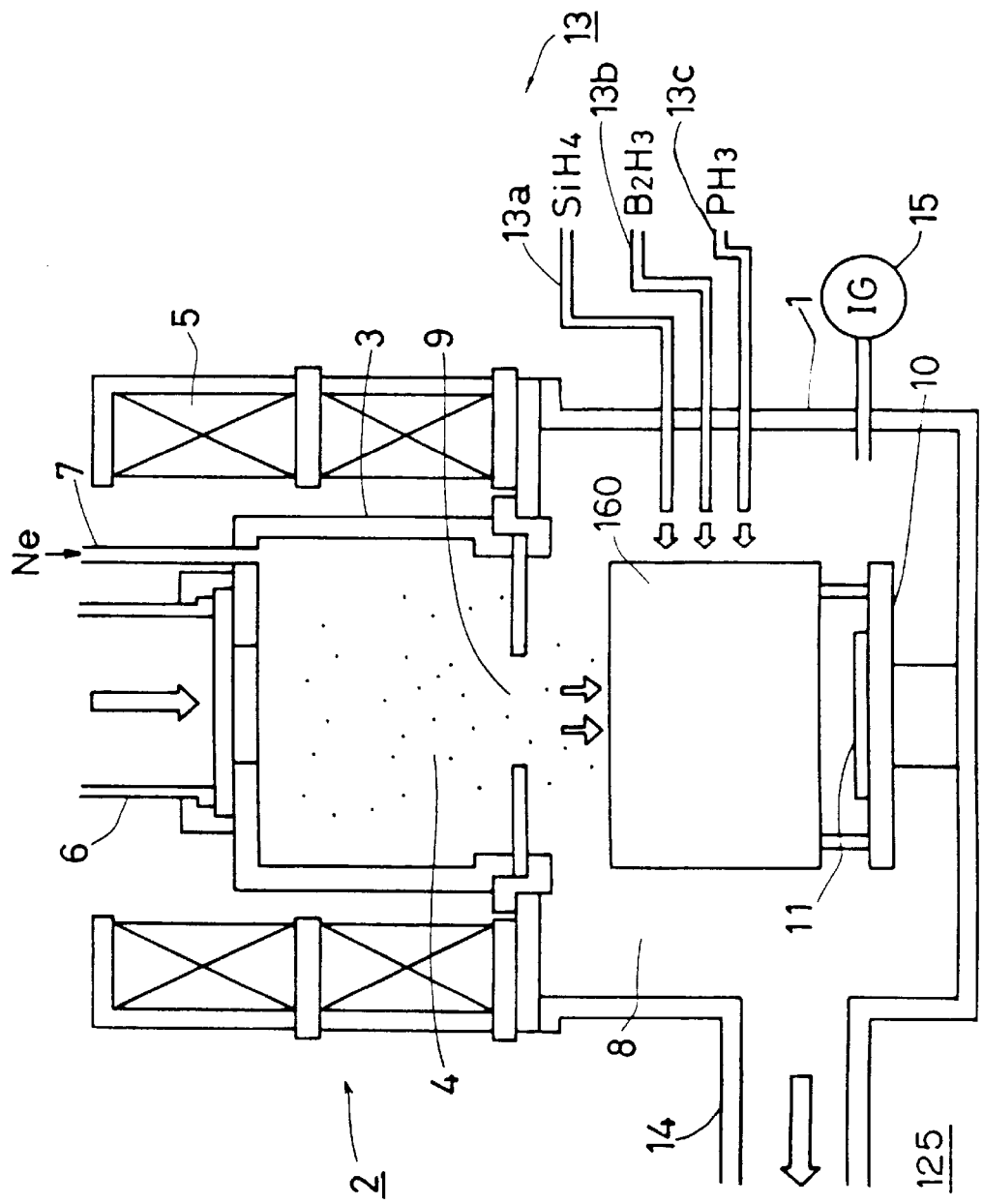
FIG. 31 is a front sectional view showing an apparatus according to a tenth preferred embodiment of the present invention.

An apparatus according to a tenth preferred embodiment of the present invention is now described. FIG. 31 is a front sectional view showing the overall structure of a beam irradiator according to this preferred embodiment. This apparatus 125 is adapted to form a polycrystalline thin film on a substrate 11 and to irradiate the same with an atom current at the same time, thereby sequentially converting the polycrystalline thin film as being grown to a single-crystalline thin film, similarly to the apparatus 120.

To this end, a reaction chamber 8 communicates with reaction gas supply pipes 13 in the apparatus 125, similarly to the apparatus 120. Reaction gases are supplied through the reaction gas supply pipes 13, for forming a film of a prescribed material on the substrate 11 by plasma CVD. The preferred embodiment shown in FIG. 31 is provided with three reaction gas supply pipes 13a, 13b and 13c. Other structural characteristics of this apparatus 125 are similar to those of the apparatus 124.

The apparatus 125 operates as follows: Similarly to the sixth preferred embodiment, it is assumed that the substrate 11 is prepared from polycrystalline $SiO_2$ (quartz), so that a thin film of single-crystalline Si is formed on the quartz substrate 11. The reaction gas supply pipes 13a, 13b and 13c supply $SiH_4$ (silane) gas for supplying Si, which is a main material for the single-crystalline Si, and $B_2H_3$ (diborane) gas and $PH_3$ (phosphine) gas for doping the substrate 11 with p-type and n-type impurities respectively. Ne gas is introduced from an inert gas inlet pipe 7 into a plasma chamber 4.

Due to the reaction gases supplied from the reaction gas supply pipes 13a, 13b and 13c and an $Ne^+$ ion current or an Ne atom current generated by an ECR ion source 2, plasma CVD reaction progresses on the upper surface of the substrate 11, thereby growing an Si thin film of an amorphous structure.

The Ne atom current downwardly flowing from the ECR ion source 2 is incident upon the overall surface of the Si thin film being formed on the upper surface of the substrate 11 from four directions having angles of incidence of 55°, for example, due to action of a reflecting unit 160. Similarly to the apparatus 120, energy of plasma which is formed by the ECR ion source 2 is so set that incident energy of the four components is lower than threshold energy with respect to Si. Thus, the law of Bravais acts on the amorphous Si thin film as being grown, whereby the amorphous Si thin film being grown by plasma CVD is sequentially converted to a single-crystalline Si thin film having a regulated crystal orientation. As a result, single-crystalline Si having a single crystal orientation is formed on the substrate 11.

Also in this apparatus 125, the reflecting unit 160 is so employed that it is possible to uniformly irradiate the overall surface of the substrate 11 having an area which is extremely larger than the section of each beam supplied from the ECR ion source 2 with atom current components at desired angles of incidence without scanning the substrate 11, due to employment of the reflecting unit 160. Namely, it is possible to uniformly and efficiently form a desired single-crystalline thin film on the substrate 11 having a large area.

A-12. Eleventh Preferred Embodiment

Figure 32:
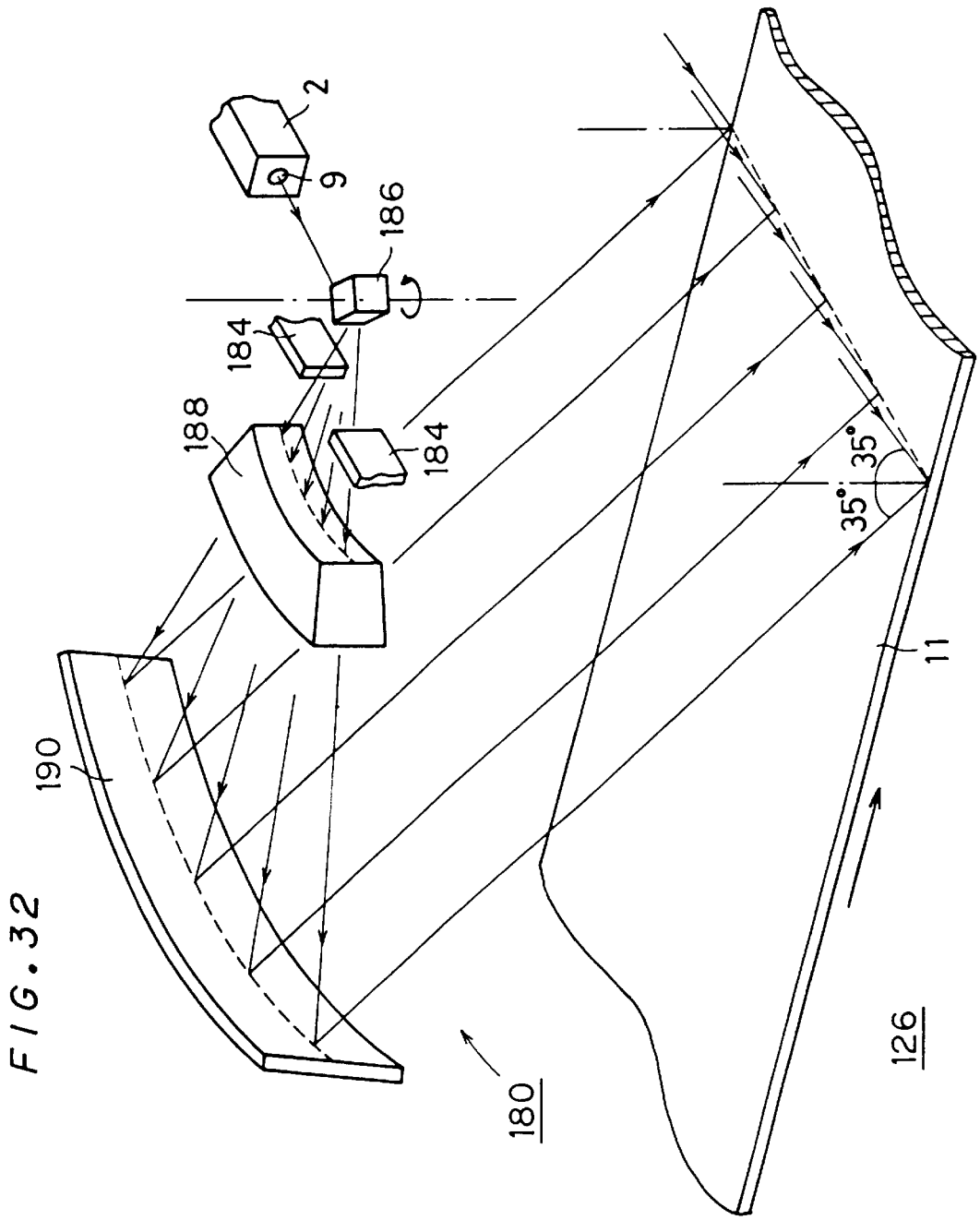
FIG. 32 is a perspective view showing an apparatus according to an eleventh preferred embodiment of the present invention.
Figure 33:
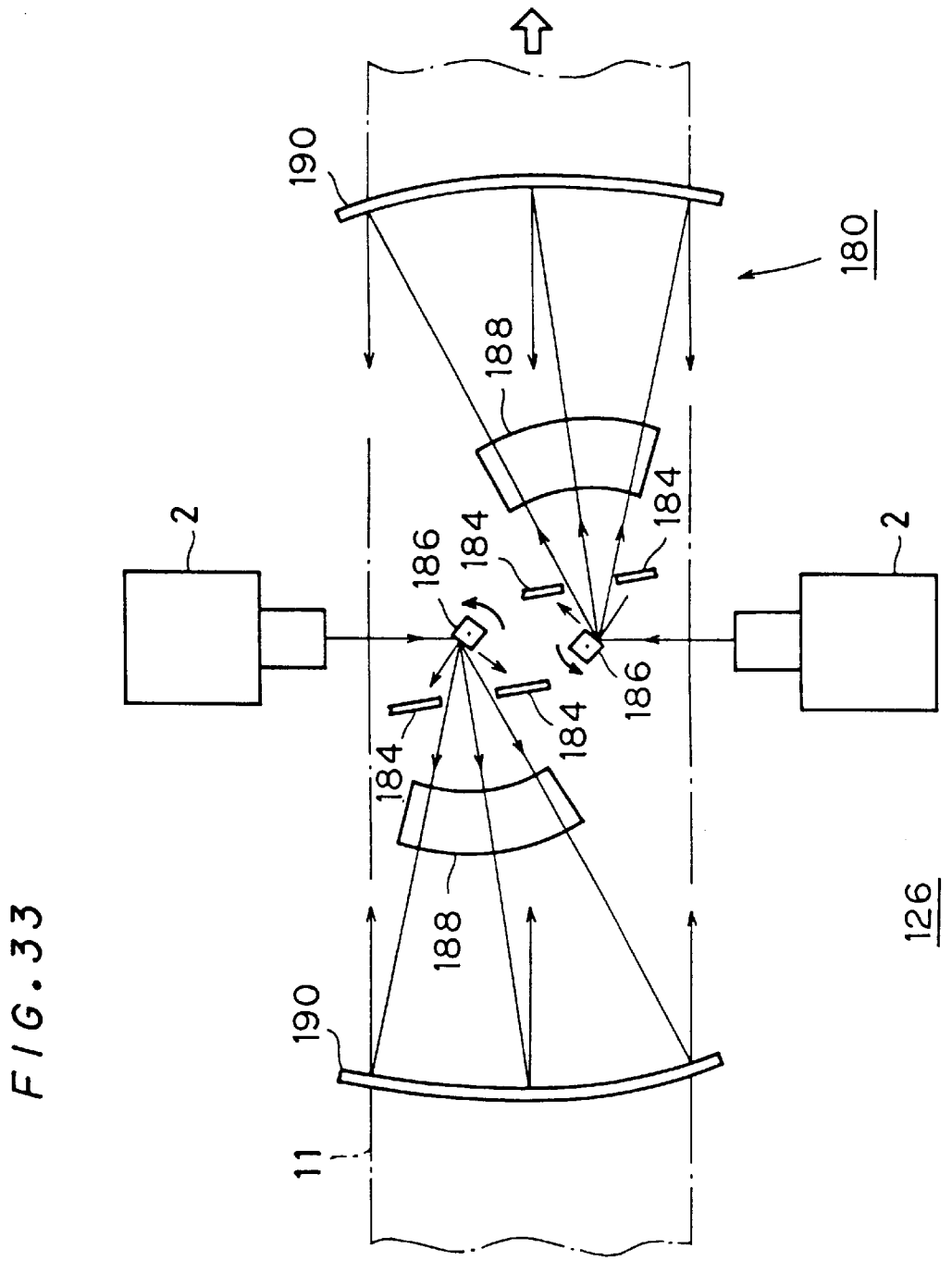
FIG. 33 is a plan view showing the apparatus according to the eleventh preferred embodiment of the present invention.
Figure 34:
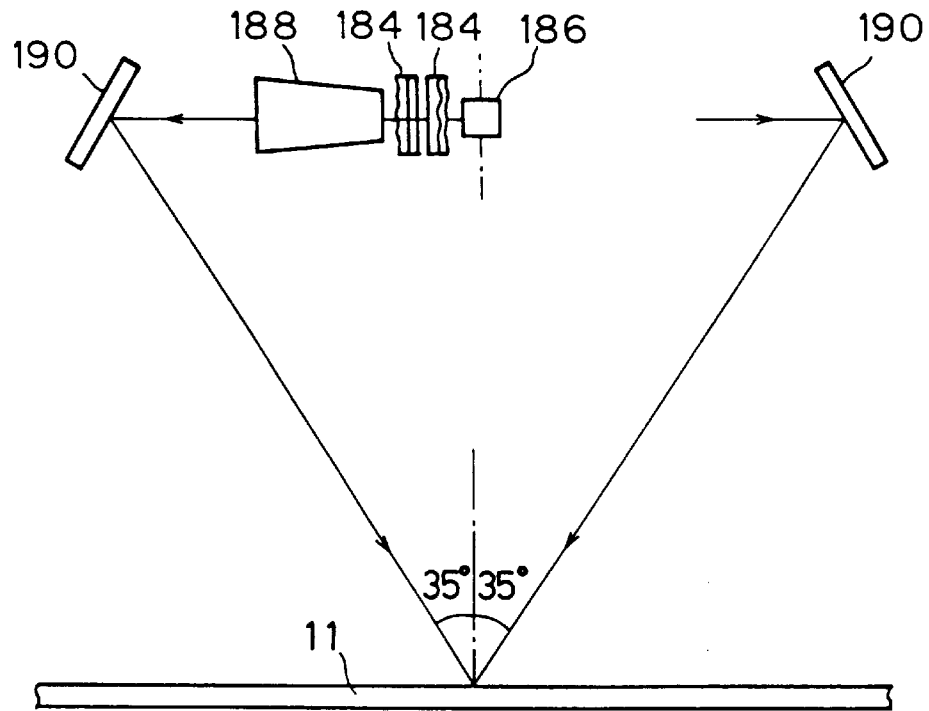
FIG. 34 is a front elevational view of the apparatus according to the eleventh preferred embodiment of the present invention.

An apparatus 126 according to an eleventh preferred embodiment of the present invention is now described. FIGS. 32 to 34 are a perspective view, a plan view and a front elevational view showing the apparatus 126 according to this preferred embodiment, respectively. With reference to FIGS. 32 to 34, the structure and the operation of the apparatus 126 according to this preferred embodiment are now described.

In this apparatus 126, an ECR ion source 2 is set in a horizontal state, to supply a gas beam in a horizontal direction which is parallel to the surface of a horizontally set substrate 11. A reflecting unit 180 is interposed in a path of the gas beam which is supplied from the ECR ion source 2 to reach the upper surface of the substrate 11.

In the reflecting unit 180, a reflecting block 186, a screen plate 184, a rectifying member 188 and a reflector 190 are successively arranged along the path of the gas beam. The reflecting block 186 is rotated/driven about its central axis which is in the form of a perpendicular prism. A distance between an outlet 9 and the reflecting block 186 is set at a sufficient length of at least 14 cm, for example, for converting an ion current which is outputted from the ECR ion source 2 to a neutral atom current. Thus, a substantially neutral atom current reaches the reflecting block 186.

Figure 35:
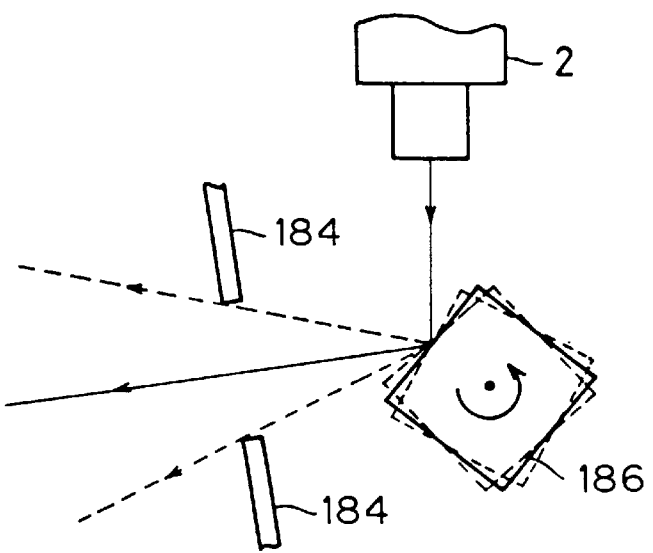
FIG. 35 is a plan view of the apparatus according to the eleventh preferred embodiment of the present invention.

FIG. 35 is a plan view for illustrating the operation of the reflecting block 186. As shown in FIG. 35, an atom current which is incident upon the reflecting block 186 is scattered to a number of directions in a horizontal plane by rotation of the reflecting block 186. Namely, the reflecting block 186 substantially generates divergent beams whose beam sections are enlarged linearly or in the form of strips, i.e., substantially one-dimensionally, with progress of the beams.

The screen plate 184 selectively passes only components of the divergent atom current having scattering angles in a specific range. The atom current components passed through the screen plate 184 are passed through the rectifying member 188, to be precisely regulated in directions of progress. The rectifying member 188 is structured similarly to the rectifying member 168. In place of the shape of a prism shown in FIG. 35, the reflecting block 186 may be in the form of a triangle pole, a hexagonal pole or the like, for example.

Referring again to FIGS. 32 to 34, the atom current components passed through the rectifying member 188 are incident upon the reflector 190 which is in the form of a strip along the horizontal direction. A reflecting surface of the reflector 190 has a proper concave shape. Thus, the divergent atom current components are reflected by this reflecting surface and properly focused to form parallel beams, which are applied to the upper surface of the substrate 11 linearly or in the form of strips. Further, the parallel beams are incident upon the upper surface of the substrate 11 at angles of incidence of 35°, for example. As shown in FIG. 33, two sets of the members from the reflecting block 186 to the reflector 190 arranged along the path of the atom current are set. Thus, atom currents are incident upon the substrate 11 from opposite two directions at angles of incidence of 35° respectively.

Each atom current is scattered by each reflecting block 186 to be substantially one-dimensionally diverged, whereby it is possible to apply parallel beams to a linear or strip-shaped region having a width which is extremely larger than the diameter of the beam supplied from the ECR ion source 2 by sufficiently setting the distance between the reflecting block 186 and the reflector 190.

The apparatus 126 has a sample holder (not shown) for receiving the substrate 11, and this sample holder is horizontally movable by a horizontal moving mechanism (not shown). Following such horizontal movement of the sample holder, the substrate 11 is moved in parallel along a direction perpendicular to (intersecting with) the linear or strip-shaped region receiving the atom currents. Thus, it is possible to implement irradiation of the overall region of the substrate 11 by scanning the substrate 11. Due to such scanning of the substrate 11, it is possible to uniformly irradiate the wide substrate 11 with atom current components.

This apparatus 126 may comprise reaction gas supply pipes 13a, 13b and 13c similarly to the apparatus 120, to form a thin film of a prescribed material on the substrate 11 and to sequentially convert the thin film to a single crystal. Alternatively, the sample holder may be provided with a heater similarly to the apparatus 121, to convert a thin film of a prescribed material which is previously deposited on the substrate 11 to a single-crystalline thin film. Since the two atom currents are incident from opposite directions at the same angles of incidence of 35°, the single-crystalline thin film formed on the substrate 11 is so oriented that its (110) plane is along its surface.

It is possible to form a single-crystalline thin film which is so oriented that a crystal plane other than the (110) plane is along its surface, by changing the positional relation between the reflecting units 180, the angles of the reflectors 190 and the like. For example, it is possible to form a single-crystalline thin film which is so oriented that its (100) plane is along its surface by arranging at least two sets of reflecting units 180 so that central axes of atom currents from the reflecting blocks 186 toward the reflectors 190 are at angles of 90° or 180° and setting shapes and directions of the reflectors 190 so that angles of incidence of the atom currents incident upon the substrate 11 from the reflecting units 180 are 55°.

Further, it is possible to form a single-crystalline thin film which is so oriented that its (111) plane is along its surface by arranging at least two sets of three sets of of reflecting units 180 so that central axes of atom currents from the reflecting blocks 186 toward the reflectors 190 are each shifted by 120° and setting shapes and directions of the reflectors 190 so that angles of incidence of the atom currents incident upon the substrate 11 from the reflecting units 180 are at 70°.

Similarly to the apparatus 124, at least surfaces of respective members of the reflecting units 160 such as the reflecting blocks 168, the rectifying members 168 and the reflectors 169 which are irradiated with the atom current components may be made of materials such as Ta, W, Pt or the like having higher threshold energy in sputtering than the thin film to be formed. Alternatively, the surfaces of the respective members of the reflecting units 160 may be made of the same material as that for the thin film. Further, the surface of the respective members of the reflecting units 160 may be made of a material containing an element which is heavier than that forming the ion current or the atom current as applied.

A-13. Twelfth Preferred Embodiment

Figure 36:
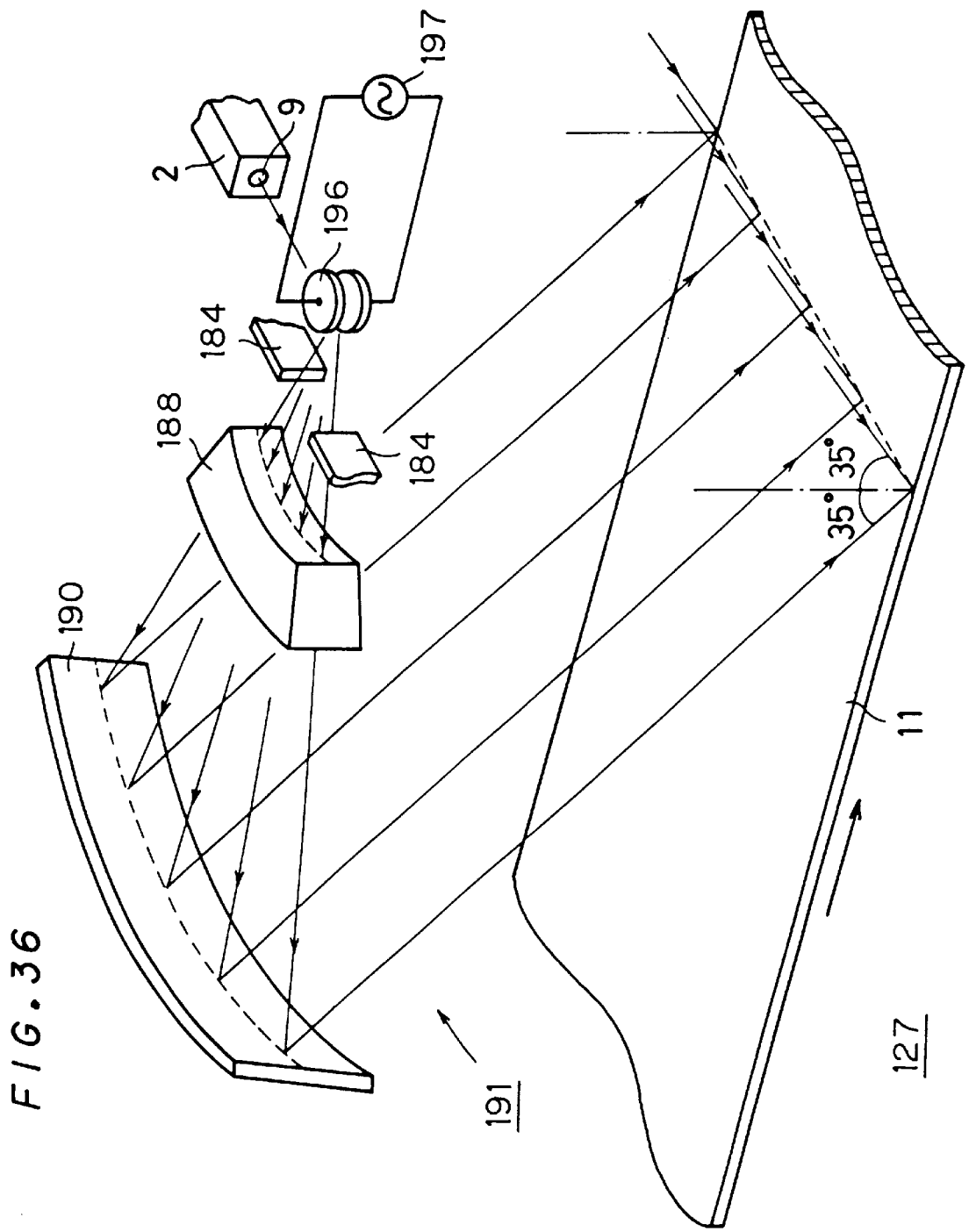
FIG. 36 is a perspective view showing an apparatus according to a twelfth preferred embodiment of the present invention.

An apparatus 127 according to a twelfth preferred embodiment of the present invention is now described. FIG. 36 is a perspective view showing the structure of the apparatus 127 according to this preferred embodiment. As shown in FIG. 36, this apparatus 127 comprises a reflecting unit 191. This reflecting unit 191 is characteristically different from the reflecting unit 180 in a point that the same has an electrostatic electrode 306 in place of the reflecting blocks 186. An ion current is incident upon the electrostatic electrode 196, in place of a neutral atom current. Namely, a distance between an outlet 9 and this electrostatic electrode 196 is set to be sufficiently short so that the ion current outputted from an ECR ion source 2 is hardly converted to a neutral atom current but incident upon the electrostatic electrode 196 as such.

The electrostatic electrode 196 is provided with an ac power source 197. This ac power source 197 supplies a fluctuation voltage which is formed by an alternating voltage superposed on a constant bias voltage to the electrostatic electrode 196. Consequently, the ion current which is incident upon the electrostatic electrode 196 is scattered into a number of directions within a horizontal plane by action of a fluctuating electrostatic field.

Thus, scattering of the ion current is implemented by the fluctuation voltage which is supplied by the ac power source 197 in this apparatus 127, whereby it is possible to easily suppress scattering of the ion current in unnecessary directions cut by screen plates 184. Namely, it is possible to efficiently apply the ion current which is supplied by the ECR ion source 2 to a substrate 11. Further, it is also possible to scatter the ion current to respective scattering directions with higher uniformity by setting the waveform of the fluctuation voltage supplied by the ac power source 197 in the form of a chopping wave, for example.

A-14. Modifications of Fifth to Twelfth Preferred Embodiments (1) While the shapes of the reflecting blocks 166 and the arrangement of the reflectors 169 are selected to four-fold rotation symmetry in the sixth and tenth preferred embodiments, the same can alternatively be selected in two-fold or three-fold rotation symmetry, for example. Namely, it is possible to arbitrarily select the number of components of the atom current which are incident at different angles of incidence in response to the crystal structure of the desired single-crystalline thin film. The shape of the reflecting block 166 may be selected in a rotation symmetrical manner such as in the form of a cone. At this time, only a single reflecting block 166 is available regardless of the number of the directions of incidence upon the substrate 11. Thus, it is also possible to form a single-crystalline thin film having a crystal structure other than a diamond structure according to the inventive apparatus, while it is also possible to form a single-crystalline thin film having various crystal orientations in a single crystal structure. Further, the material for forming the single-crystalline thin film is not restricted to Si since it is possible to cope with an arbitrary crystal structure, whereby it is possible to form a semiconductor single-crystalline thin film of GaAs or GaN, for example.

(2) In each of the ninth and tenth preferred embodiments, each rectifying member 168 for rectifying the directions of the atom current components may be interposed in a path of the atom current which is reflected by the reflector 169 and directed toward the substrate 11, in place of the path of the atom current directed from the reflecting block 166 toward the reflector 169. Further, the rectifying members 168 may be interposed in both of these paths.

On the other hand, the apparatus may not be provided with the rectifying members 168. When the apparatus is provided with the rectifying members 168, however, it is possible to precisely set the directions of incidence of the atom current components upon the substrate 11 without strictly setting the shapes, arrangement etc. of the reflecting blocks 166 and the reflectors 169.

The above also applies to the rectifying members 188 in the eleventh and twelfth preferred embodiments.

(3) In each of the fourth to eleventh preferred embodiments, the ECR ion source 2 may be replaced by another beam source for generating a neutral atom current or a neutral molecular flow, or a neutral radical flow. A beam source for generating such a neutral atom or radical current has already been commercially available. Since a neutral atom or radical beam can be obtained by such a beam source, it is possible to form a single-crystalline thin film on an insulating substrate 11 with no requirement for means for neutralizing an ion current, similarly to the case of employing the ECR ion source 2.

(4) In each of the fourth to twelfth preferred embodiments, the ECR ion source 2 may be replaced by another ion source such as a Cage type or Kaufmann type source. In this case, however, the flow of the as-generated ion current may be diffused by repulsive force by static electricity between ions to be weakened in directivity, and hence means for neutralizing the ions or means such as a collimator for improving directivity of the ion current is preferably interposed in the path of the ion current.

Particularly when the substrate 11 is made of an electrically insulating material, means for neutralizing ions is preferably interposed in the path of the ion current, in order to prevent the substrate 11 from accumulation of electric charges inhibiting progress of irradiation. In the apparatus according to each preferred embodiment comprising the ECR ion source 2, on the other hand, a neutral atom current can be easily obtained in a shape close to a parallel current with no means for neutralizing the ion current.

When means for neutralizing ions is set in the apparatus according to the twelfth preferred embodiment, the same is set downstream the electrostatic electrode 196.

(5) The beam irradiator described in each of the aforementioned preferred embodiments is not restricted to an apparatus for forming a single-crystalline thin film, but is also applicable to an apparatus for applying beams made from gas from a plurality of directions for another purpose. Particularly the apparatus shown in each of the ninth to twelfth preferred embodiments is suitable for a purpose of uniformly irradiating a wide substrate with beams from a plurality of directions.

(6) When the thin film to be formed contains N (nitrogen element) which is a gas under a normal temperature such as GaN in each of the fourth to twelfth preferred embodiments, the gas may be prepared from gaseous nitrogen. In this case, the characteristics of the thin film will not be deteriorated even if the gas remains in the thin film.

B. Preferred Embodiments in Relation to Selective Formation and Further Efficient Formation of Single-Crystalline Thin Film On the basis of the aforementioned method, description is now made on preferred embodiments in relation to methods enabling selective formation of single-crystalline thin films on specific regions of substrates and further efficient formation of single-crystalline thin films on substrates.

B-1. Thirteenth Preferred Embodiment

Figure 37:
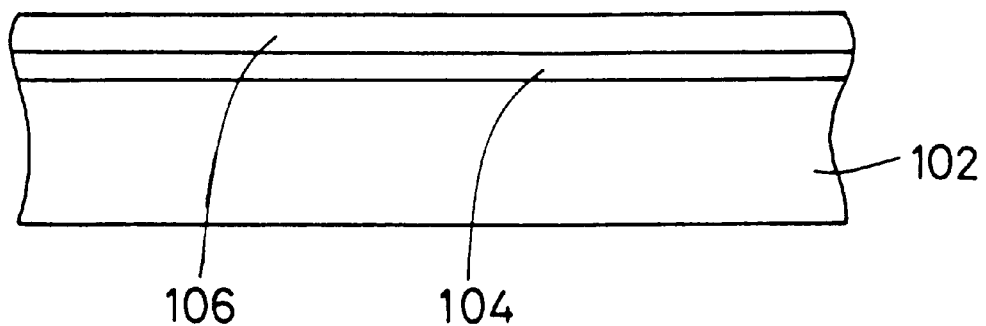
FIG. 37 is a process diagram showing a method according to a thirteenth preferred embodiment of the present invention.

FIGS. 37 to 42 are process diagrams in relation to a method according to a thirteenth preferred embodiment. First, an upper surface of an Si single-crystalline substrate 102 is oxidized to form an $SiO_2$ film 104 which is an insulator, as shown in FIG. 37. Further, an amorphous or polycrystalline Si thin film 106 is formed on the $SiO_2$ film 104 by CVD, for example.

Figure 38:
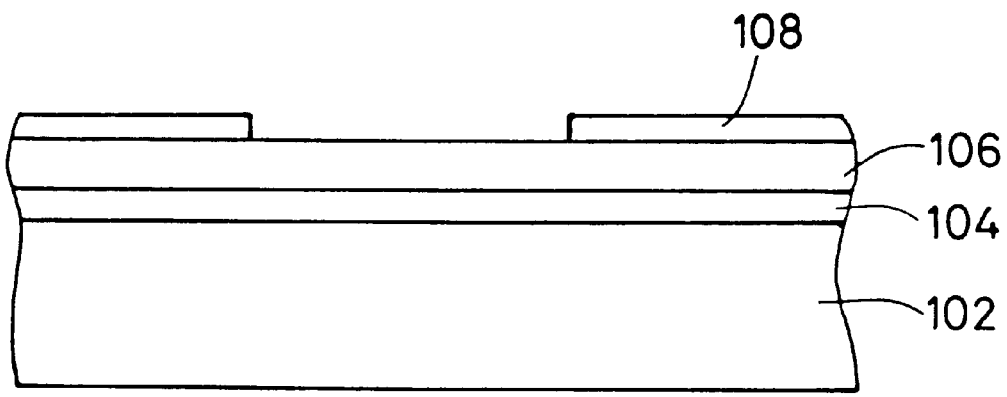
FIG. 38 is a process diagram showing the method according to the thirteenth preferred embodiment of the present invention.

Then, a thin film 108 of $SiO_2$ or $Si_3N_4$ is formed on the Si thin film 106 and thereafter this thin film 108 is selectively etched to form an opening in a desired specific region, as shown in FIG. 38. This thin film 108 having an opening serves as a masking material in a subsequent step. The selective etching is carried out by well-known photolithography sequentially through processes of resist application, pre-baking, exposure, development and post-baking. At this time, the exposure is carried out through a masking material having a prescribed pattern enabling selective etching, and separation of a resist material is carried out after the exposure. A portion of the Si thin film 106 which is exposed in the opening is subjected to washing by a method such as the so-called reverse sputtering or the like.

Figure 39:
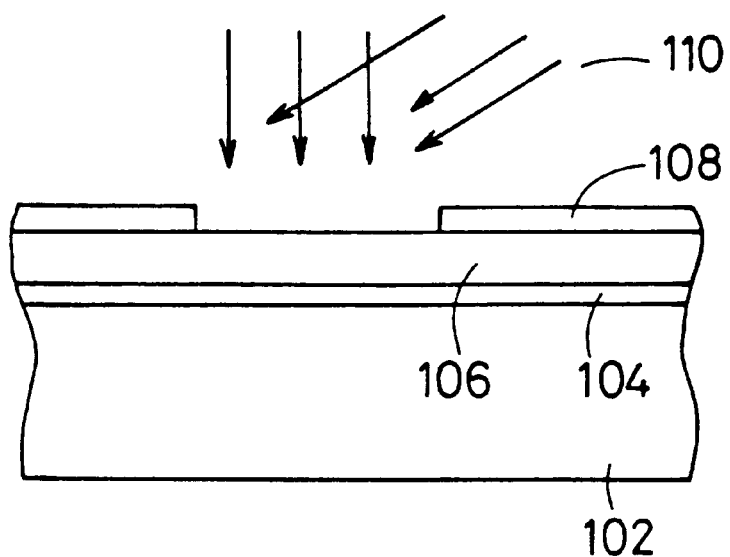
FIG. 39 is a process diagram showing the method according to the thirteenth preferred embodiment of the present invention.

Thereafter the apparatus 101 is employed to irradiate the overall upper surface of the Si single-crystalline substrate 102 with an Ne atom current 110 from directions which are perpendicular to a plurality of densest planes of a single-crystalline thin film to be formed with proper irradiation energy, as shown in FIG. 39. Ne atoms are lighter than Si which is an element forming the Si thin film 106 as irradiated and Si which has the maximum atomic weight among elements forming the masking material 108 as irradiated, whereby the same hardly remain in the masking material 108 and the Si thin film 106 following the irradiation.

Figure 40:
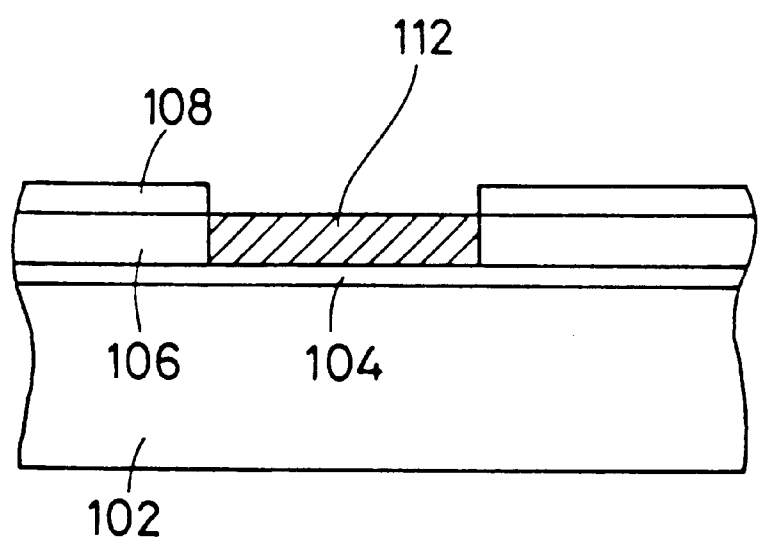
FIG. 40 is a process diagram showing the method according to the thirteenth preferred embodiment of the present invention.

The Si thin film 106 is selectively irradiated with the Ne atom current only in the opening of the masking material 108. Therefore, the Si thin film 106 is selectively converted to a single-crystalline layer 112 having a regulated crystal orientation in a region corresponding to the opening of the masking material 108, i.e., the aforementioned specific region, as shown in FIG. 40.

Figure 41:
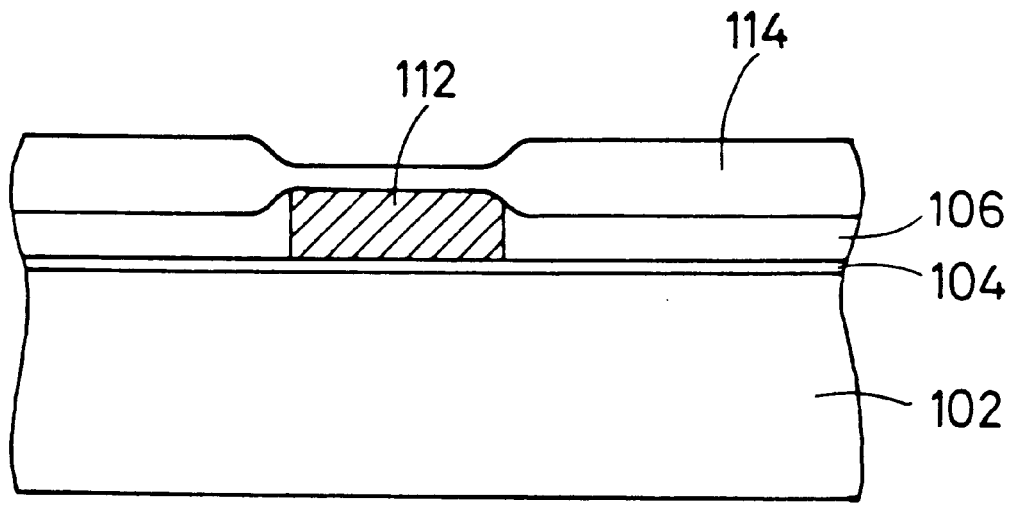
FIG. 41 is a process diagram showing the method according to the thirteenth preferred embodiment of the present invention.

Then, the masking material 108 is removed and the upper surface is thermally oxidized to form an oxide film 114, as shown in FIG. 41. In general, a reaction rate of thermal oxidation in an amorphous or polycrystalline layer is larger by 2 to 5 times than that in a single-crystalline layer. Therefore, a portion of the oxide film 114 located on the Si thin film 106 is larger in thickness by about 2 to 5 times than that located on the single-crystalline layer 112.

Figure 42:
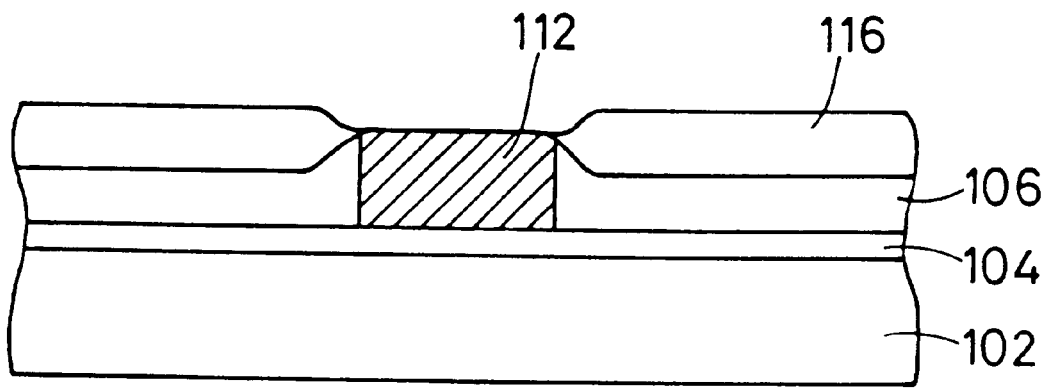
FIG. 42 is a process diagram showing the method according to the thirteenth preferred embodiment of the present invention.

Thereafter the overall upper surface of the oxide film 114 is properly etched to expose the upper surface of the single-crystalline layer 112, as shown in FIG. 42. At this time, the oxide film 116 remains on the Si thin film 106. The single-crystalline layer 112 can be provided with a desired element such as a transistor element, for example. At this time, the oxide film 116 serves as the so-called LOCOS (local oxidation of silicon) layer which isolates the element formed on the single-crystalline layer 112 from other elements. The Si single-crystalline substrate 102 itself is already provided therein with desired elements. Therefore, it is possible to implement a device having a three-dimensional structure by integrating a new element into the single-crystalline layer 112. In the method according to this preferred embodiment, the LOCOS layer is formed on an amorphous or polycrystalline layer, whereby the same can be efficiently formed in a short time, to improve the throughput in a thermal oxidation device.

In the method according to this preferred embodiment, further, a single-crystalline thin film can be formed on the $SiO_2$ film 104 which is an insulator, whereby the element provided in the Si single-crystalline substrate 102 can be easily isolated from a new element provided thereon.

B-2. Fourteenth Preferred Embodiment

Figure 43:
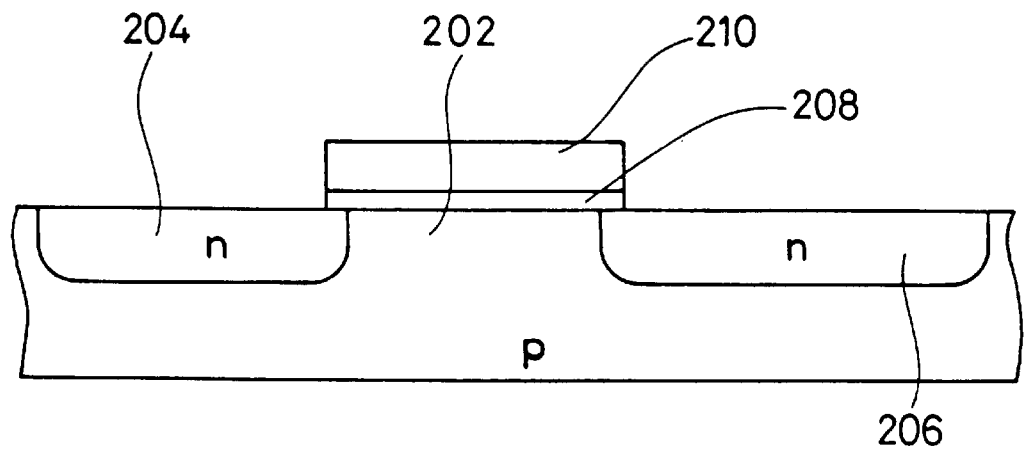
FIG. 43 is a process diagram showing a method according to a fourteenth preferred embodiment of the present invention.

FIGS. 43 to 51 are process diagrams in relation to a fourteenth preferred embodiment. As shown in FIG. 43, a transistor is previously formed on a single-crystalline Si substrate. Namely, n-type source and drain layers 204 and 206 which are isolated from each other are selectively formed on an upper surface of a p-type single-crystalline Si substrate 202. Further, a gate electrode 210 is formed on the upper surface of the substrate 202 in a region corresponding to that between these layers 204 and 206, through a gate oxide film 208. Namely, this transistor is an n-channel MOS transistor. The gate oxide film 208 is made of $SiO_2$, and the gate electrode 210 is made of polycrystalline Si.

Figure 44:
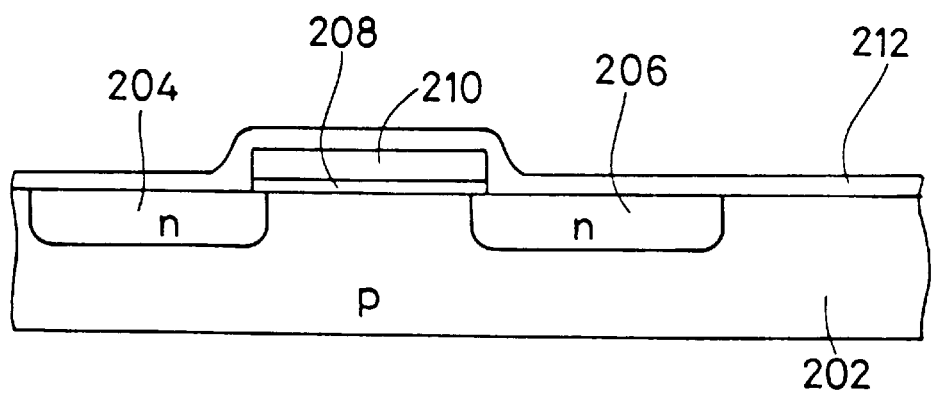
FIG. 44 is a process diagram showing the method according to the fourteenth preferred embodiment of the present invention.
Figure 45:
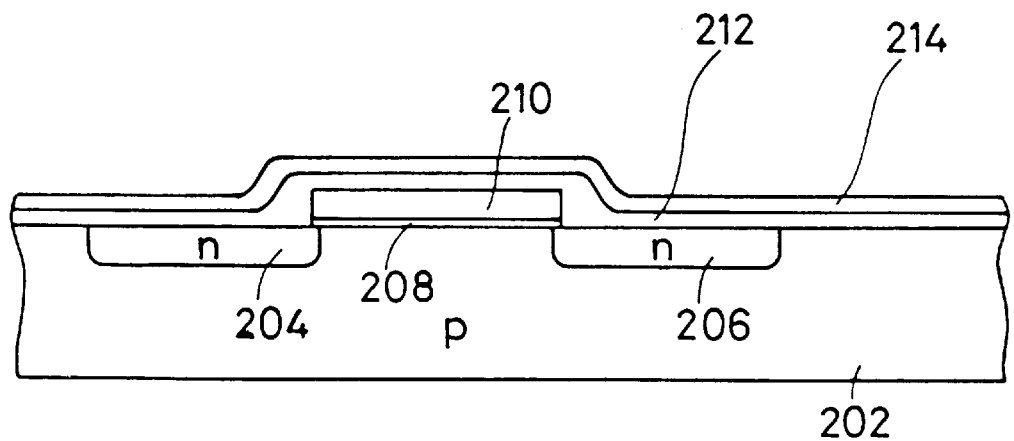
FIG. 45 is a process diagram showing the method according to the fourteenth preferred embodiment of the present invention.

Then, an insulating film 212 of $SiO_2$ is formed entirely over the upper surfaces of the substrate 202 and the gate electrode 210, as shown in FIG. 44. Thereafter an amorphous or polycrystalline Si film 214 is formed on the overall surface of the insulating film 212, as shown in FIG. 45.

Figure 46:
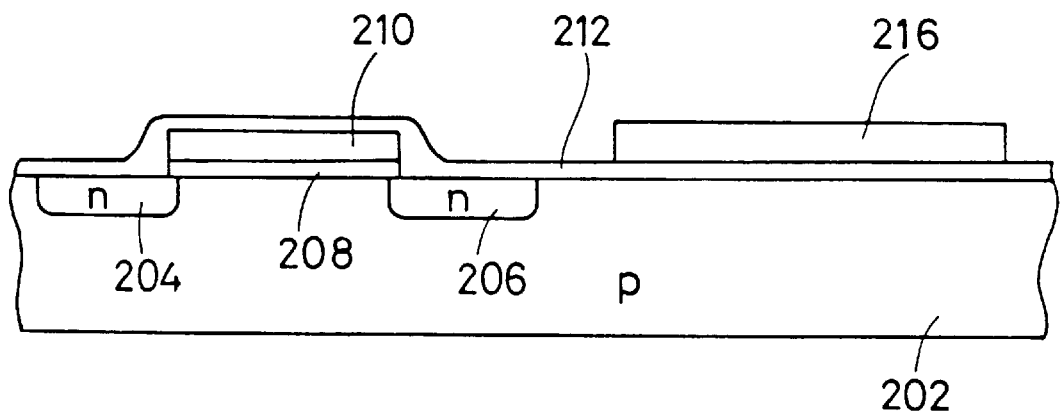
FIG. 46 is a process diagram showing the method according to the fourteenth preferred embodiment of the present invention.

Then, the Si film 214 is selectively etched to be left only in a desired specific region. FIG. 46 shows an Si film 216 which is defined in the specific region by the selective etching.

Figure 47:
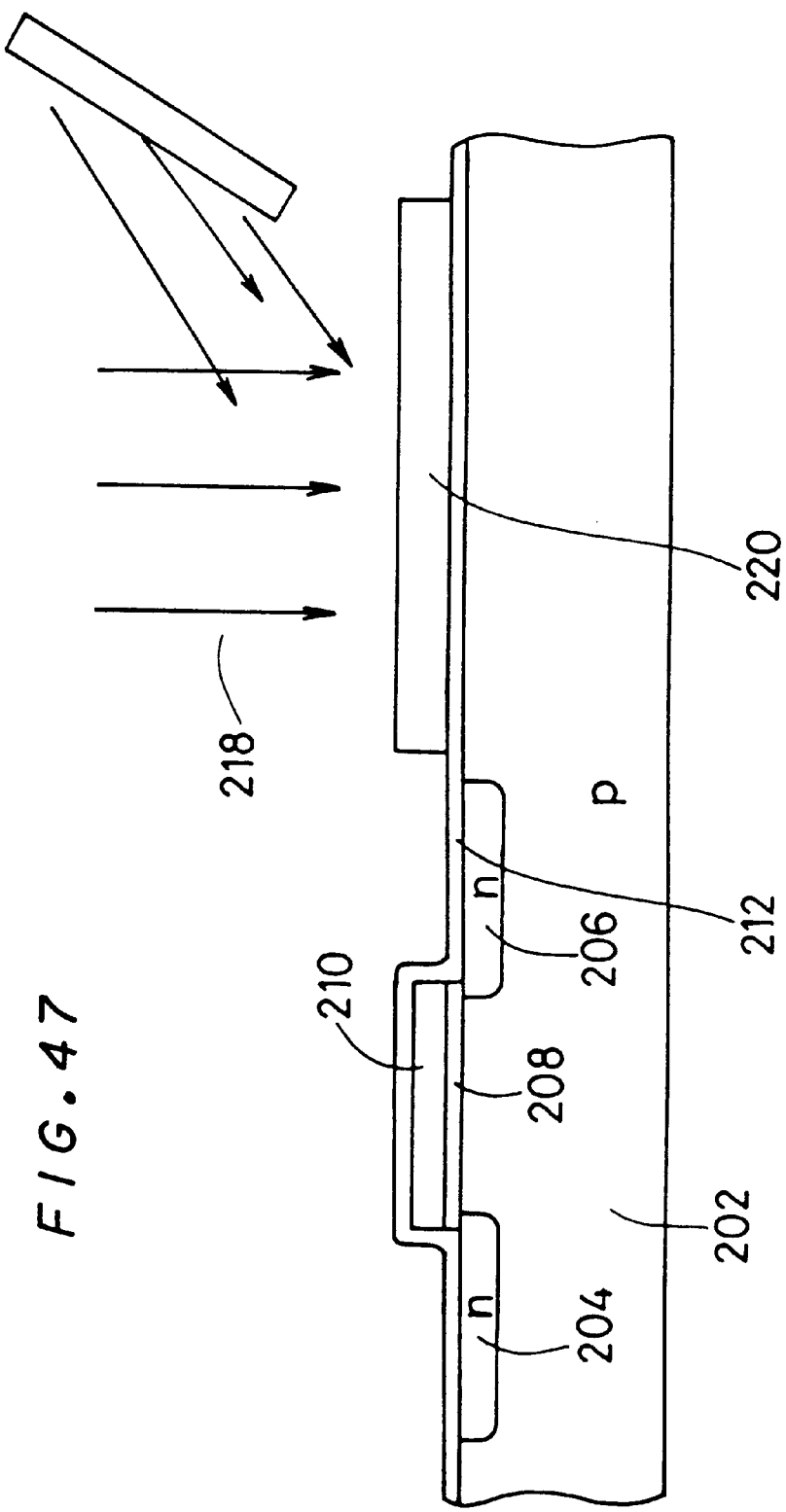
FIG. 47 is a process diagram showing the method according to the fourteenth preferred embodiment of the present invention.
Figure 48:
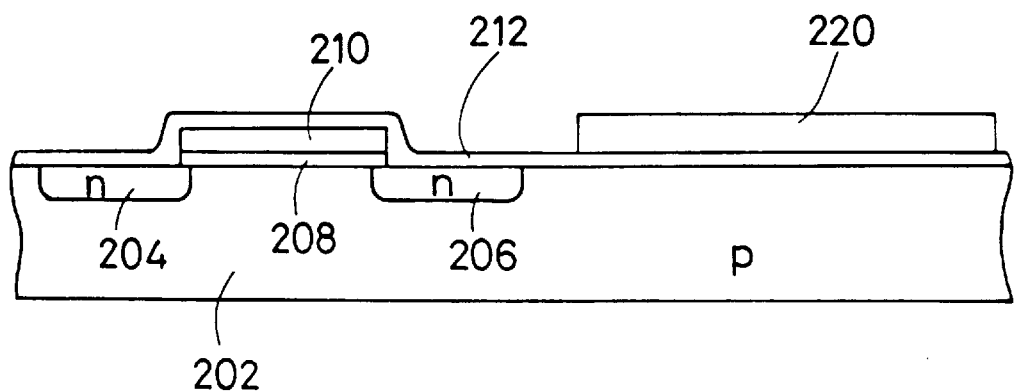
FIG. 48 is a process diagram showing the method according to the fourteenth preferred embodiment of the present invention.
Figure 49:
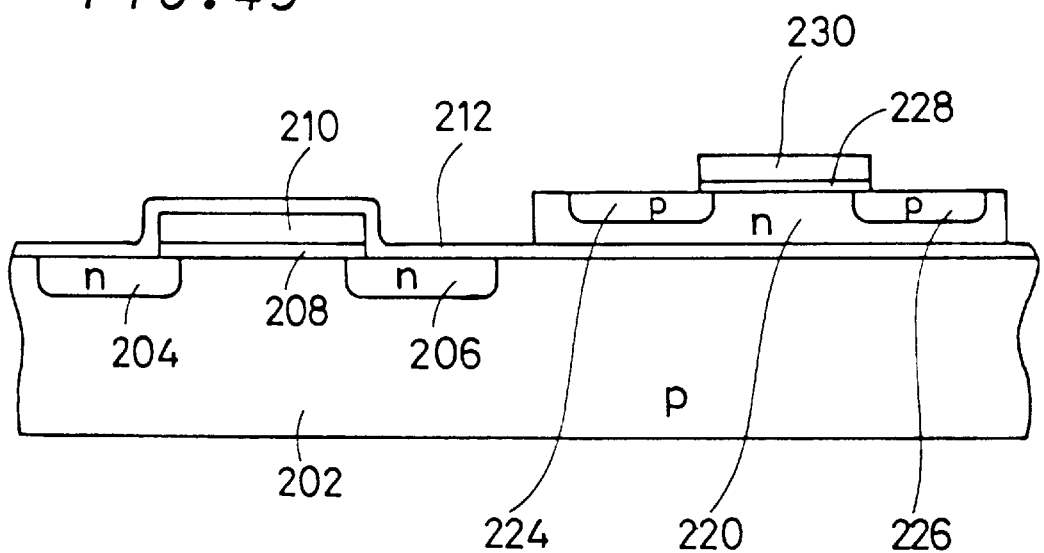
FIG. 49 is a process diagram showing the method according to the fourteenth preferred embodiment of the present invention.

Then, the apparatus 101 is employed to irradiate overall upper surfaces of the insulating film 212 and the Si film 216 with an Ne atom current 218 from directions which are perpendicular to a plurality of densest planes of a single-crystalline thin film to be formed with proper irradiation energy, as shown in FIG. 47. Ne atoms are lighter than Si forming the Si film 216 and the insulating film 212, whereby the same hardly remain in these layers following the irradiation. Due to this irradiation, the Si film 216 is converted to a single-crystalline Si thin film 220 having a regulated crystal orientation, as shown in FIG. 48. At this time, a region of the insulating film 212 which is exposed on the upper surface is also converted to a single-crystalline thin film.

Then, the single-crystalline Si thin film 220 is doped with an n-type impurity, to be converted to an n-type Si thin film, as shown in FIG. 48. Thereafter a gate oxide film 228 and a gate electrode 230 are selectively formed on the upper surface of the n-type single-crystalline thin film 220. Further, these are employed as masks to selectively dope the upper surface of the single-crystalline Si thin film 220 with a p-type impurity, thereby forming a drain layer 224 and a source layer 226. Namely, these layers are formed by self alignment. Due to this step, the single-crystalline Si thin film 220 forms a p-channel MOS transistor.

Figure 50:
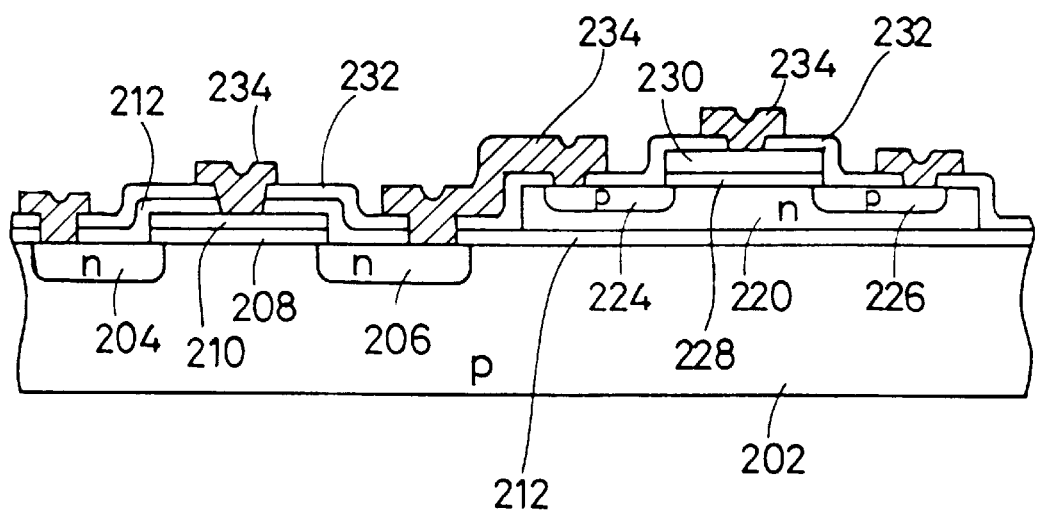
FIG. 50 is a process diagram showing the method according to the fourteenth preferred embodiment of the present invention.

Then, an insulating film 232 of $SiO_2$ or the like is formed over the entire upper surface. Then, desired portions of the insulating films 232 and 212 are selectively etched to form an opening serving as a contact hole. Further, a conductive wiring layer 234 of aluminum, for example, is applied onto the overall upper surface of the insulating film 232 including the contact hole, and thereafter the wiring layer 234 is selectively removed to couple the elements in a desired manner (FIG. 50).

As hereinabove described, it is possible to selectively form a single-crystalline layer on a desired specific region of the substrate 202 in the method according to this preferred embodiment. Further, it is possible to implement a device having a three-dimensional structure by forming a new element on the single-crystalline layer, since the substrate 202 itself is already provided with an element. In the method according to this preferred embodiment, a single-crystalline thin film can be formed on the insulating film 212 of $SiO_2$, whereby the element provided in the substrate 202 can be easily isolated from a new element provided thereon in the three-dimensional device.

Figure 51:
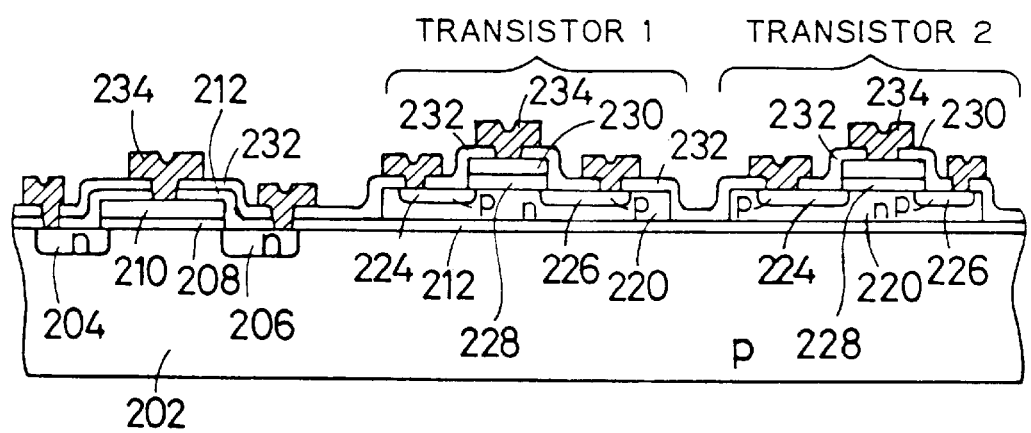
FIG. 51 is a process diagram showing the method according to the fourteenth preferred embodiment of the present invention.

Further, it is also possible to form a plurality of new elements on the substrate 202, as shown in FIG. 51. At this time, two new elements (two p-channel MOS transistors in FIG. 51) are provided in single-crystalline Si thin films 220 which are formed independently of each other. Thus, these elements can be easily isolated with no provision of a LOCOS layer or an isolation layer. Consequently, steps of manufacturing the device are simplified and the degree of integration of the elements is improved.

Although an n-type impurity is introduced into the selectively formed single-crystalline Si thin films 220 in the aforementioned preferred embodiment, the same may alternatively be introduced in the stage of the Si film 216, or into the overall surface of the Si film 214. In any method, it is possible to finally form the device of the three-dimensional structure shown in FIG. 50 or 51.

B-3. Fifteenth Preferred Embodiment

As hereinabove described, the Si film 214 (FIG. 45) is selectively removed to form the Si film 216 (FIG. 46) and thereafter an Ne atom current is applied (FIG. 47) to convert the same to the single-crystalline Si thin film 220 (FIG. 48).

Alternatively, the overall upper surface of the Si film 214 shown in FIG. 45 may be irradiated with the Ne atom current to be converted to a single-crystalline thin film, so that the Si film 214 is thereafter selectively removed to form the single-crystalline Si thin film 220 shown in FIG. 48. Subsequent steps are similar to those of the fourteenth preferred embodiment.

B-4. Sixteenth Preferred Embodiment

As hereinabove described, the amorphous or polycrystalline Si film 214 is previously formed (FIG. 45) and thereafter irradiated with the Ne atom current, to be converted to a single-crystalline thin film in the fifteenth preferred embodiment. Alternatively, the apparatus 100 may be employed after the step shown in FIG. 43 is completed to grow an amorphous Si thin film on the insulating film 212 while simultaneously carrying out application of an Ne atom current, thereby forming a single-crystalline Si thin film on the insulating film 212. Thereafter the single-crystalline Si thin film is selectively removed, to form the single-crystalline Si thin film 220 shown in FIG. 48. Subsequent steps are similar to those of the fourteenth and fifteenth preferred embodiments.

B-5. Seventeenth Preferred Embodiment

Figure 52:
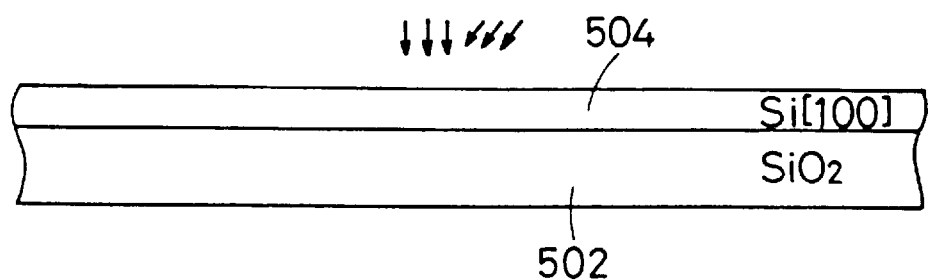
FIG. 52 is a process diagram showing a method according to a seventeenth preferred embodiment of the present invention.

FIGS. 52 to 60 are process diagrams in relation to a method according to a seventeenth preferred embodiment. As shown in FIG. 52, an amorphous or polycrystalline Si thin film is first formed on a substrate 502 which is made of $SiO_2$, by CVD or the like. Thereafter the apparatus 100 is employed to irradiate the Si thin film with an Ne atom current, thereby converting the Si thin film to a single-crystalline Si thin film 504 which is regulated in crystal orientation so that a (100) plane is exposed on the upper surface. Alternatively, the apparatus 101 may be employed in place of the apparatus 100, to grow an amorphous Si thin film on the substrate 502 while irradiating the same with an Ne atom current for forming the single-crystalline Si thin film 504.

Figure 53:
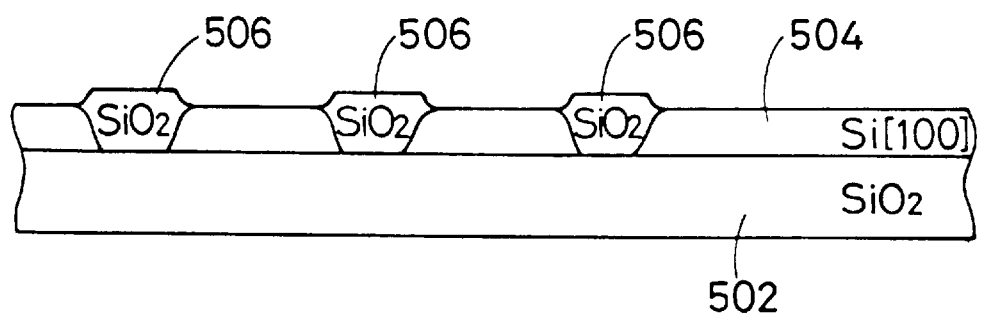
FIG. 53 is a process diagram showing the method according to the seventeenth preferred embodiment of the present invention.
Figure 54:
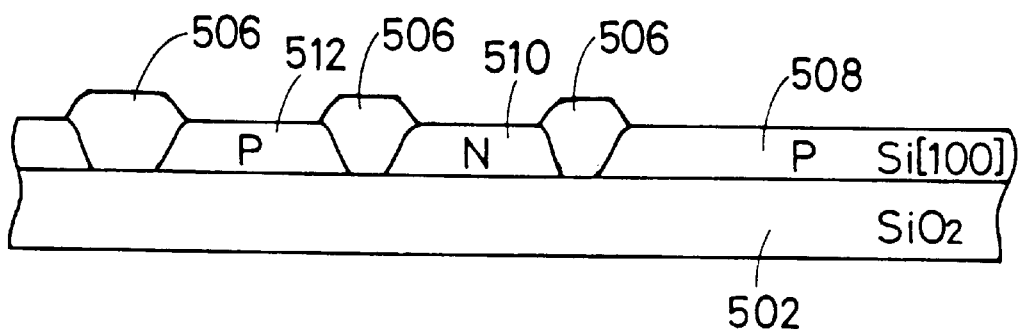
FIG. 54 is a process diagram showing the method according to the seventeenth preferred embodiment of the present invention.

Then, the upper surface of the single-crystalline Si thin film 504 is selectively thermally oxidized, to form LOCOS layers 506, as shown in FIG. 53. Thereafter p-type or n-type impurities are introduced into the respective ones of single-crystalline Si thin film regions 508, 510 and 512 which are isolated from each other by the LOCOS layers 506, thereby converting these single-crystalline Si thin film regions 508, 510 and 512 to p-type or n-type semiconductor regions, as shown in FIG. 54.

Figure 55:
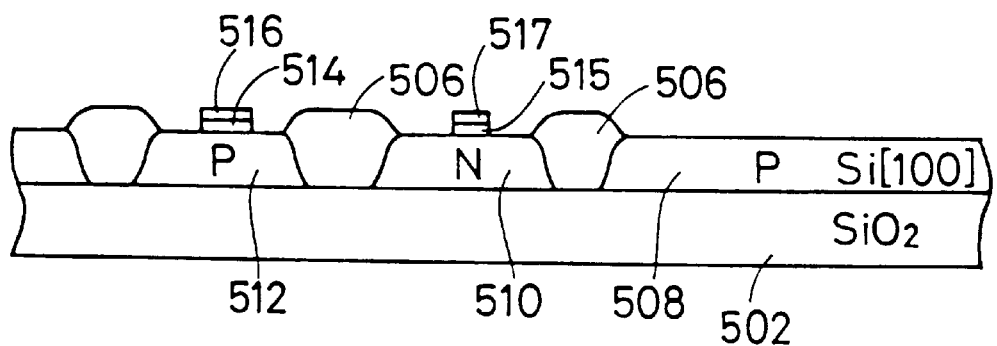
FIG. 55 is a process diagram showing the method according to the seventeenth preferred embodiment of the present invention.
Figure 56:
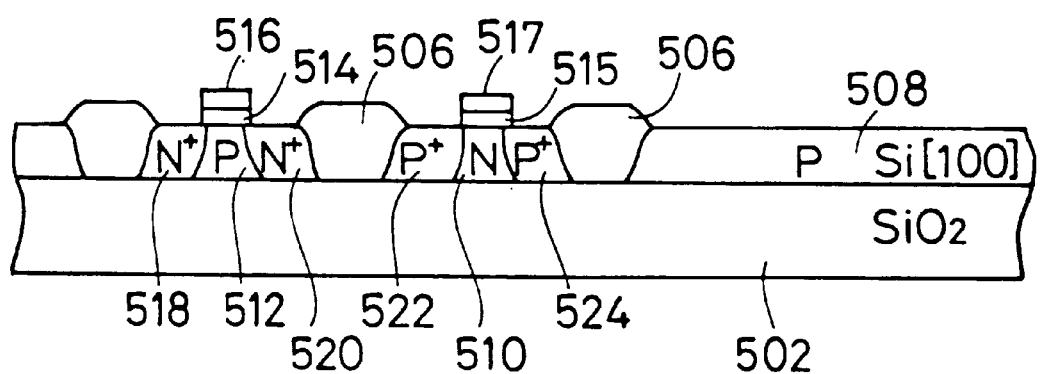
FIG. 56 is a process diagram showing the method according to the seventeenth preferred embodiment of the present invention.

Then, gate oxide films 514 and 515 of $SiO_2$ and gate electrodes 516 and 517 of polycrystalline Si are formed on the upper surfaces of the single-crystalline Si thin film regions 512 and 510 respectively, as shown in FIG. 55. Thereafter these gate oxide films 514 and 515 and gate electrodes 516 and 517 are used as masks to selectively introduce n-type and p-type impurities into the single-crystalline Si thin film regions 512 and 510 from the upper surfaces, as shown in FIG. 56. Consequently, source and drain layers are formed in the single-crystalline Si thin film regions 512 and 510 respectively.

Figure 57:
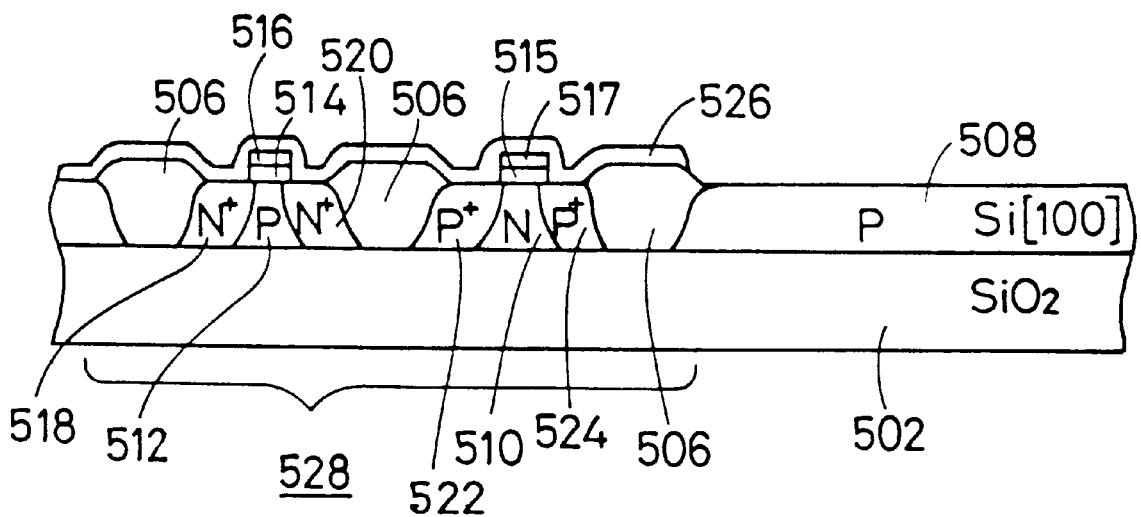
FIG. 57 is a process diagram showing the method according to the seventeenth preferred embodiment of the present invention.
Figure 58:
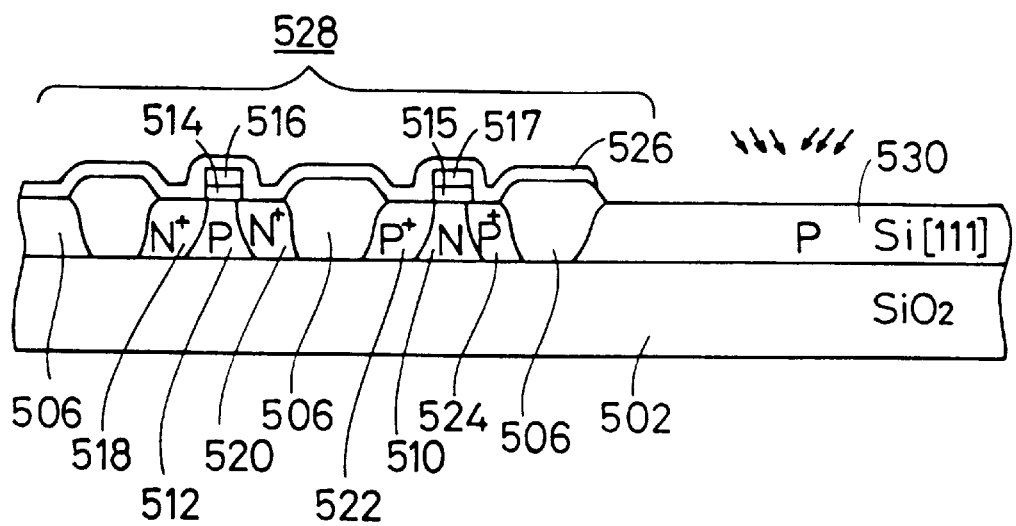
FIG. 58 is a process diagram showing the method according to the seventeenth preferred embodiment of the present invention.
Figure 59:
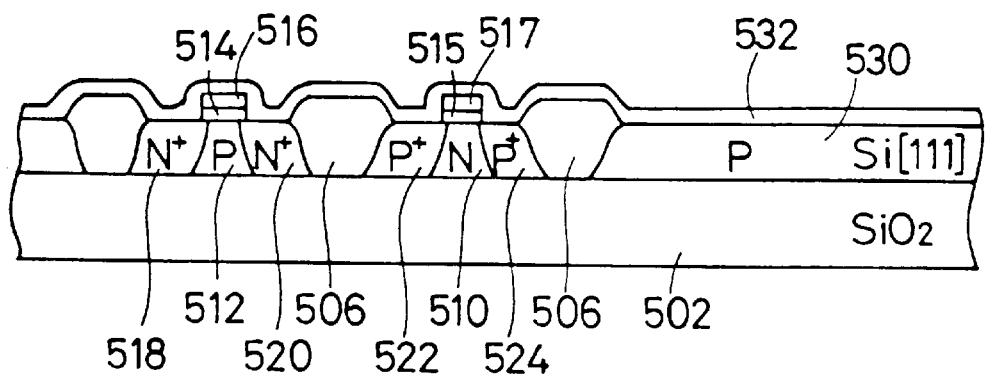
FIG. 59 is a process diagram showing the method according to the seventeenth preferred embodiment of the present invention.
Figure 60:
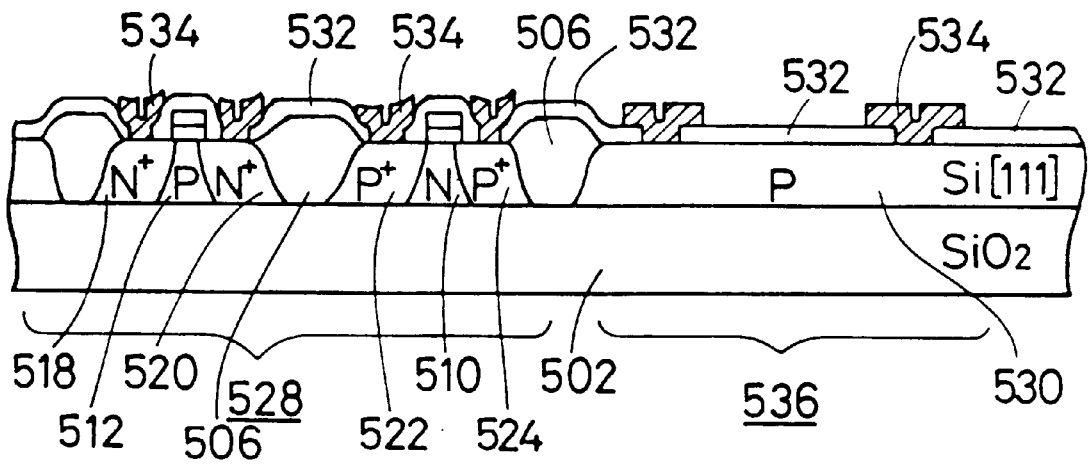
FIG. 60 is a process diagram showing the method according to the seventeenth preferred embodiment of the present invention.

Then, an insulating film 526 of $SiO_2$ is formed on an upper surface portion excluding the upper surface of the single-crystalline Si thin film region 508, as shown in FIG. 57. Thereafter the apparatus 101 is employed to apply an Ne atom current from the upper surface, as shown in FIG. 58. At this time, only the single-crystalline Si thin film region 508 which is not covered with the insulating film 526 of $SiO_2$ is selectively irradiated. Directions of irradiation are set in a plurality of directions which are perpendicular to a plurality of densest planes (111) of single-crystalline Si which is so oriented that one (111) plane is exposed on the upper surface. Thus, the single-crystalline Si thin film region 508 is converted to a single-crystalline Si layer 530 which is so regulated in crystal orientation that the (111) plane is exposed on the upper surface. Namely, the crystal orientation of the single-crystalline Si thin film region 508 is converted. The region 528 which is masked with the insulating film 526 of $SiO_2$ and not subjected to irradiation is a region to be provided with a CMOS element. On the other hand, the single-crystalline Si layer 530 which is converted in crystal orientation is provided with a pressure sensor, for example. Then, an insulating film 532 of $SiO_2$ is formed on the overall upper surface, as shown in FIG. 59. This insulating film 532 includes the insulating film 526. Thereafter a desired portion of the insulating film 532 is selectively etched to form an opening for serving as a contact hole. Further, a conductive wiring layer 534 of aluminum, for example, is applied to the overall upper surface of the insulating film 532 including the contact hole, and this wiring layer 534 is thereafter selectively removed to couple the elements in a desired manner (FIG. 60).

Due to the aforementioned steps, a CMOS 528 and a pressure sensor 536 are formed in the single-crystalline Si thin film 504 by single-crystalline Si materials having different crystal orientations in a parallel manner. The single-crystalline Si forming the CMOS 528 is preferably oriented so that a (100) plane is along the major surface of the substrate, while the single-crystalline Si forming the pressure sensor is preferably oriented so that the (111) plane is along the major surface of the substrate. In the method according to this preferred embodiment, it is possible to form a composite device in which a plurality of elements having different preferable crystal orientations are provided in the same single-crystalline Si thin film. In the method according to this preferred embodiment, further, it is possible to form an element which is made from single-crystalline Si on the substrate 502 of $SiO_2$, which is not a single crystal. Namely, this method has such an advantage that the material for the substrate is not limited.

B-6. Eighteenth Preferred Embodiment

Figure 61:
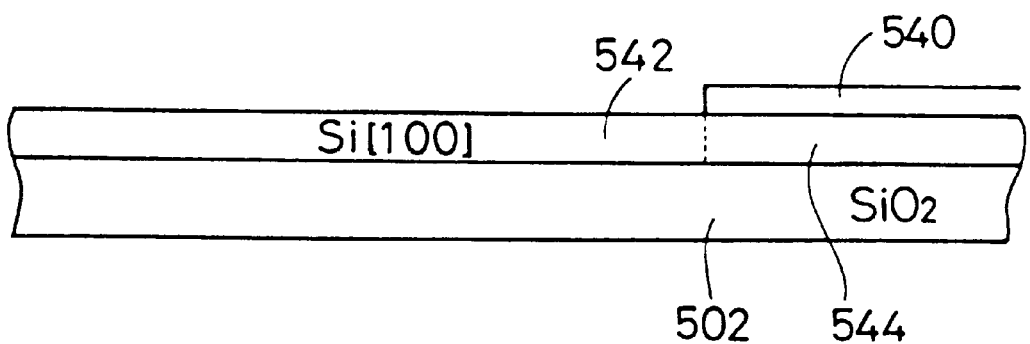
FIG. 61 is a process diagram showing a method according to an eighteenth preferred embodiment of the present invention.

As hereinabove described, an amorphous or polycrystalline Si thin film is formed on the substrate 502 by CVD or the like and thereafter the overall upper surface of this Si thin film is irradiated with an Ne atom current so that the overall region thereof is converted to the single-crystalline Si thin film 504 which is so oriented that the (100) plane is exposed on the upper surface (FIG. 52). Alternatively, a masking material 540 having a prescribed masking pattern may be formed on an upper surface to be thereafter irradiated with an Ne atom current, so that only a region of an Si thin film to be provided with a CMOS is selectively irradiated with the Ne atom current, as shown in FIG. 61. Thus, only the region to be provided with a CMOS is converted to a single-crystalline Si thin film 542 having an upper surface of a (100) plane, while another region 544 remains in the original state of the amorphous or polycrystalline Si thin film. Subsequent steps are similar to those of the seventeenth preferred embodiment.

The method according to the eighteenth preferred embodiment has an effect similar to that of the seventeenth preferred embodiment. Namely, it is possible to form a composite device in which a plurality of elements having different preferable crystal orientations are provided in the same single-crystalline Si thin film. Further, this preferred embodiment has such an advantage that the material for the substrate is not limited, similarly to the seventeenth preferred embodiment.

B-7. Nineteenth Preferred Embodiment

Figure 62:
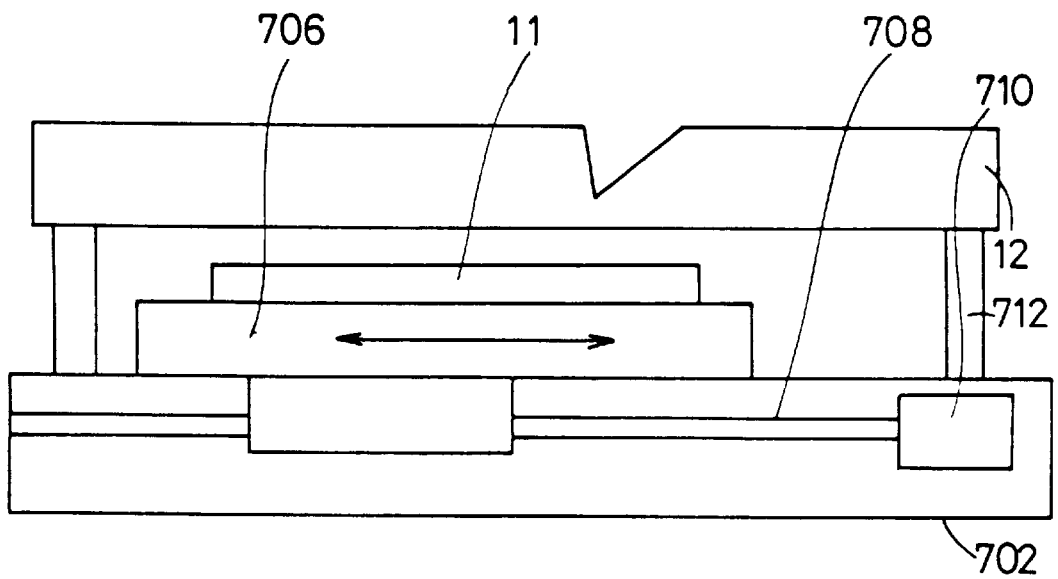
FIG. 62 is a front elevational view showing an apparatus according to a nineteenth preferred embodiment of the present invention.

FIG. 62 is a front elevational view showing the structure of a sample holder in an apparatus for forming a single-crystalline thin film according to a nineteenth preferred embodiment of the present invention. This sample holder is assembled into the apparatus 100 in place of the sample holder 10. In this sample holder, a reflector 12 is fixed to a fixed table 702 through supports 712. Further, a movable table 706 is horizontally slidably supported by the fixed table 702. A seating portion of this movable table 706 is fitted with a screw 708 which is rotated/driven by a motor 710, to be horizontally moved following rotation of the screw 708. This seating portion is provided with a horizontal driving mechanism (not shown) having a motor and a screw similarly to the fixed table 702, to horizontally drive an upper member of the movable table 706. A direction for sliding the seating portion is perpendicular to that for sliding the upper member. A substrate 11 to be irradiated is placed on the upper member. This substrate 11 is located under the reflector 12.

Figure 63:
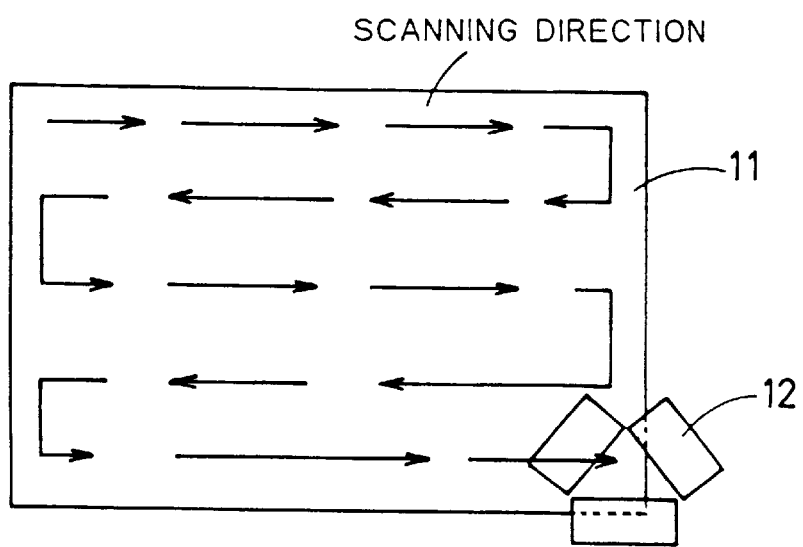
FIG. 63 is a plan view showing the apparatus according to the nineteenth preferred embodiment of the present invention.

FIG. 63 is a plan view typically showing an operation of this sample holder. The substrate 11 is relatively scanned with respect to the reflector 12 along two orthogonal directions by action of the two horizontal driving mechanisms. Therefore, it is possible to homogeneously irradiate the overall surface of the substrate 11, which has a wider area as compared with an opening of the reflector 12 serving as an opening for passing beams, with the beams.

Figure 64:
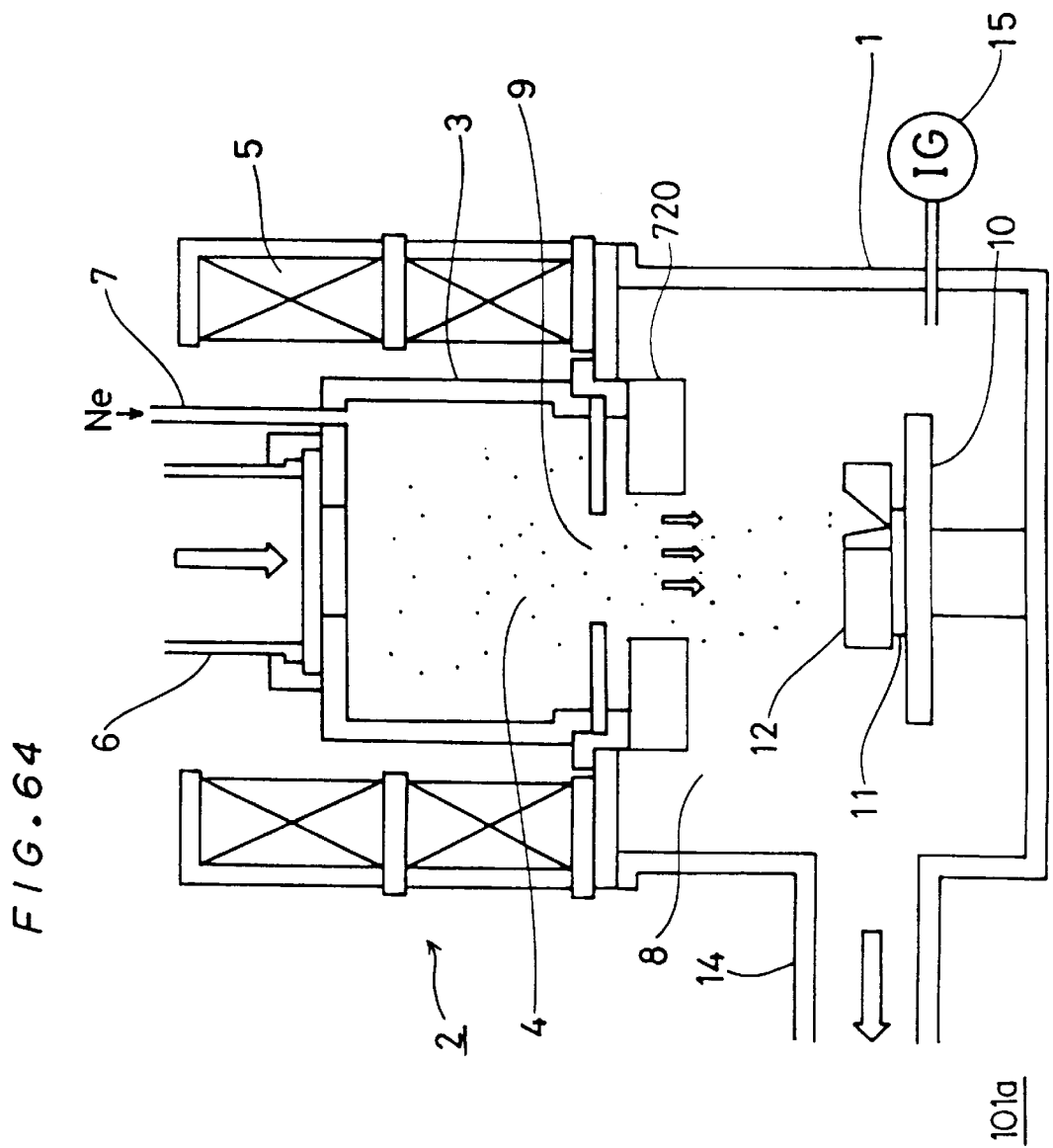
FIG. 64 is a front sectional view showing the apparatus according to the nineteenth preferred embodiment of the present invention.
Figure 65:
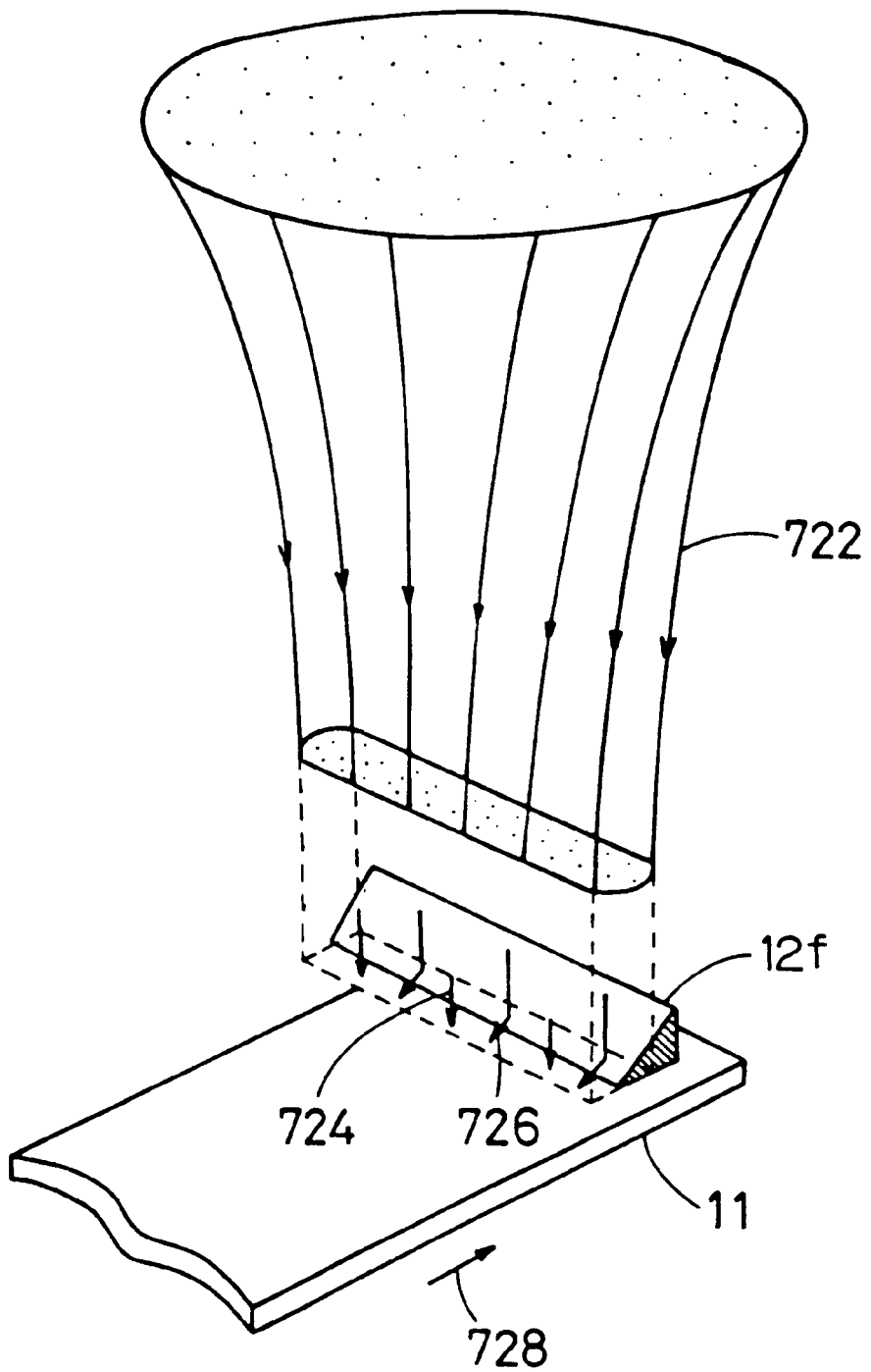
FIG. 65 is a perspective view showing the apparatus according to the nineteenth preferred embodiment of the present invention.

When this sample stand is employed, it is possible to efficiently apply the beams by employing an apparatus 101a for forming a single-crystalline thin film which comprises a magnetic lens 720, as shown in FIG. 64. The magnetic lens 720 is adapted to focus an ion current which is downwardly sprayed from an ion source 2 into the form of a strip. FIG. 65 is a model diagram showing such a state that an ion current is focused by the magnetic lens 720. Due to the action of the magnetic lens 720, the ion current has a strip-type sectional shape in the vicinity of the reflector 12f. Therefore, the reflector 12f also has a shape along this strip. Similarly to those in the apparatuses 100 and 101, the ion current is substantially converted to a neutral atom current in the vicinity of the reflector 12f. The substrate 11 is irradiated with components 726 of the atom current reflected from the reflector 12f and directly incident components 724. The angle of inclination of the reflector 12f is so adjusted that directions of incidence of these two components are orthogonal to a plurality of densest planes of a single-crystalline thin film to be formed respectively.

It is possible to efficiently irradiate a wide region on the substrate 11 in single scanning, by scanning the substrate 11 in a direction 728 which is perpendicular to the "strip of the atom current". Therefore, it is possible to attain irradiation of the substrate 11 having a wide area in a small number of scanning times. In other words, it is possible to form a single-crystalline thin film with higher efficiency by employing the apparatus 101a. This is particularly effective when the width of the substrate 11 is shorter than a major axis width of the "strip of the atom current". At this time, the substrate 11 may simply be scanned along one direction 728, whereby a single-crystalline thin film can be further efficiently formed. Further, the driving mechanism provided in the sample holder is sufficiently implemented only by a single driving mechanism which is integrated in the fixed table 702, whereby the sample holder is simplified in structure.

B-8. Twentieth Preferred Embodiment

Figure 66:
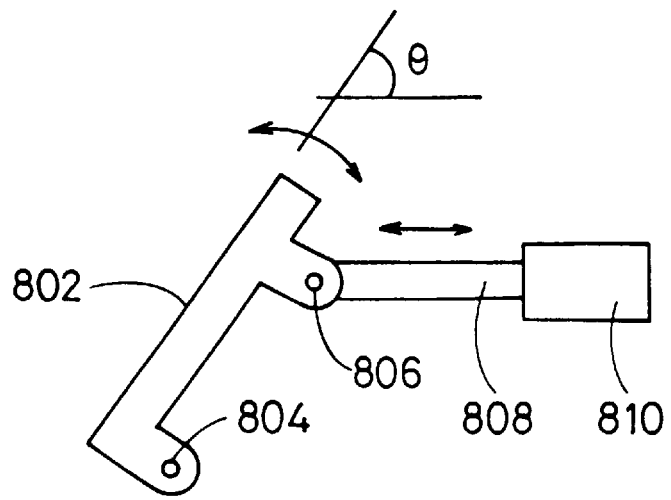
FIG. 66 is a front elevational view showing an apparatus according to a twentieth preferred embodiment of the present invention.

FIG. 66 is a front elevational view typically showing the structure of a reflector support which is provided in an apparatus for forming a single-crystalline thin film according to a twentieth preferred embodiment of the present invention. This reflector support rotatably supports an end of a reflector 802 by a hinge 804, while rotatably supporting another end by another hinge 806 which is provided on the forward end of a connecting bar 808. The connecting bar 808 is axially driven by a piston 810. Following the axial movement of the connecting bar 808, the reflector 802 is rotated about the hinge 804. Consequently, an angle θ of inclination of a reflecting surface is changed in the reflector 802. Namely, the angle of inclination is variable in the reflecting surface of the reflector 802 provided in this apparatus. Thus, it is possible to form single-crystalline thin films having various crystal orientations and crystal structures by employing a single apparatus. Namely, formation of various types of single-crystalline thin films can be economically attained.

Further, it is possible to efficiently form various types of single-crystalline thin films on a single substrate 11. This is because various types of single-crystalline thin films can be formed while inserting the substrate 11 in the apparatus. It is possible to instantaneously set a prescribed angle of inclination by controlling the operation of the piston 810 by a computer.

B-9. Twenty-first Preferred Embodiment

Figure 67:
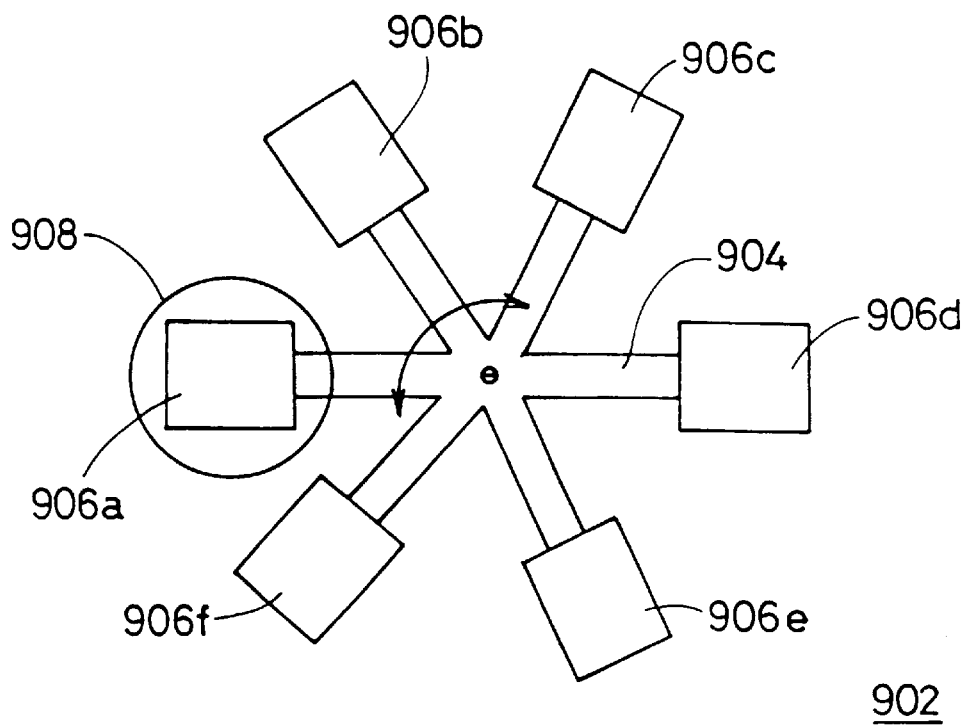
FIG. 67 is a plan view showing an apparatus according to a twenty-first preferred embodiment of the present invention.

FIG. 67 is a plan view typically showing the structure of a reflector support 902 which is provided in an apparatus for forming a single-crystalline thin film according to a twenty-first preferred embodiment of the present invention. This reflector support 902 comprises a plurality of arms 904 which are rotated/driven about vertical axes. Each one of a plurality of reflectors 906a to 906f, which are different from each other, is mounted on a forward end portion of each arm 904. The plurality of reflectors 906a to 906f are so formed that numbers or angles of incidence of atom current components which are incident upon a substrate 11 are different from each other. Namely, the reflectors 906a to 906f are different from each other in numbers of reflecting surfaces and angles of inclination. Since the arms 904 are rotated/driven, it is possible to arbitrarily select a desired reflector to be set in an irradiated region 908 which is irradiated with the atom current from the plurality of types of reflectors 906a to 906f.

Therefore, it is possible to form single-crystalline thin films having various crystal orientations and crystal structures only by a single apparatus, similarly to the apparatus according to the twentieth preferred embodiment. Namely, it is possible to economically form various types of single-crystalline thin films. Further, it is possible to efficiently form various types of single-crystalline thin films on a single substrate 11.

B-10. Twenty-second Preferred Embodiment

The reflector(s) and the reflector support provided in each of the nineteenth to twenty-first preferred embodiments can also be employed in the apparatus 101, in place of the apparatus 100. Namely, the reflector(s) and the reflector support can be applied to both of an apparatus for forming an amorphous or polycrystalline thin film and thereafter converting the same to a single-crystalline film and an apparatus for simultaneously carrying out these operations.

B-11. Twenty-third Preferred Embodiment

Figure 68:
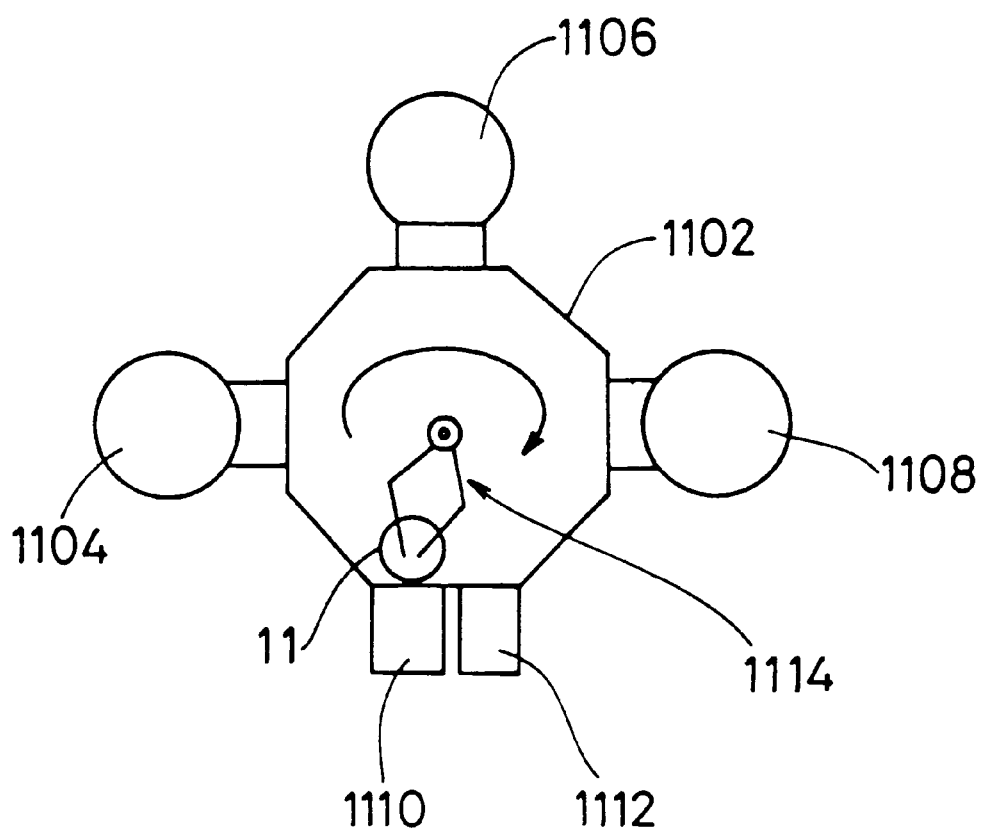
FIG. 68 is a plan view showing an apparatus according to a twenty-third preferred embodiment of the present invention.

FIG. 68 is a plan view typically showing the structure of an apparatus for forming a single-crystalline thin film according to a twenty-third preferred embodiment of the present invention. In this apparatus, an etching unit portion 1104 for etching a substrate 11, a film forming unit portion 1106 for forming an amorphous or polycrystalline thin film on the substrate 11, and an irradiation unit portion 1108 for irradiating the substrate 11 with an atom current are arranged around a carrier chamber 1102. Further, treatment chambers for storing the substrate 11 in the respective unit portions 1104, 1106 and 1108 communicate with each other through the carrier chamber 1102. The carrier chamber 1102 is provided with an inlet 1110 and an outlet 1112 for receiving and discharging the substrate 11 respectively. Both of the inlet 1110 and the outlet 1112 are provided with airtight switchable doors (not shown). The carrier chamber 1112 is provided with a carrier robot 1114, which receives and discharges the substrate 11 while automatically inserting and extracting the same into and from the respective treatment chambers.

In the apparatus according to this preferred embodiment, the respective treatment chambers communicate with each other, whereby it is possible to immediately start formation of a thin film after carrying out etching for removing an oxide film before forming a thin film on the substrate 11 while preventing new progress of oxidation. Thus, it is possible to reliably form a thin film having excellent and homogeneous characteristics while efficiently carrying out respective treatments. Further, it is possible to efficiently carry the substrate 11 into the respective treatment chambers due to provision of the carrier robot 1114.

B-12. Twenty-fourth Preferred Embodiment

FIG. 69 is a front sectional view typically showing the structure of an apparatus for forming a single-crystalline thin film according to a twenty-fourth preferred embodiment of the present invention. This apparatus comprises two ECR ion sources 1204a and 1204b, in place of the reflector 12. Namely, atom currents which are supplied from the ECR ion sources 1204a and 1204b are directly incident upon the upper surface of a substrate 11. These ECR ion sources 1204a and 1204b are set to have prescribed angles with respect to the major surface of the substrate 11. Consequently, the atom currents are incident upon the upper surface of the substrate 11 in directions of incidence which are perpendicular to a plurality of densest planes of a single-crystalline thin film to be formed. It is possible to form a single-crystalline thin film on the substrate 11 also by employing such an apparatus having a plurality of beam sources, in place of the apparatus 100 comprising the reflector 12.

In this apparatus, a mechanism for adjusting the attitude of the substrate 11 is further added to a sample holder 1208 which is set in a treatment chamber 1202. Namely, the sample holder 1208 is rotatable in a horizontal plane, whereby it is possible to rotate the substrate 11 for directing an orientation flat 11a, which may be provided in the substrate 11, to a prescribed direction. When the substrate 11 which is placed on a carrier unit 1206 is carried through an inlet 1204 provided on a side surface of the treatment chamber 1202 of this apparatus and placed on the sample holder 1208, optical means detects the direction of the orientation flat 11a and the sample holder 1208 is rotated by a prescribed amount in order to correct the direction to a prescribed one. The amount of rotation is calculated by a control unit part (not shown) storing a computer therein.

The direction of the orientation flat 11a generally has a constant relation to the crystal orientation of a single-crystalline layer forming the substrate 11. Therefore, it is possible to set the crystal orientation of the single-crystalline layer forming the substrate 11 and that of a single-crystalline thin film to be newly formed thereon regularly in a desired relation by setting the orientation flat 11a in a prescribed direction. Thus, it is also possible to epitaxially form a new single-crystalline thin film on the single-crystalline layer forming the substrate 11, for example, by employing this apparatus.

Figure 70:
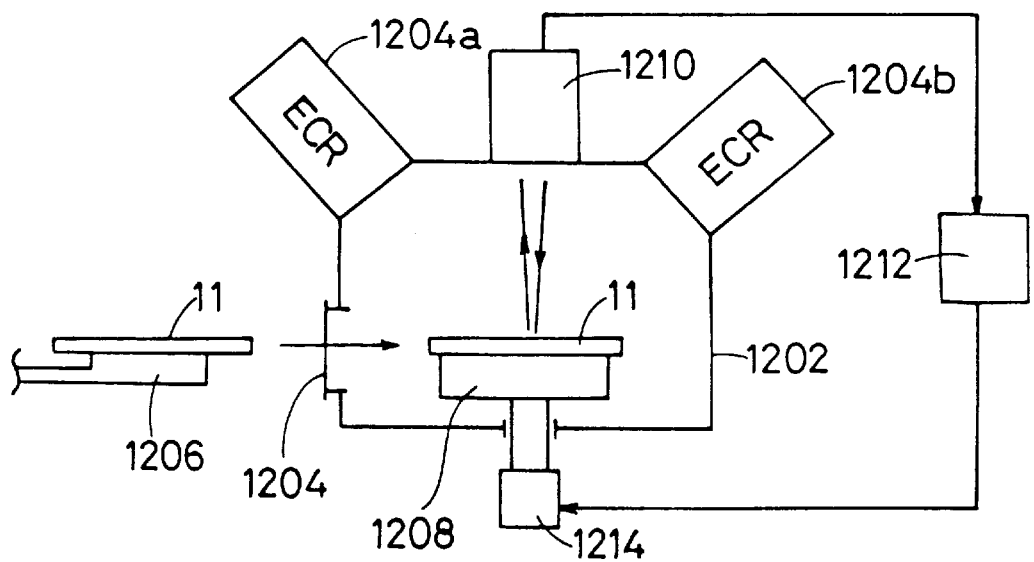
FIG. 70 is a front sectional view showing another apparatus according to the twenty-fourth preferred embodiment of the present invention.

FIG. 70 is a front sectional view typically showing the structure of another apparatus for forming a single-crystalline thin film according to the twenty-fourth preferred embodiment of the present invention. Also in this apparatus, it is possible to horizontally rotate a substrate 11 to adjust its attitude. Namely, a sample holder 1208 can be horizontally rotated by a rotation driving part 1214. This apparatus further comprises a crystal orientation detecting unit portion 1210 for detecting the crystal orientation of the substrate 11 having a single-crystalline structure. The crystal orientation detecting unit portion 1210 has a function of irradiating the surface of the substrate 11 with X-rays, for example, and catching a diffraction image thereof. An electric signal expressing the diffraction image obtained by the crystal orientation detecting unit portion 1210 is transmitted to a control part 1212 storing a computer therein. The control part 1212 decodes the diffraction image from this signal to calculate the crystal orientation in the substrate 11 while calculating a difference between the same and a desired crystal orientation, and instructs an angle of rotation for correcting the orientation to the rotation driving part 1214. The rotation driving part 1214 rotates the sample holder 1208 along the instruction. The aforementioned operation eliminates the difference, to regularly set the crystal orientation of the single-crystalline layer forming the substrate 11 and that of the single-crystalline thin film to be newly formed thereon in a desired relation.

The apparatus shown in FIG. 70 has such an advantage that the crystal orientation can be adjusted with respect to an arbitrary single-crystalline substrate having no orientation flat 11a, dissimilarly to the apparatus shown in FIG. 69. Considering that the relation between the crystal orientation of the substrate 11 and the direction of the orientation flat 11a is not accurate in general, it can be said that the apparatus shown in FIG. 70 can adjust the crystal orientation in higher accuracy as compared with the apparatus shown in FIG. 69.

B-13. Twenty-fifth Preferred Embodiment

Figure 71:
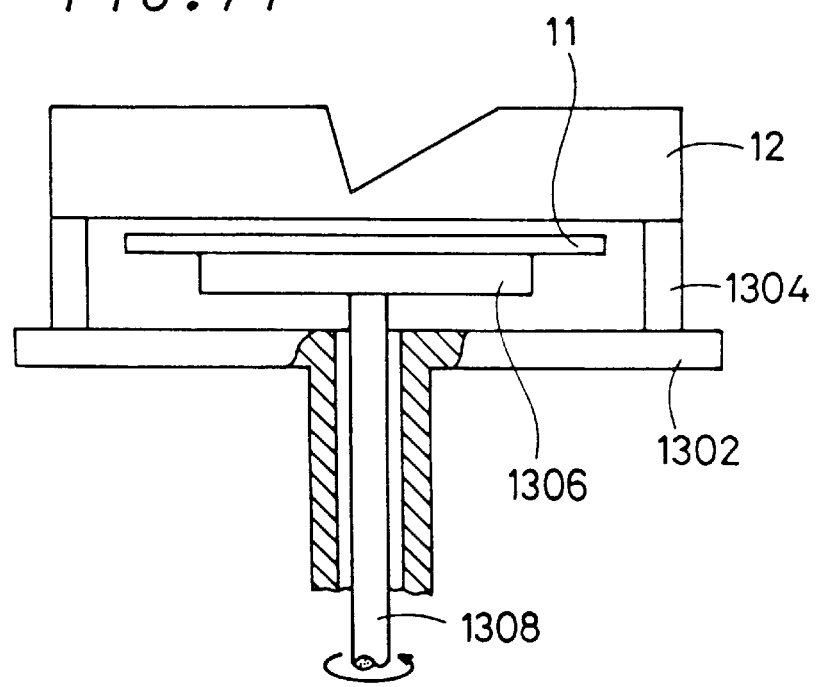
FIG. 71 is a partially fragmented sectional view showing an apparatus according to a twenty-fifth preferred embodiment of the present invention.

FIG. 71 is a partially fragmented front elevational view typically showing a sample holder which is provided in an apparatus for forming a single-crystalline thin film according to a twenty-fifth preferred embodiment of the present invention. This sample holder is employed along with the apparatus 101. Namely, this sample holder is employed in an apparatus for growing an amorphous or polycrystalline thin film by supplying a reaction gas onto a substrate 11 while irradiating the same with an atom current. In this sample holder, a reflector 12 is fixedly supported on a fixed table 1302 through a support 1304. A rotatable table 1306 for receiving the substrate 11 is connected with a rotary shaft 1308, which is rotated/driven by an rotation/driving unit portion (not shown) thereby rotating the rotatable table 1306. Upon such rotation of the rotatable table 1306, the substrate 11 which is placed thereon is rotated. It is possible to eliminate inhomogeneity appearing in the thickness of the as-grown thin film due to inhomogeneity in a reaction system, i.e., inhomogeneity in distribution of a reaction gas onto the substrate 11 or that in temperature distribution on the substrate 11 by rotating the substrate 11 and properly changing its direction. On the other hand, relative positions of the reflector 12 and the substrate 11 are changed upon rotation of the substrate 11. When this sample holder is employed, therefore, application of the atom current is intermittently carried out so that the direction of the substrate 11 is changed to carry out only growth of a thin film, i.e., only film formation, with limitation to irradiation pauses. Further, the direction of the substrate 11 is returned to the original one before next irradiation is started. These operations are repeated to carry out film formation and conversion to a single crystal.

Figure 72:
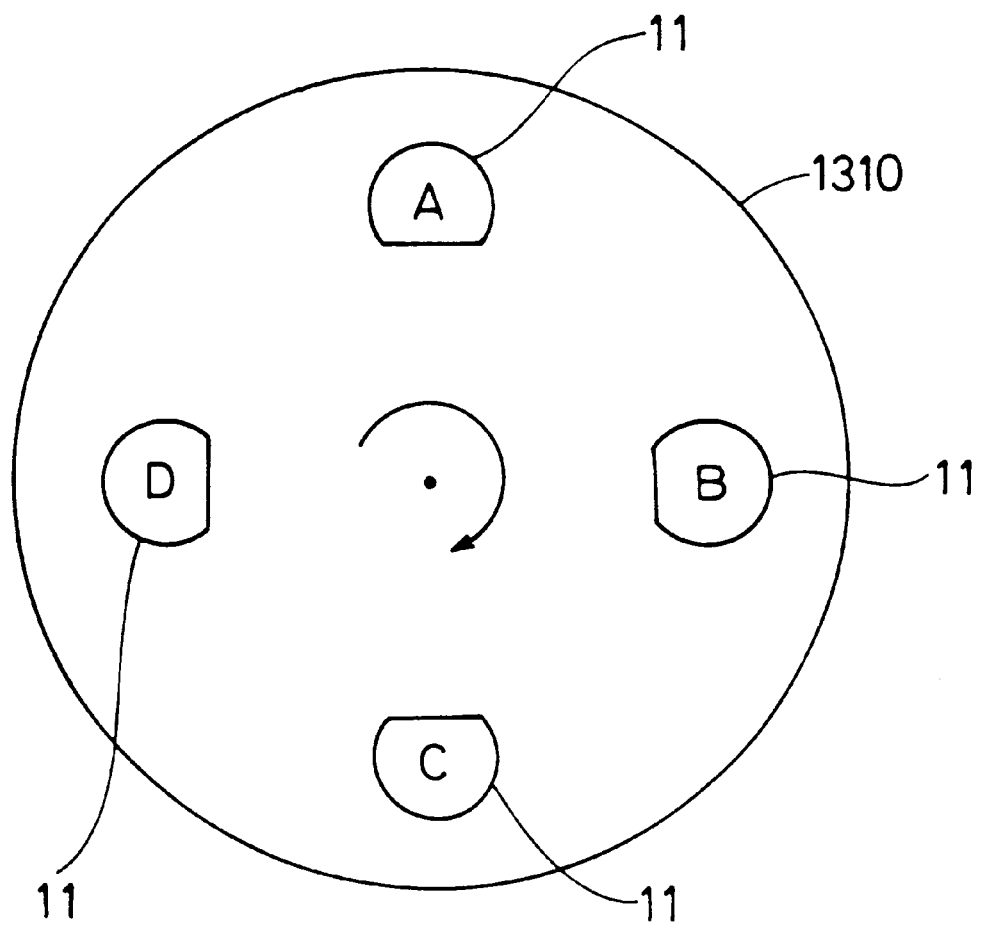
FIG. 72 is a plan view showing another apparatus according to the twenty-fifth preferred embodiment of the present invention.

FIG. 72 is a plan view typically showing another example of the sample holder. This sample holder is adapted to implement treatment of the substrate 11 in a batch processing system, and employed in combination with the apparatus 100. In this sample holder, substrates 11 to be treated are placed on peripheral portions of a rotary shaft of a rotatable table 1310. FIG. 72 illustrates such an example that four substrates 11 are placed. Among these substrates 11, only that provided in a position of "A" in FIG. 72, for example, is irradiated with an atom current. A reaction gas is supplied in all positions "A" to "D".

When the rotatable table 1310 is intermittently rotated, the substrate 11 occupying the position "A" is subjected to both of irradiation and supply of the reaction gas. Namely, film formation and single crystallization progress at the same time. In the respective ones of the remaining positions "B" to "D", only supply of the reaction gas is carried out with progress of only film formation. Further, the directions of the substrates 11 are varied with the positions "A" to "D". When the substrates 11 successively itinerate the positions "A" to "D", therefore, it is possible to eliminate inhomogeneity in degree of film formation caused by inhomogeneity in a reaction system. Namely, it is possible to form a single-crystalline thin film having a uniform thickness on each substrate 11 also by employing this sample holder. Further, it is possible to regularly carry out irradiation with an atom current in the position "A". Therefore, it is possible to further efficiently form a single-crystalline thin film as compared with a case of employing the sample holder shown in FIG. 71.

B-14. Twenty-sixth Preferred Embodiment

Figure 73:
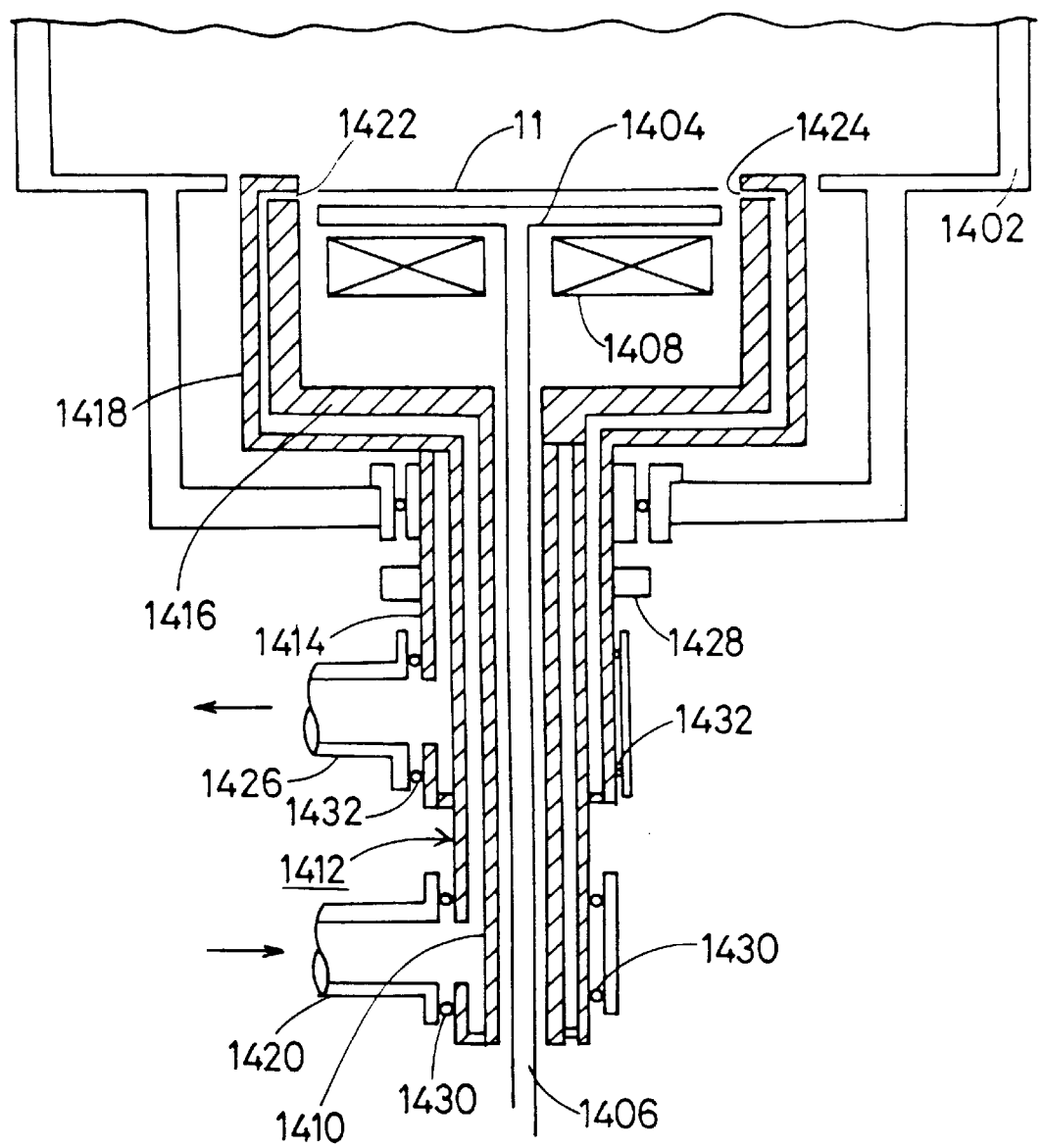
FIG. 73 is a front sectional view showing an apparatus according to a twenty-sixth preferred embodiment of the present invention.

FIG. 73 is a front sectional view typically showing a sample holder which is provided in an apparatus for forming a single-crystalline thin film according to a twenty-sixth preferred embodiment of the present invention. In this sample holder, a reaction gas supply member 1412 defining a reaction gas supply path in its interior is rotatably mounted on a bottom portion of a treatment vessel 1402 while maintaining an airtight state. Therefore, this sample holder is suitably integrated in the apparatus 100 having no separate reaction gas supply system.

This reaction gas supply member 1412 is rotated/driven by a belt 1428. The reaction gas supply member 1412 is in a three layer structure provided with an inner pipe 1416 which is located on the innermost layer, an outer pipe 1414 which is located on the outermost layer, and an intermediate pipe 1418 which is located on the intermediate layer. Thus, the reaction gas supply member 1412 defines a supply path and an exhaust path for a reaction gas between the respective layers. Further, a reaction gas supply port 1420 and a reaction gas discharge port 1426 are rotatably coupled to the reaction gas supply member 1412 through rotary seals 1430 and 1432 for maintaining airtightness respectively.

In addition, a support 1406 for fixedly supporting a sample fixing table 1404 is inserted in the interior of the reaction gas supply member 1412. A substrate 11 serving as a sample is placed on the sample fixing table 1404, while a heater 1408 for heating the sample is provided on a bottom surface of the sample fixing table 1404. This heater 1408 may be rotated at need, in order to improve temperature distribution on the substrate 11. The sample fixing table 1404 is so fixed that the same is not rotated following rotation of the reaction gas supply member 1412.

A reaction gas which is supplied from the reaction gas supply port 1420 passes through the supply path defined between the intermediate pipe 1418 and the inner pipe 1416, to be sprayed toward the upper surface of the substrate 11 from a reaction gas spray port 1422. A reacted residual gas enters another path which is defined between the outer pipe 1414 and the intermediate pipe 1417, i.e., the exhaust path from a reaction gas collection port 1424, and further passes this exhaust path to be discharged to the exterior from the reaction gas discharge port 1426. It is possible to homogeneously grow a prescribed thin film on the substrate 11 by rotating the reaction gas supply member 1412. Further, it is possible to continue the growth without interrupting irradiation with an atom current, since the substrate 11 is not rotated. Namely, it is possible to homogeneously form a film without interrupting single crystallization caused by irradiation with an atom current in this sample holder. Thus, it is possible to further efficiently form a single-crystalline thin film of a uniform thickness on the substrate 11.

B-15. Twenty-seventh Preferred Embodiment

Figure 74:
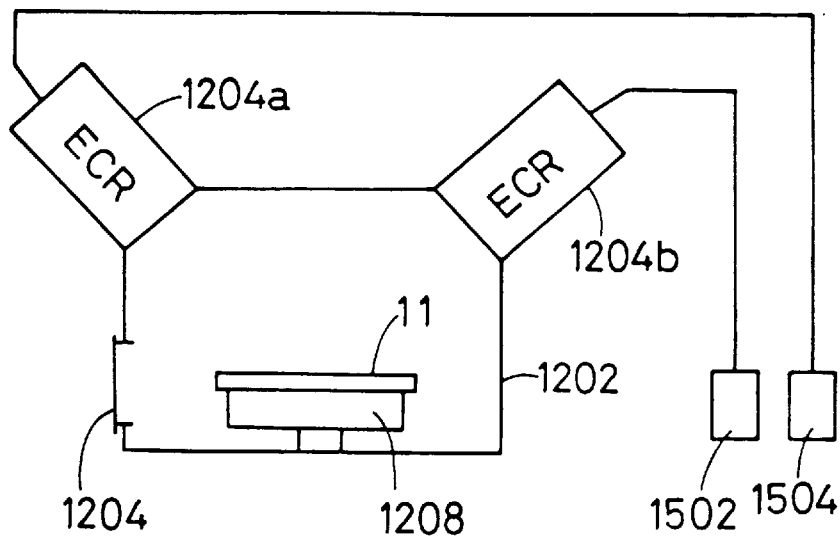
FIG. 74 is a front sectional view showing an apparatus according to a twenty-seventh preferred embodiment of the present invention.

FIG. 74 is a front sectional view typically showing the structure of an apparatus for forming a single-crystalline thin film according to a twenty-seventh preferred embodiment of the present invention. This apparatus comprises two ECR ion sources 1204a and 1204b, similarly to the apparatus shown in FIG. 69. The feature of the apparatus according to this preferred embodiment resides in provision of control unit portions 1502 and 1504 for independently adjusting density levels of ion beams generated from the two ECR ion sources 1204a and 1204b. These control unit portions 1502 and 1504 separately, i.e., independently control the outputs of the two ECR ion sources 1204a and 1204b, whereby it is possible to easily optimize density levels of the ion beams supplied from the same. Thus, it is possible to stably form a high-quality single-crystalline thin film on the substrate 11.

B-16. Twenty-eighth Preferred Embodiment

Figure 75:
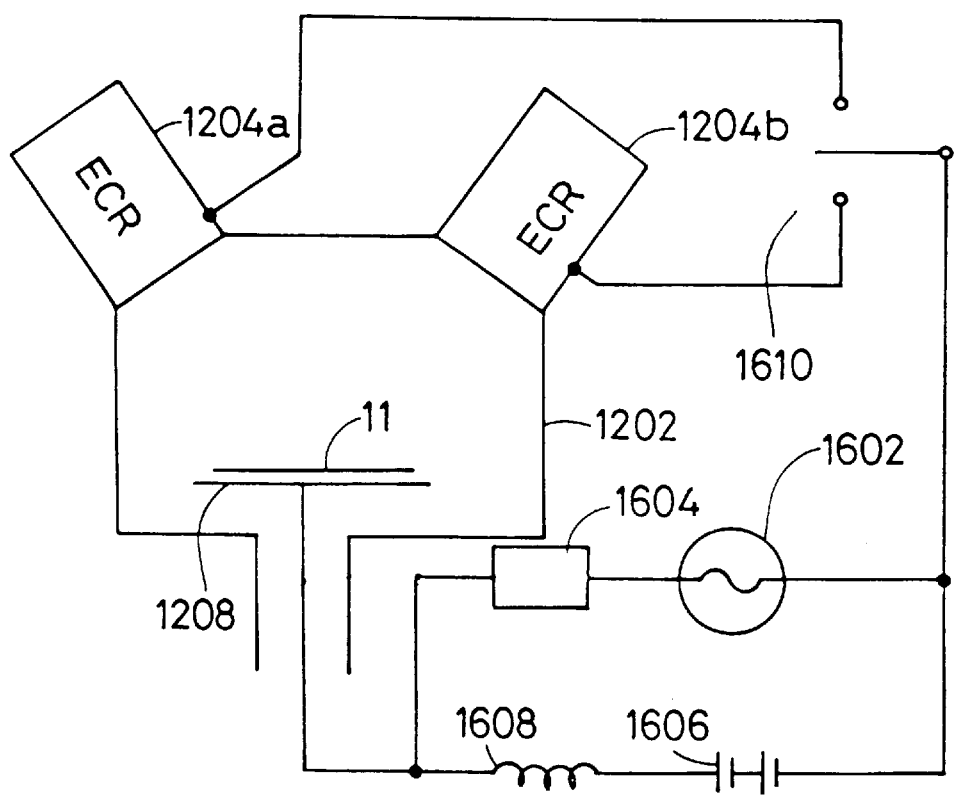
FIG. 75 is a front sectional view showing an apparatus according to a twenty-eighth preferred embodiment of the present invention.

FIG. 75 is a front sectional view typically showing the structure of an apparatus for forming a single-crystalline thin film according to a twenty-eighth preferred embodiment of the present invention. This apparatus also comprises two ECR ion sources 1204a and 1204b, similarly to the apparatus shown in FIG. 74. The feature of the apparatus according to this preferred embodiment resides in that a bias voltage is applied across the two ECR ion sources 1204a and 1204b and a substrate 11, in a direction for accelerating ions. Namely, a dc voltage supply circuit is interposed in parallel in a series circuit of an RF power source 1602 for generating a high frequency and a matching circuit 1604 for ensuring impedance matching, i.e., a circuit for supplying a high frequency to the ECR ion sources 1204a and 1204b. The dc voltage supply circuit is formed by a series circuit of a dc power source 1606 and an inductor 1608 for blocking a high frequency.

Supply of the high frequency and that of the dc voltage are allotted to the two ECR ion sources 1204a and 1204b by time sharing through action of a switching relay 1610. These are alternately supplied to the two ECR ion sources 1204a and 1204b by time sharing, in order to prevent disturbance of a normal flow of an ion current caused by interference of dc voltages applied thereto.

In the apparatus according to this preferred embodiment, a bias voltage is applied across the ECR ion sources 1204a and 1204b and the substrate 11 in a direction for accelerating ions, whereby the atom current is advantageously improved in directivity. A similar effect is attained also when the bias voltage is simultaneously supplied to the two ECR ion sources 1204a and 1204b in place of the alternate supply by time sharing. Alternatively, two dc voltage supply circuits may be provided to independently supply bias voltages to the two ECR ion sources 1204a and 1204b respectively. In this case, it is possible to apply optimum bias voltages to the respective ECR ion sources 1204a and 1204b, whereby optimum irradiation conditions can be obtained.

B-17. Twenty-ninth Preferred Embodiment

Figure 76:
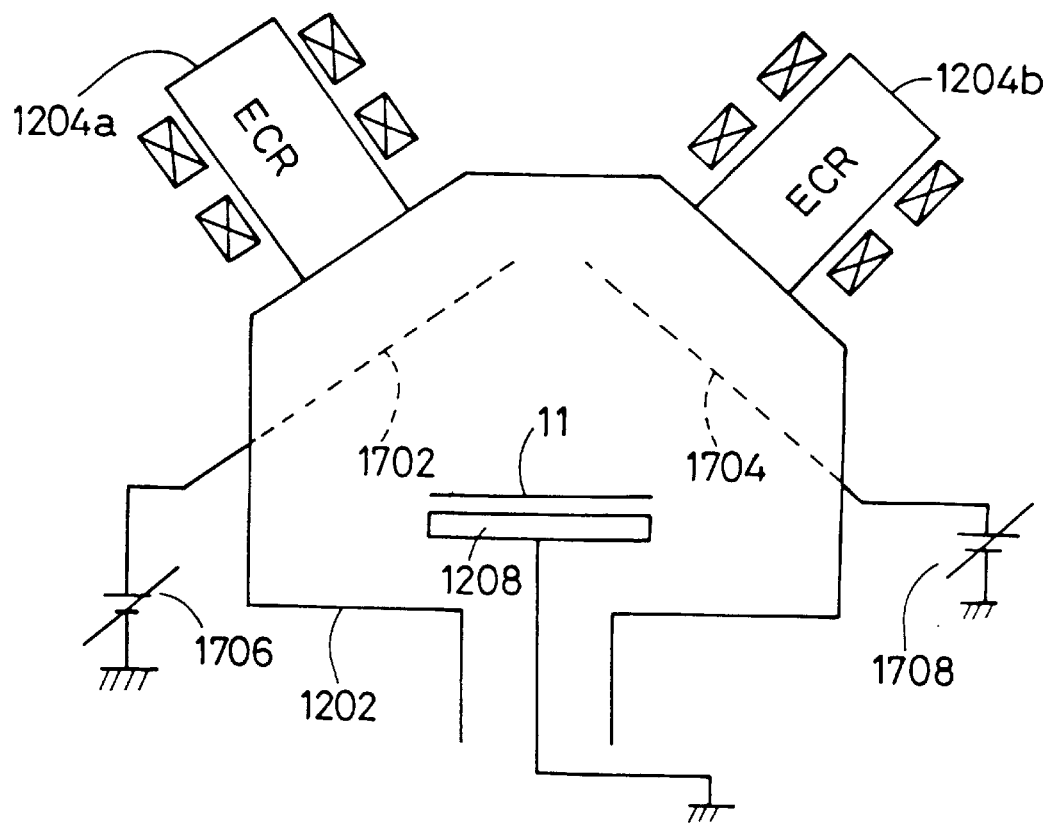
FIG. 76 is a front sectional view showing an apparatus according to a twenty-ninth preferred embodiment of the present invention.

FIG. 76 is a front sectional view typically showing the structure of an apparatus for forming a single-crystalline thin film according to a twenty-ninth preferred embodiment of the present invention. This apparatus also comprises two ECR ion sources 1204a and 1204b, similarly to the apparatus shown in FIG. 75. The feature of the apparatus according to this preferred embodiment resides in that grids 1702 and 1704 to which bias voltages for adjusting ion extracting conditions are applied are provided in the vicinity of ion outlet ports of the two ECR ion sources 1204a and 1204b. Dc power sources 1706 and 1708 are interposed between the grids 1702 and 1704 and a substrate 11 respectively. The two grids 1702 and 1704 are separated from each other, so that the voltages applied thereto can be adjusted independently of each other.

When bias voltages are applied across the grids 1702 and 1704 and the substrate 11 in directions for accelerating ions, for example, an atom current is improved in directivity. In this apparatus, further, the levels of the bias voltages which are applied to the two grids 1702 and 1704 can be adjusted independently of each other, whereby it is possible to apply optimum bias voltages in response to operating states of the two ECR ion sources 1204a and 1204b. Thus, it is possible to efficiently form a high-quality single-crystalline thin film on the substrate 11.

While the invention has been shown and described in detail, the foregoing description is in all aspects illustrative and not restrictive. It is therefore understood that numerous modifications and variations can be devised without departing from the scope of the invention.

What is claimed is:

1. A method of forming a single-crystalline thin film of silicon, comprising:

providing a substrate coated with an amorphous or a polycrystalline thin film of said silicon; and irradiating said amorphous thin film or said polycrystalline thin film, in directions perpendicular to a plurality of the densest crystal planes of said single-crystalline thin film of said silicon to be formed with neon beams with sufficiently low energy of a value less than 27 eV such that no sputtering of said thin film occurs;

wherein, said single-crystalline thin film is formed during irradiation at a temperature below its crystallization temperature.

2. A method of forming a single-crystalline thin film in accordance with claim 1, wherein a maximum one of the atomic weights of elements forming said material is higher than an atomic weight of neon.

3. A method of forming a single-crystalline thin film in accordance with claim 1, wherein said beams are obtained by a single electron cyclotron resonance type ion generation source and a reflector being arranged in a path between said ion generation source and said amorphous thin film or said polycrystalline thin film.

4. A method of forming a single crystalline thin film of silicon on a polycrystalline substrate or an amorphous substrate using plasma chemical vapor deposition, comprising the steps of:

supplying a reaction gas onto said substrate below a temperature allowing crystallization of said silicon with said plasma chemical vapor deposition alone; and simultaneously irradiating said substrate with neon beams of a sufficiently low energy having a value less than 27 eV such that no sputtering of said silicon occurs, said beams irradiated from directions which are perpendicular to a plurality of densest crystal planes having different directions in said single-crystalline thin film to be formed.

5. A method of forming a single-crystalline thin film in accordance with claim 4, wherein a maximum one of the atomic weights of elements forming said material is higher than an atomic weight of neon.

6. A method of forming a single-crystalline thin film in accordance with claim 4, wherein said reaction gas contains a reaction gas material being formed by an impurity element to be added to said material.

7. A method of forming a single-crystalline thin film in accordance with claim 6, wherein a plurality of types of said impurity elements are so employed that a plurality of types of reaction gas materials being formed by respective ones of said plurality of types of impurity elements are alternately supplied onto said substrate.

8. A method of forming a single-crystalline thin film in accordance with claim 4, wherein said beams of said gas are obtained by a single beam source and a reflector being arranged in a path between said beam source and said substrate.

9. A method of forming a single-crystalline thin film in accordance with claim 8, wherein said beam source is an ion generation source generating an ion beam of said gas, and said reflector is a metal reflector being substantially made of a metal.

10. A method of forming a single-crystalline thin film in accordance with claim 8, wherein said beam source is an electron cyclotron resonance type ion generation source.

11. A method of forming a single-crystalline thin film being adapted to form a single-crystalline thin film of a material on a substrate, said method comprising:

(a) a step of depositing said material on said substrate below a temperature causing crystallization of said material and a step of irradiating said material being deposited with only one molecular beam of sufficiently low energy having a value less than 27 eV such that no sputtering of said material occurs, said irradiating applied from one direction, forming an axially oriented polycrystalline thin film of said material; and (b) irradiating said axially oriented polycrystalline thin film with molecular beams of sufficiently low energy such that no sputtering of said material occurs, and below a crystallization temperature of said material from directions being perpendicular to a plurality of densest crystal planes of different directions in said single-crystalline thin film, for converting said axial orientation polycrystalline thin film to a single-crystalline thin film, wherein said steps (a) and (b) are performed simultaneously and wherein said direction of said molecular beam in formation of said axially oriented polycrystalline thin film is identical to one of said plurality of directions of said molecular beams in said conversion of said axially oriented polycrystalline thin film to said single-crystalline thin film.

12. A method of forming a single-crystalline thin film, being adapted to form a single-crystalline thin film of a material on a substrate, said method comprising:

a step of depositing said material on said substrate forming a thin film of said material;

a step of irradiating said thin film only one molecular beam of sufficiently low energy having a value less than 27 eV such that no sputtering of said material occurs and below a crystallization temperature of said material applied from one direction after said step, for converting said thin film to an axially oriented polycrystalline thin film; and a step of irradiating said axially oriented polycrystalline thin film with molecular beams of sufficiently low energy such that no sputtering of said material occurs and below said crystallization temperature of said material from directions being perpendicular to a plurality of densest crystal planes of different directions in said single-crystalline thin film, for converting said axially oriented polycrystalline thin film to a single-crystalline thin film and wherein said direction of said molecular beam in formation of said axially oriented polycrystalline thin film is identical to one of said plurality of directions of said molecular beams in said conversion of said axially oriented polycrystalline thin film to said single-crystalline thin film.

13. A method of forming a single-crystalline thin film in accordance with claim 11 or 12, wherein said molecular beams are formed from an inert gas.

14. A method of forming a single-crystalline thin film in accordance with claim 13, wherein the atomic weight of an element forming said inert gas is lower than the maximum atomic weight among those of elements forming said prescribed material.

15. A method of forming a single-crystalline thin film in accordance with claim 11 or 12, wherein said material contains an element forming a gas material being a gas under a room temperature, said molecular beam being formed from said gas material.

16. A method of forming a single-crystalline thin film in accordance with claim 11 or 12, wherein said molecular beam is formed by an electron cyclotron resonance ion source.

17. The method in accordance with claim 13, wherein said insert gas is neon.

18. The method in accordance with claim 17, wherein said material is silicon, and said energy is lower than 27 eV.

19. A method of forming a single-crystalline thin film of, silicon comprising:

(a) a step of forming an amorphous or polycrystalline thin film of said silicon on a substrate;

(b) a step of forming a masking material on said thin film;

(c) a step of selectively removing said masking material; and (d) a step of irradiating said substrate with neon beams of a sufficiently low energy to a value less than 27 eV such that no sputtering of said silicon from directions being perpendicular to a plurality of densest crystal planes having different directions in said single-crystalline thin film to be formed while utilizing selectively removed said masking material as a screen at a temperature below the crystallization temperature of said silicon.

20. A method of forming a single-crystalline thin film in accordance with claim 19, wherein said steps (b) to (d) are carried out plural times while varying directions for applying said molecular beams in said step (d), thereby selectively converting said thin film to a single crystal having a plurality of types of crystal orientations.

21. A method of forming a single-crystalline thin film of, silicon comprising:

(a) a step of forming an amorphous or polycrystalline thin film of said silicon on a substrate;

(b) a step of forming a masking material on said thin film;

(c) a step of selectively removing said masking material;

(d) a step of etching said thin film while utilizing selectively removed said masking material as a screen, thereby selectively removing said thin film while leaving a specific region on said substrate; and (e) a step of irradiating said substrate with neon beams of sufficiently low energy levels of less than 27 eV such that no sputtering of said silicon occurs and irradiated from directions being perpendicular to a plurality of densest crystal planes having different directions in said single-crystalline thin film, said thin film to be formed under a temperature below the crystallization temperature of said silicon.

22. A method of forming a single-crystalline thin film of silicon, comprising:

(a) a step of forming an amorphous or polycrystalline thin film of said silicon on a substrate;

(b) a step of irradiating said substrate with neon beams of sufficiently low energy levels to a value of less than 27 eV such that no sputtering of said silicon occurs and irradiated from directions being perpendicular to a plurality of densest crystal planes having different directions in said single-crystalline thin film, said thin film to be formed under a high temperature below the crystallization temperature of said silicon;

(c) a step of forming a masking material on said thin film after said step (b);

(d) a step of selectively removing said masking material; and (e) a step of etching said thin film while utilizing selectively removed said masking material as a screen, for selectively removing said thin film.

23. A method of forming a single-crystalline thin film of silicon, comprising:

(a) a step of forming an amorphous or polycrystalline thin film of said silicon, on a substrate;

(b) a step of irradiating said substrate with neon beams of sufficiently low energy levels of less than 27 eV such that no sputtering of said silicon occurs and irradiated from directions being perpendicular to a plurality of densest crystal planes having different directions, said single-crystalline thin film being formed under a temperature causing no crystallization of said silicon by said step (a) alone while carrying out said step (a);

(c) a step of forming a masking material on said thin film after said steps (a) and (b);

(d) a step of selectively removing said masking material; and (e) a step of etching said thin film while utilizing selectively removed said masking material as a screen, for selectively removing said thin film wherein said single-crystalline thin film is formed during irradiation at a temperature below its crystallization temperature.

24. A method of forming a single-crystalline thin film of, silicon comprising:

(a) a step of forming an amorphous or polycrystalline thin film of said silicon on a substrate;

(b) a step of irradiating said substrate with neon beams of sufficiently low energy levels of a value less than 27 eV such that no sputtering of said silicon occurs and irradiated from directions being perpendicular to a plurality of densest crystal planes having different directions in said single-crystalline thin film, said thin film formed under a temperature below the crystallization temperature of said silicon;

(c) a step of forming a masking material on said thin film after step (b);

(d) a step of selectively removing said masking material; and (e) a step of irradiating said substrate with said neon beams of sufficiently low energy levels of less than 27 eV such that no sputtering of said silicon occurs and irradiated from directions being perpendicular to said plurality of densest crystal planes having different directions in said single-crystalline thin film to be formed, said directions being different from those in said step (b), while utilizing selectively removed said masking material as a screen.

25. A method of forming a single-crystalline thin film in accordance with any of claims 19 to 24, wherein the atomic weight of an element forming said gas is lower than the maximum one of the atomic weights of elements forming said prescribed material.

26. A method of forming a single-crystalline thin film in accordance with any of claims 19, 20 and 24, wherein the atomic weight of an element forming said gas is lower than the maximum one of the atomic weights of elements forming said masking material.

27. A method of forming a single-crystalline thin film in accordance with claim 1, 11, 12, 19, 21, 22, 23 or 24, further comprising the step of:

forming a seed crystal, as a result of said irradiating step, embedded in an exposed surface of the thin film and integral with a portion of the thin film remaining beneath the seed crystal, said single-crystalline thin film being formed from the seed crystal by solid epitaxial growth.

* * * * *

UNITED STATES PATENT AND TRADEMARK OFFICE
CERTIFICATE OF CORRECTION

PATENT NO. : 5,993,538

DATED : November 30, 1999

INVENTOR(S): Toshifumi ASAKAWA et al.

It is certified that an error appears in the above-identified patent and that said Letters Patent is hereby corrected as shown below:

On the title page, item [73], the 1st Assignee has been omitted. It should read as follows:

--[73] Neuralsystems Corporation, Tokyo-to, Japan; Mega Chips Corporation, Suita-shi, Japan--

Signed and Sealed this

Seventeenth Day of April, 2001

*Attest:*

NICHOLAS P. GODICI

*Attesting Officer*     *Acting Director of the United States Patent and Trademark Office*